US012684888B2

(12) United States Patent
Yang et al.

(10) Patent No.: US 12,684,888 B2
(45) Date of Patent: Jul. 14, 2026

(54) BONDING STRUCTURES FOR STACKED IMAGE SENSOR

(71) Applicant: Taiwan Semiconductor Manufacturing Company, Ltd., Hsinchu (TW)

(72) Inventors: Hao-Lin Yang, Kaohsiung City (TW); Kuan-Chieh Huang, Hsinchu City (TW); Wei-Cheng Hsu, Kaohsiung City (TW); Tzu-Jui Wang, Fengshan City (TW); Chen-Jong Wang, Hsin-Chu (TW); Dun-Nian Yaung, Taipei City (TW); Yu-Chun Chen, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 548 days.

(21) Appl. No.: 18/150,417

(22) Filed: Jan. 5, 2023

(65) Prior Publication Data

US 2024/0079434 A1    Mar. 7, 2024

Related U.S. Application Data

(60) Provisional application No. 63/431,380, filed on Dec. 9, 2022, provisional application No. 63/403,931, filed on Sep. 6, 2022.

(51) Int. Cl.
*H10F 39/00*        (2025.01)
*H10W 80/00*        (2026.01)
*H10W 90/00*        (2026.01)

(52) U.S. Cl.
CPC ......... *H10F 39/809* (2025.01); *H10F 39/018* (2025.01); *H10F 39/811* (2025.01);
(Continued)

(58) Field of Classification Search
CPC .... H10F 39/018; H10F 39/026; H10F 39/199; H10F 39/809; H10F 39/811; H01L 25/16;
(Continued)

(56) References Cited

U.S. PATENT DOCUMENTS

| | | | |
|---|---|---|---|
| 10,090,349 B2 | 10/2018 | Wan et al. | |
| 2010/0225002 A1 | 9/2010 | Law et al. | |

(Continued)

FOREIGN PATENT DOCUMENTS

| | | | | |
|---|---|---|---|---|
| DE | 112018001862 T5 | * | 12/2019 | ............. H04N 25/70 |
| JP | 2020088380 A | | 6/2020 | |

(Continued)

*Primary Examiner* — Scott B Geyer
(74) *Attorney, Agent, or Firm* — Eschweiler & Potashnik, LLC

(57) ABSTRACT

Various embodiments of the present disclosure are directed towards an image sensor including first chip and a second chip. The first chip includes a first substrate, a plurality of photodetectors disposed in the first substrate, a first interconnect structure disposed on a front side of the first substrate, and a first bond structure disposed on the first interconnect structure. The second chip underlies the first chip. The second chip includes a second substrate, a plurality of semiconductor devices disposed on the second substrate, a second interconnect structure disposed on a front side of the second substrate, and a second bond structure disposed on the second interconnect structure. A first bonding interface is disposed between the second bond structure and the first bond structure. The second interconnect structure is electrically coupled to the first interconnect structure by way of the first and second bond structures. At least one of the first bond structure and the second bond structure comprises one or less conductive bonding layer.

20 Claims, 34 Drawing Sheets

(52) U.S. Cl.
CPC ........ *H10W 80/312* (2026.01); *H10W 80/327* (2026.01); *H10W 90/792* (2026.01)

(58) Field of Classification Search
CPC ..... H01L 25/162; H01L 25/167; H01L 25/50; H01L 24/08; H01L 24/80; H01L 2224/08145; H01L 2224/80895; H01L 2224/80896
See application file for complete search history.

(56) References Cited

U.S. PATENT DOCUMENTS

| | | | | |
|---|---|---|---|---|
| 2011/0042814 A1* | 2/2011 | Okuyama | ............... | H01L 24/09 |
| | | | | 438/455 |
| 2012/0248580 A1* | 10/2012 | Matsugai | .............. | H10F 39/811 |
| | | | | 257/621 |
| 2013/0284885 A1* | 10/2013 | Chen | .................... | H10F 39/811 |
| | | | | 250/208.1 |
| 2014/0035083 A1 | 2/2014 | Wan et al. | | |
| 2014/0211056 A1 | 7/2014 | Fan | | |
| 2015/0115330 A1 | 4/2015 | Park et al. | | |
| 2015/0179691 A1 | 6/2015 | Yanagita et al. | | |
| 2015/0221694 A1* | 8/2015 | Baba | .................... | H10F 39/805 |
| | | | | 257/443 |
| 2015/0270307 A1 | 9/2015 | Umebayashi et al. | | |
| 2015/0279816 A1* | 10/2015 | Chen | .................. | H01L 25/0657 |
| | | | | 257/774 |
| 2016/0020235 A1* | 1/2016 | Yamashita | ........... | H10F 39/811 |
| | | | | 250/206 |
| 2017/0033144 A1* | 2/2017 | Takahashi | ............... | H10F 39/18 |
| 2017/0040362 A1 | 2/2017 | Na et al. | | |
| 2017/0186732 A1 | 6/2017 | Chu et al. | | |
| 2017/0186799 A1* | 6/2017 | Lin | ....................... | H10F 39/018 |
| 2017/0221950 A1 | 8/2017 | Ho et al. | | |
| 2017/0374303 A1 | 12/2017 | Honda et al. | | |
| 2018/0227549 A1 | 8/2018 | Cai et al. | | |
| 2018/0366508 A1 | 12/2018 | Goto et al. | | |
| 2019/0013345 A1 | 1/2019 | Wan et al. | | |
| 2019/0103425 A1 | 4/2019 | Yoon et al. | | |
| 2019/0157333 A1* | 5/2019 | Tsai | ........................ | H01L 24/89 |
| 2019/0273108 A1* | 9/2019 | Sato | ...................... | H10F 39/809 |
| 2019/0371838 A1 | 12/2019 | Takahashi et al. | | |
| 2020/0251518 A1* | 8/2020 | Ogino | ................. | H01L 23/5226 |
| 2021/0005658 A1* | 1/2021 | Yukawa | ................ | H10F 39/811 |
| 2021/0005659 A1* | 1/2021 | Nishizawa | .......... | H10F 39/8063 |
| 2021/0104571 A1 | 4/2021 | Shohji et al. | | |
| 2021/0210541 A1* | 7/2021 | Ando | ........................ | H01L 25/50 |
| 2021/0273013 A1* | 9/2021 | Chiou | ................... | H10F 39/811 |
| 2021/0337155 A1 | 10/2021 | Chu et al. | | |
| 2021/0351219 A1* | 11/2021 | Yamagishi | .............. | H01L 24/05 |
| 2021/0375781 A1 | 12/2021 | Lin et al. | | |
| 2022/0037388 A1 | 2/2022 | Takizawa et al. | | |
| 2022/0052100 A1 | 2/2022 | Wei et al. | | |
| 2022/0199670 A1* | 6/2022 | Jang | ................... | H10F 39/8057 |
| 2022/0231058 A1 | 7/2022 | Kao et al. | | |
| 2022/0321817 A1* | 10/2022 | Kim | ....................... | H04N 25/79 |
| 2022/0352235 A1* | 11/2022 | Ogura | ................... | H10F 39/811 |
| 2022/0359599 A1 | 11/2022 | Iijima et al. | | |
| 2022/0359601 A1 | 11/2022 | Tsai | | |
| 2023/0049255 A1* | 2/2023 | Yang | ................... | H10F 39/809 |
| 2023/0081238 A1* | 3/2023 | Jang | ..................... | H10F 39/811 |
| | | | | 257/213 |
| 2023/0139176 A1 | 5/2023 | Yokoyama | | |
| 2023/0299109 A1* | 9/2023 | Chung | ................. | H10F 39/018 |
| 2024/0038814 A1* | 2/2024 | Maruyama | ........... | H10F 39/018 |
| 2024/0153981 A1* | 5/2024 | Oishi | ............... | H10F 39/80373 |
| 2024/0170518 A1* | 5/2024 | Takatsuka | .......... | H10F 39/8067 |

FOREIGN PATENT DOCUMENTS

| | | |
|---|---|---|
| JP | 2020102485 A | 7/2020 |
| KR | 20140016795 A | 2/2014 |
| KR | 20190136895 A | 12/2019 |

\* cited by examiner

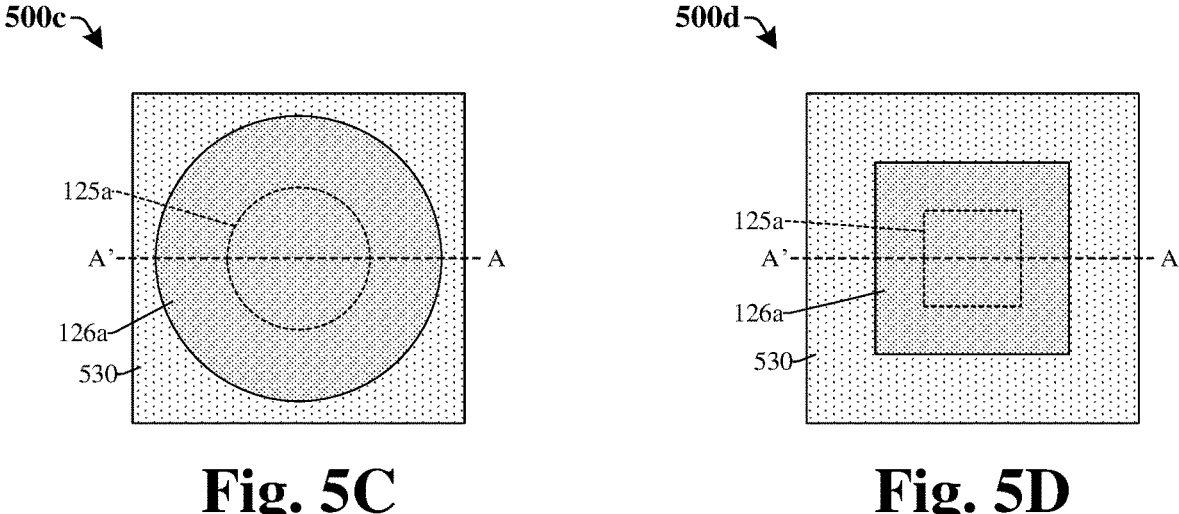
Fig. 5C            Fig. 5D
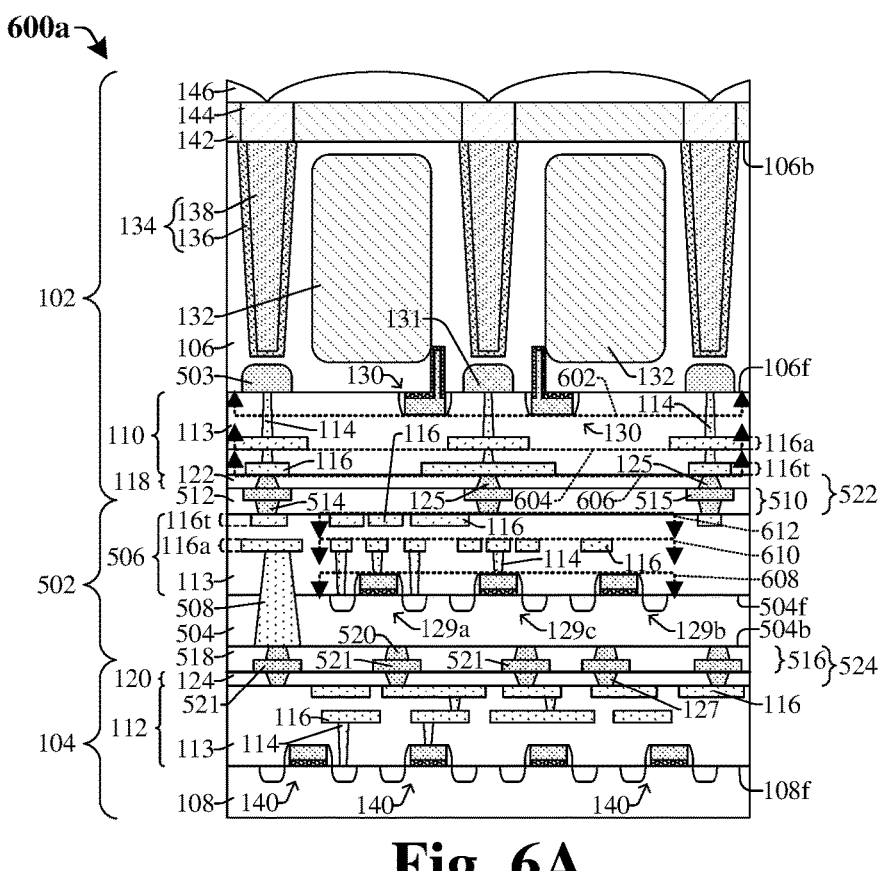
Fig. 6A

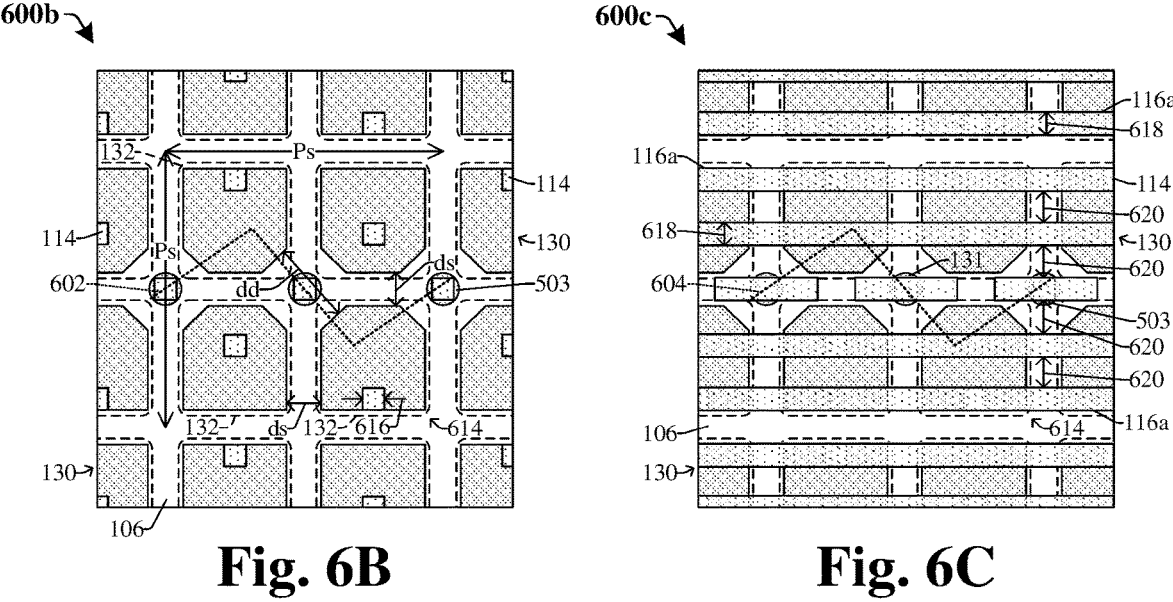
Fig. 6B                          Fig. 6C
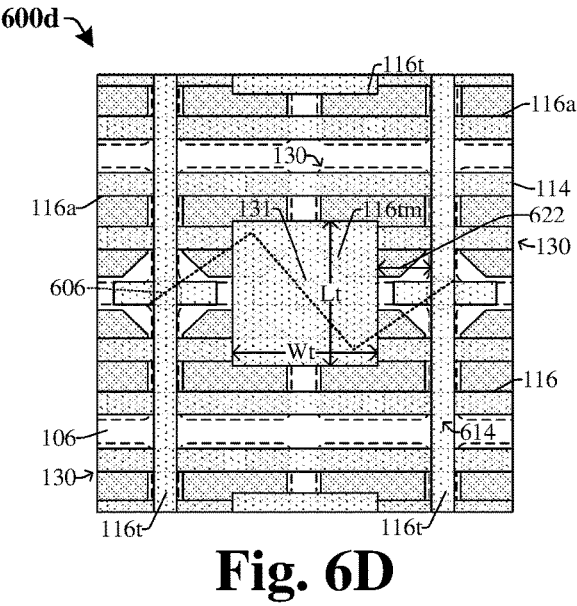
Fig. 6D

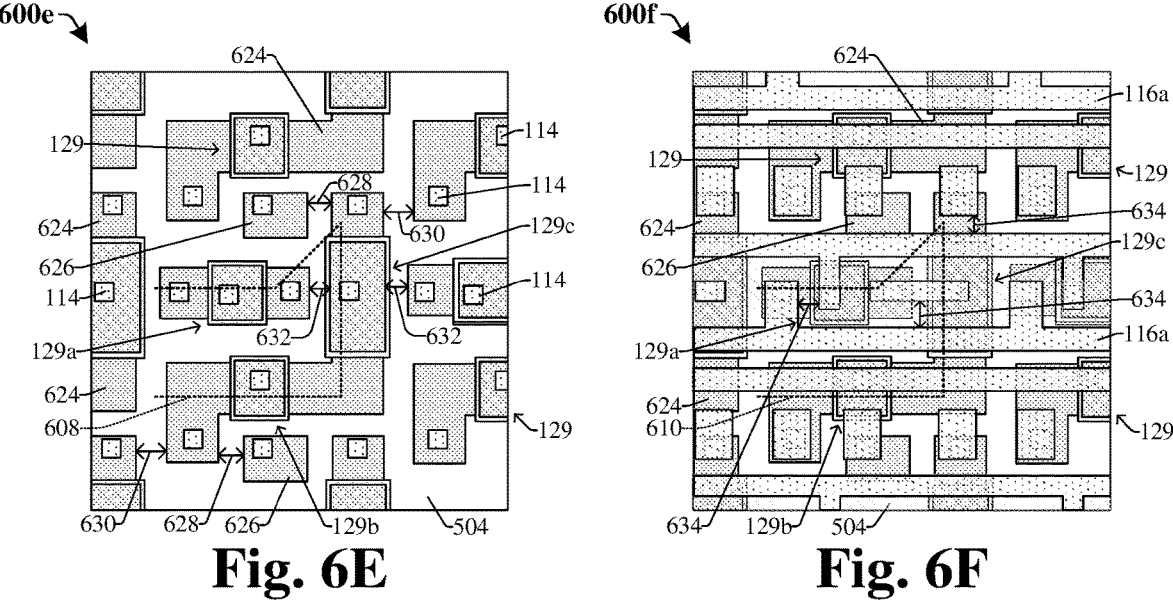
Fig. 6E
Fig. 6F
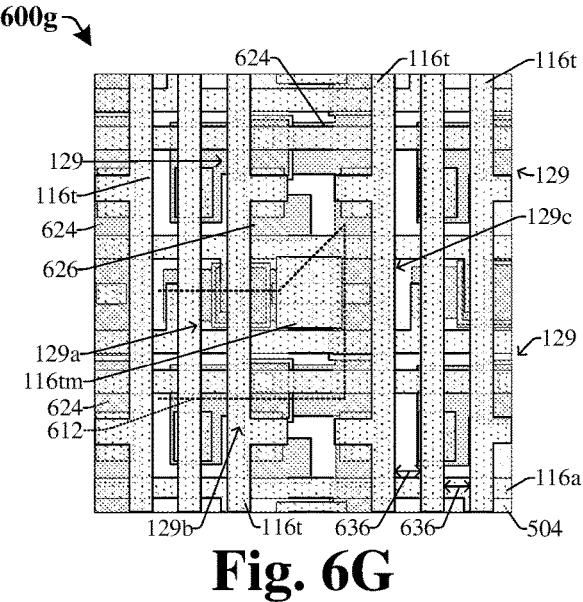
Fig. 6G

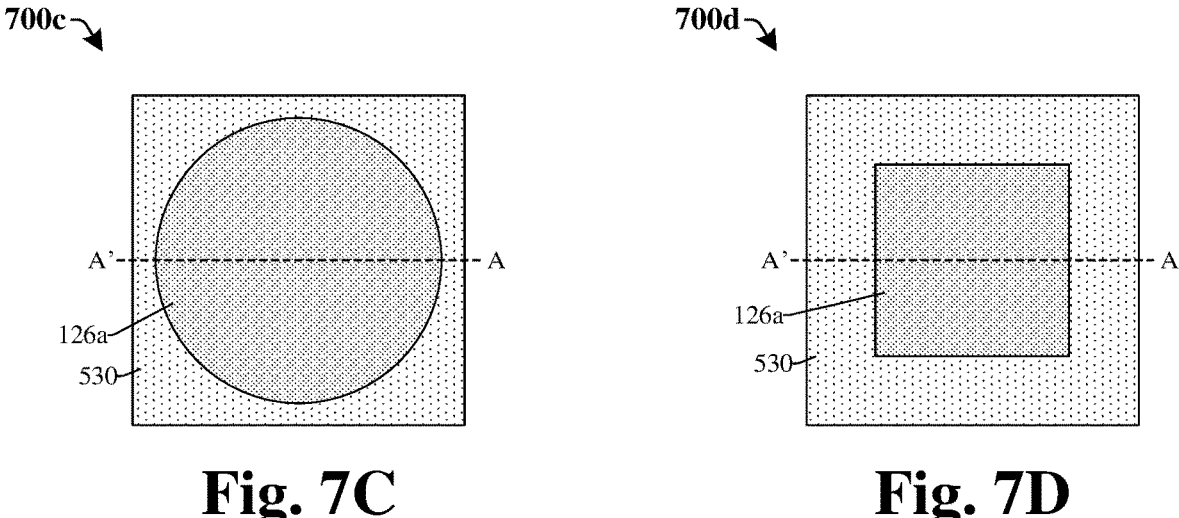
Fig. 7C                    Fig. 7D
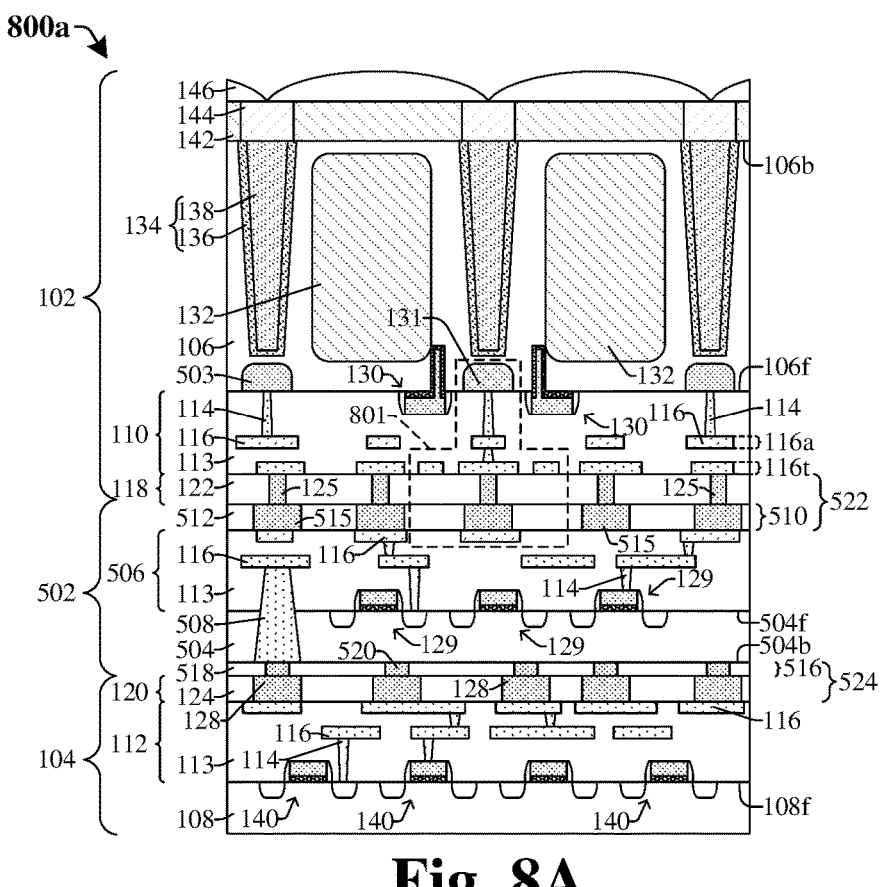
Fig. 8A

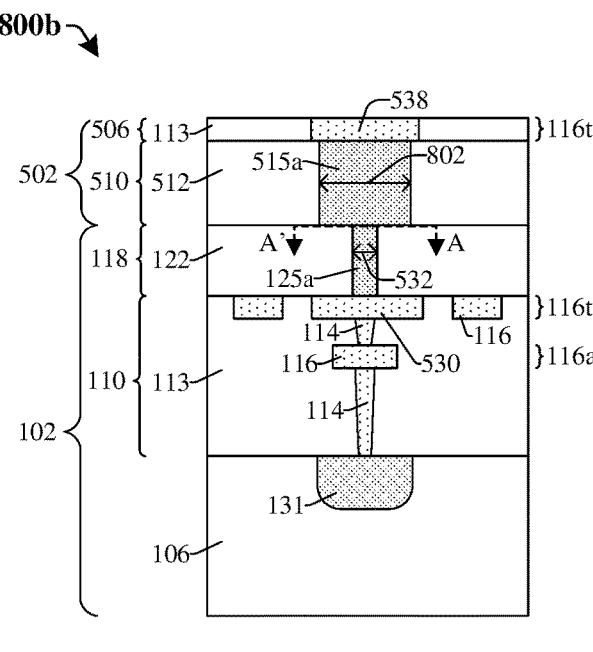
Fig. 8B
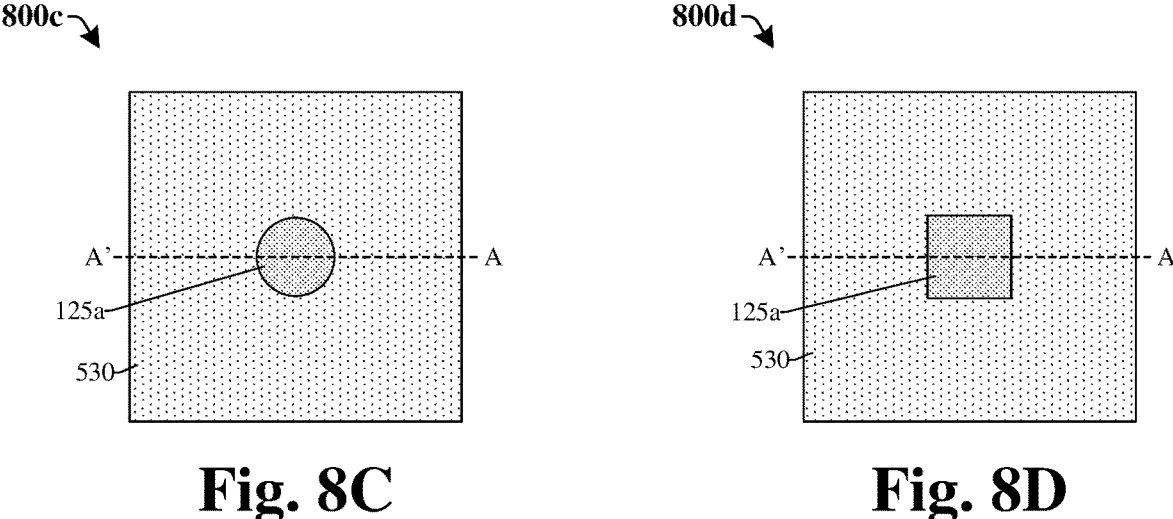
Fig. 8C                    Fig. 8D

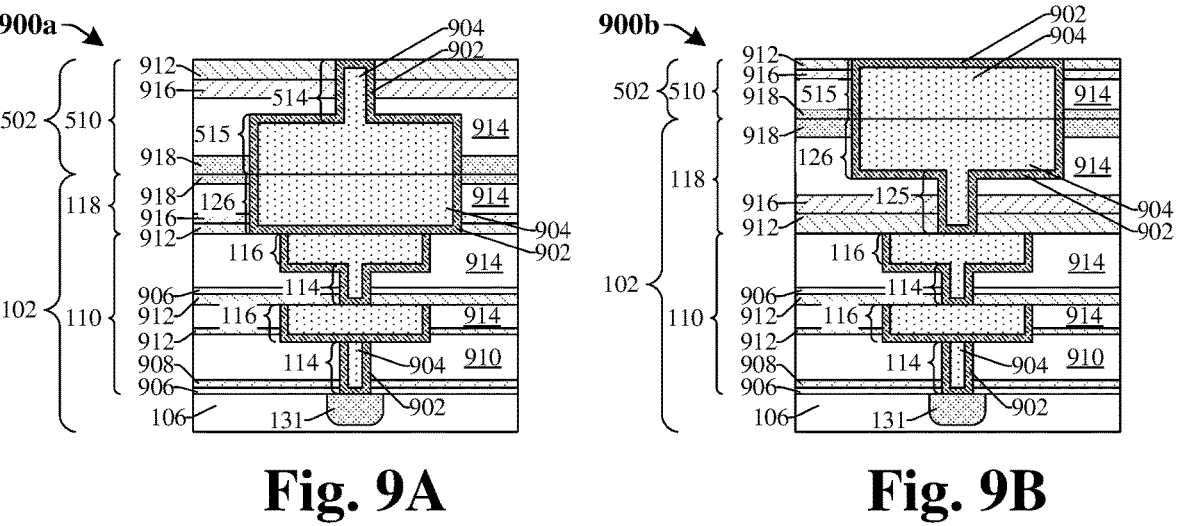
Fig. 9A                    Fig. 9B
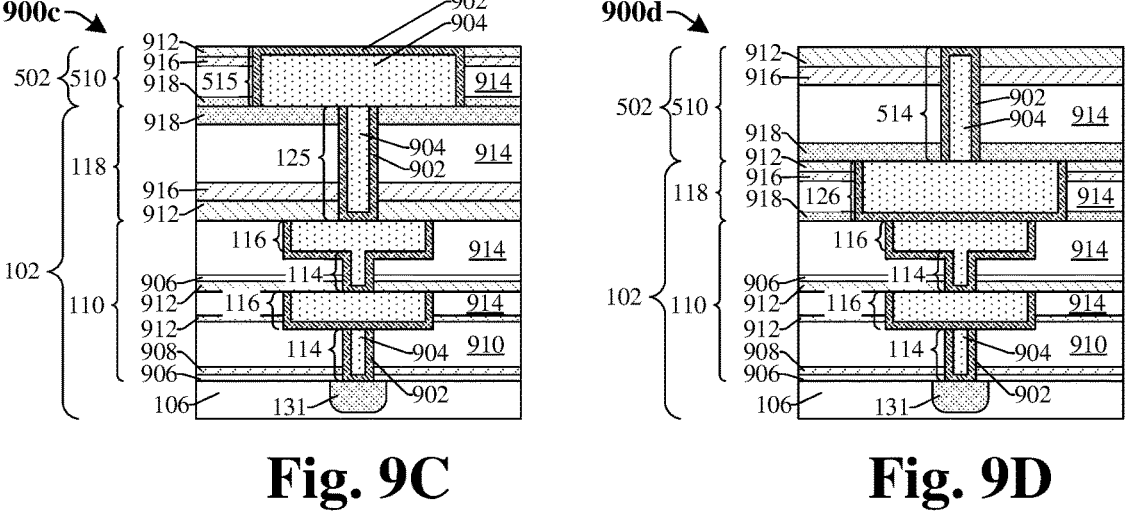
Fig. 9C                    Fig. 9D

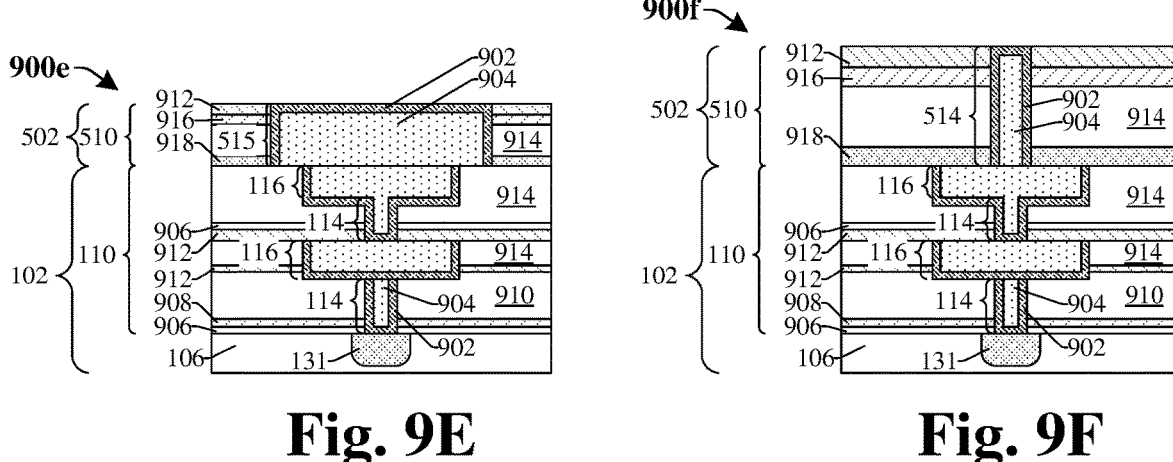
Fig. 9E          Fig. 9F
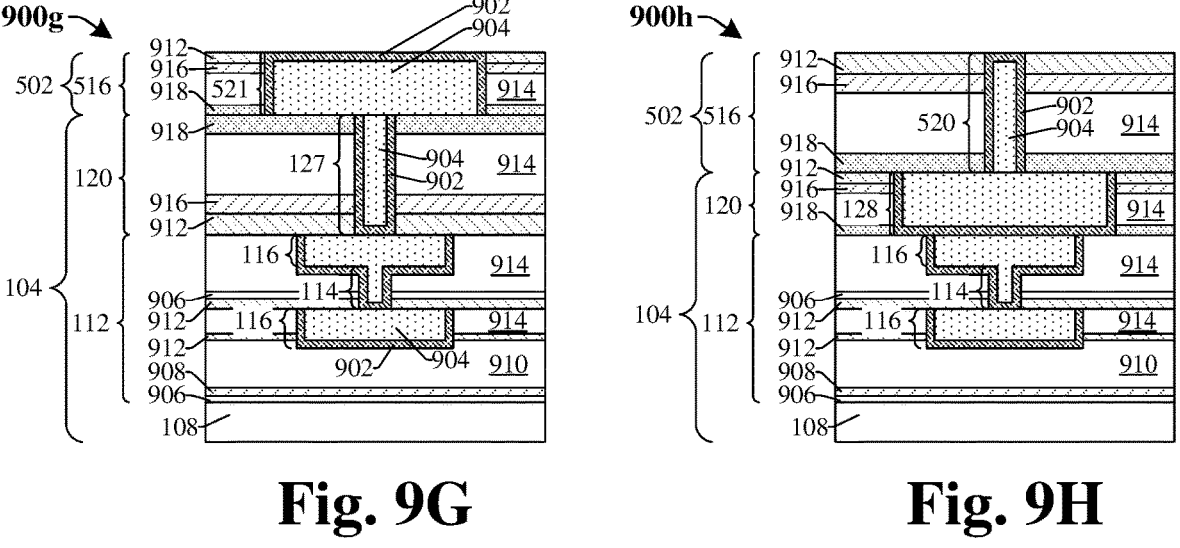
Fig. 9G          Fig. 9H

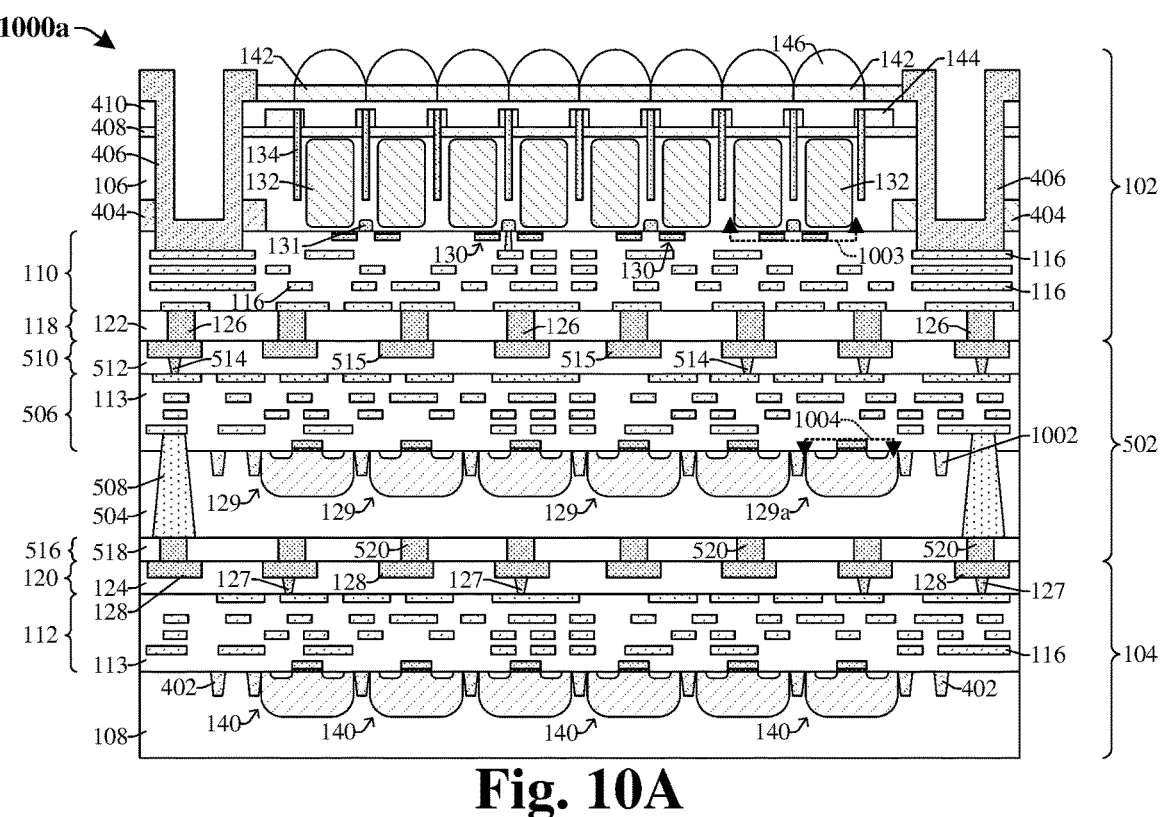
Fig. 10A
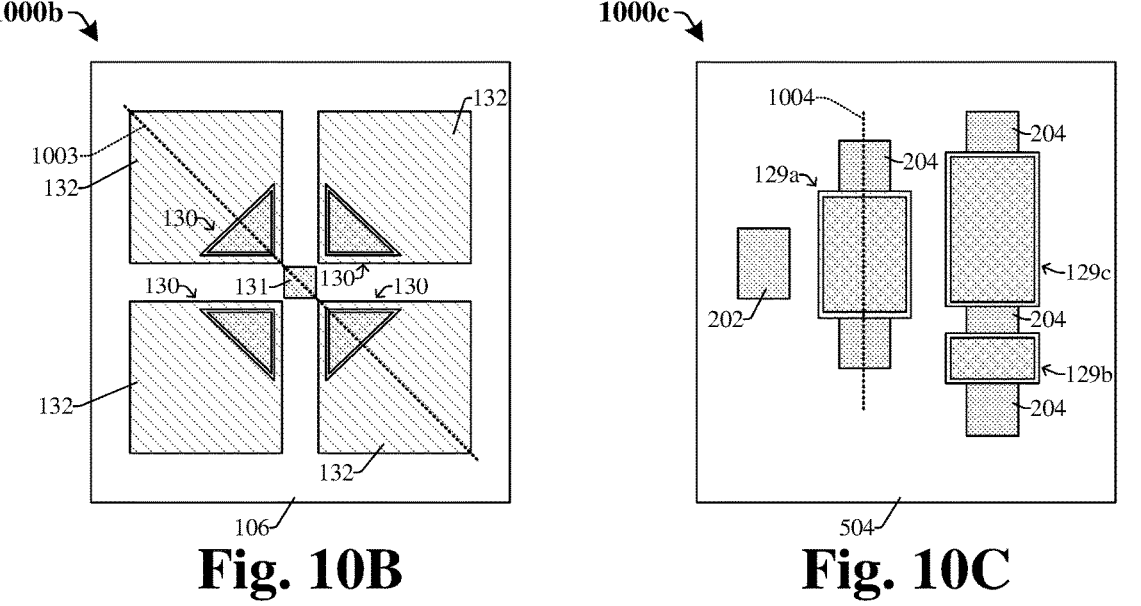
Fig. 10B           Fig. 10C

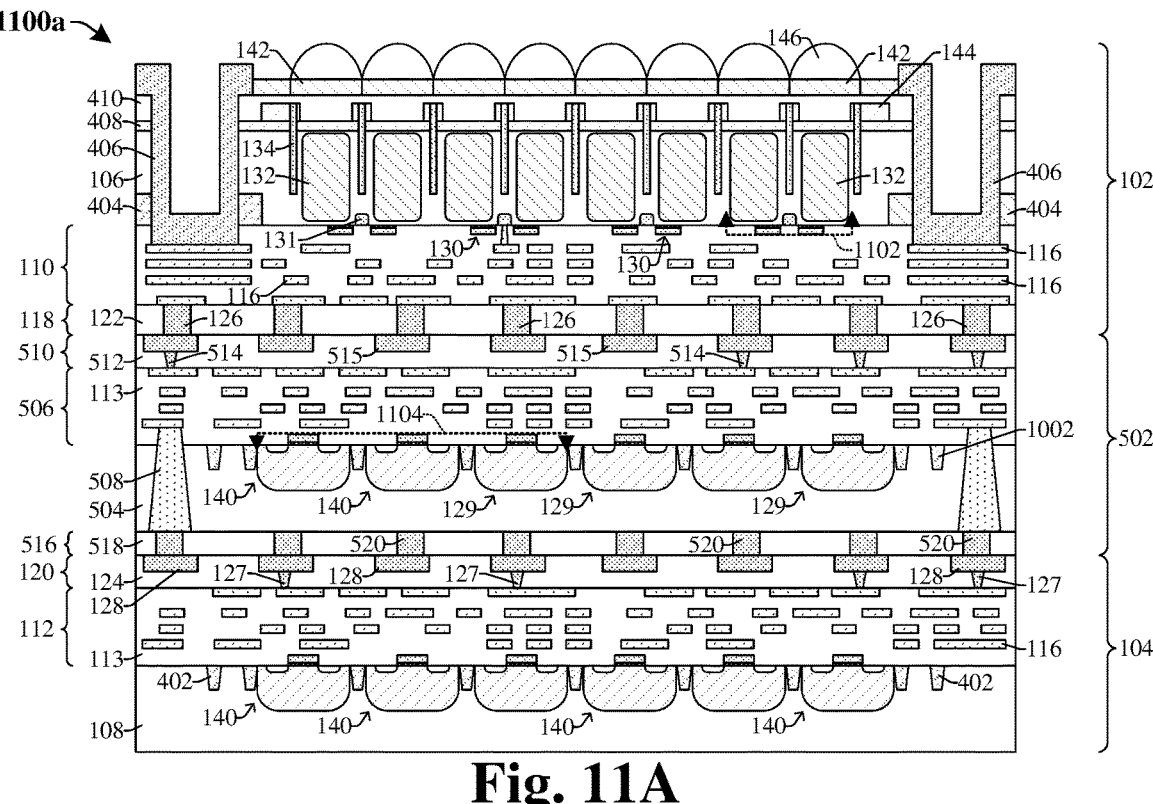
Fig. 11A
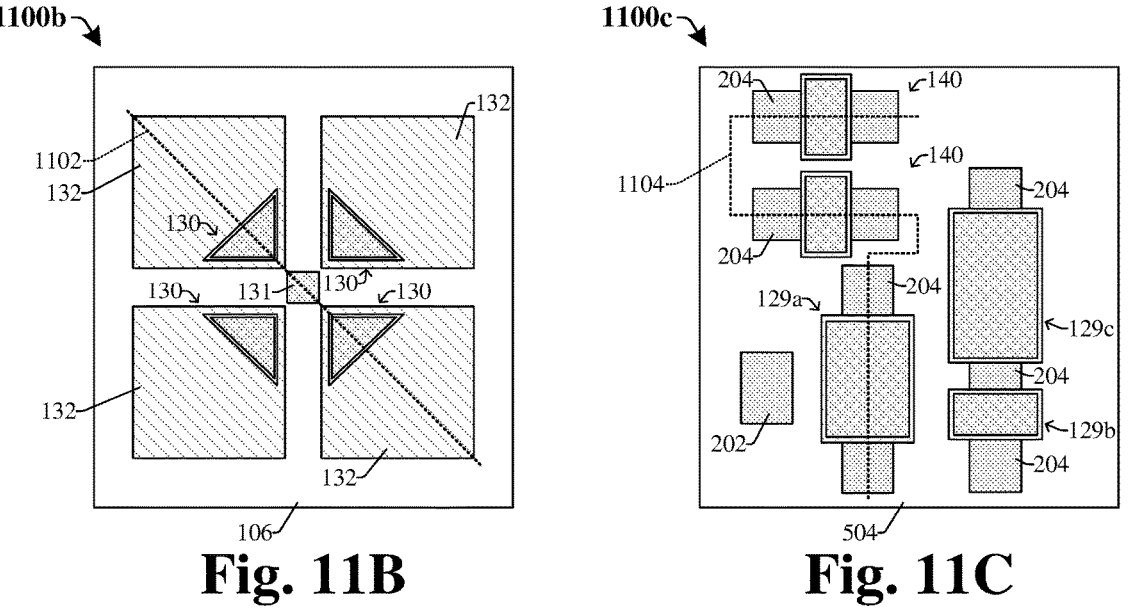
Fig. 11B        Fig. 11C

1300b

1400

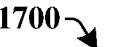
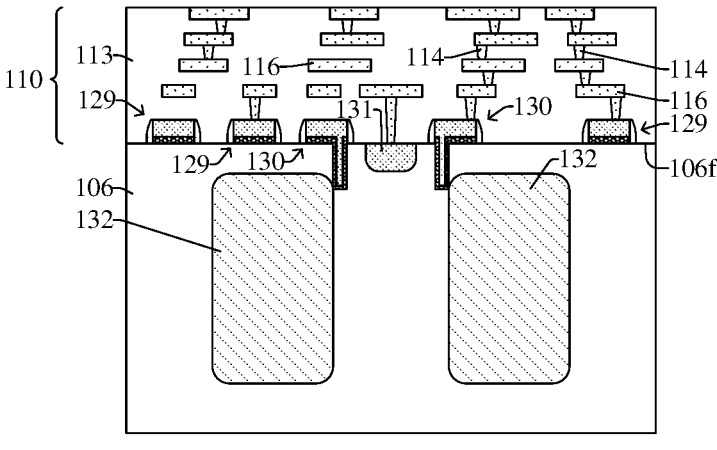
Fig. 17
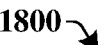
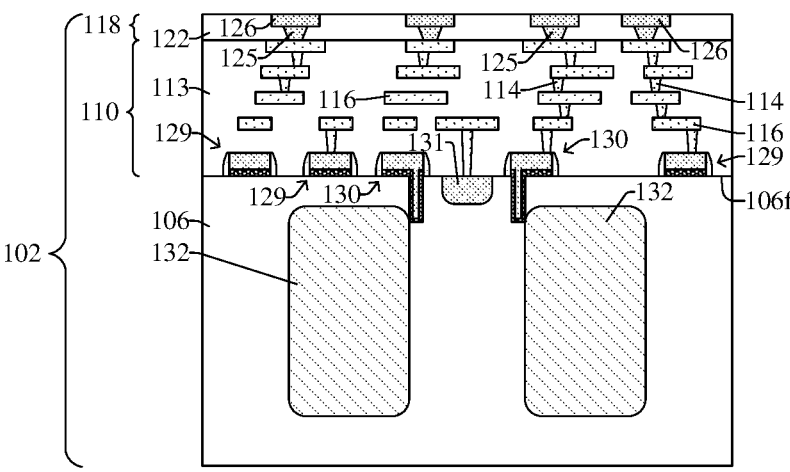
Fig. 18

1900

108 — 140    140    140 — 108f

2000

112 { 113 — 114    116    116

108 — 140    140    140 — 108f

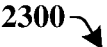
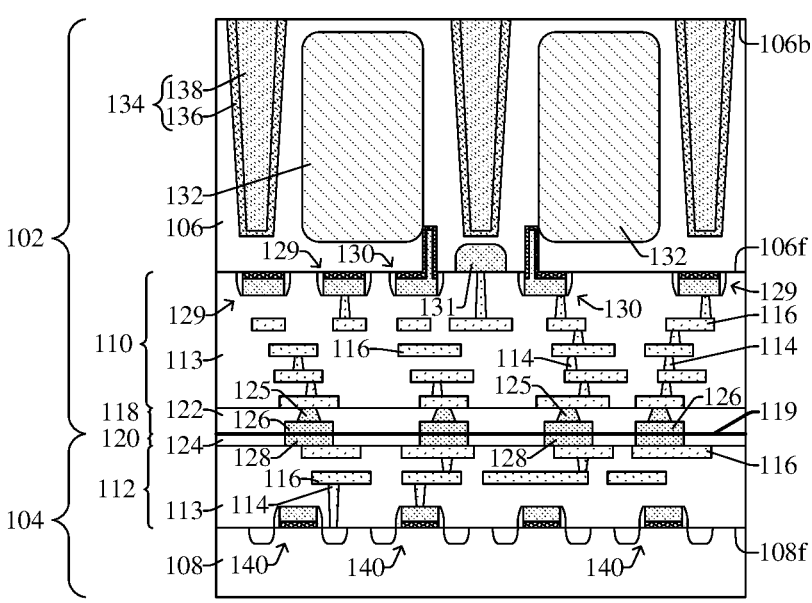
Fig. 23
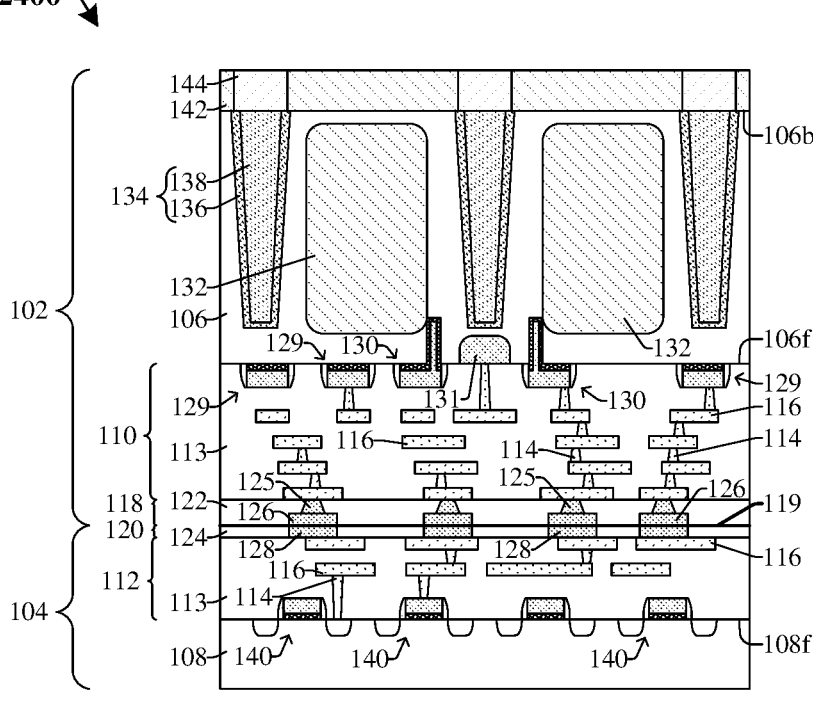
Fig. 24

2600 ⌐⥂

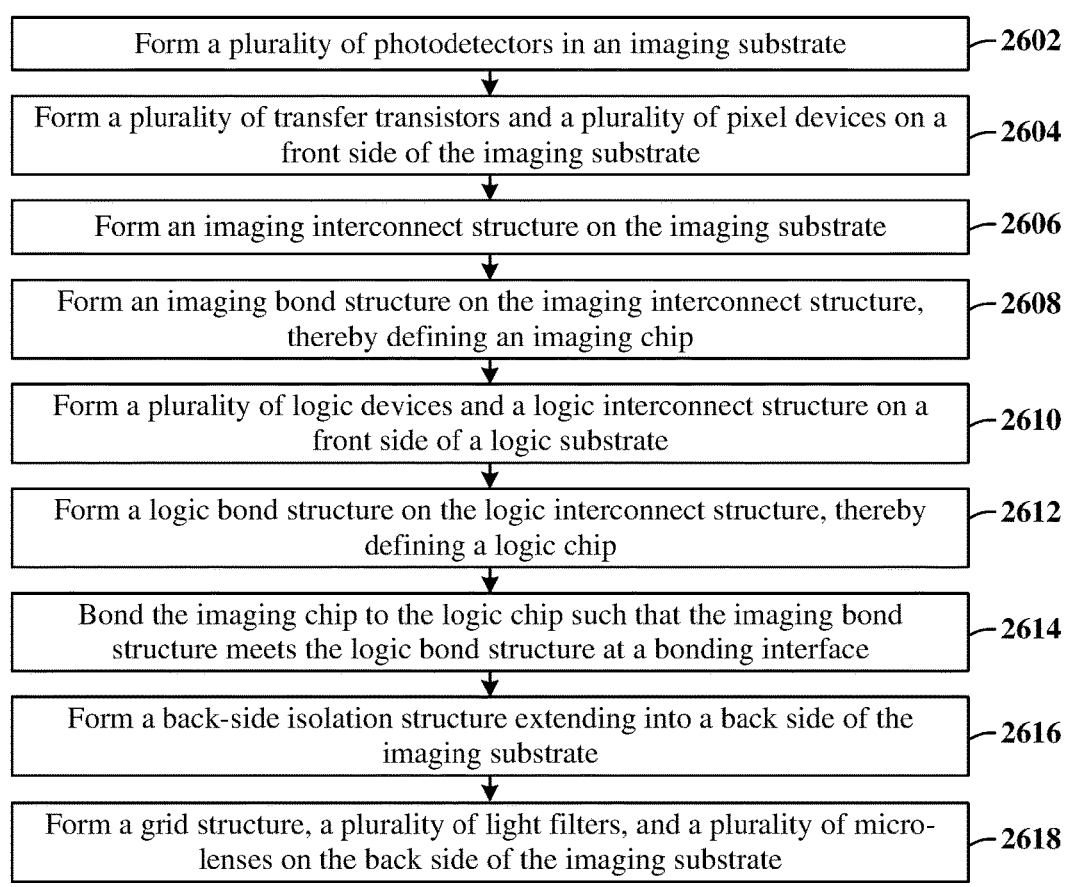

| | |
|---|---|
| Form a plurality of photodetectors in an imaging substrate | 2602 |
| Form a plurality of transfer transistors and a plurality of pixel devices on a front side of the imaging substrate | 2604 |
| Form an imaging interconnect structure on the imaging substrate | 2606 |
| Form an imaging bond structure on the imaging interconnect structure, thereby defining an imaging chip | 2608 |
| Form a plurality of logic devices and a logic interconnect structure on a front side of a logic substrate | 2610 |
| Form a logic bond structure on the logic interconnect structure, thereby defining a logic chip | 2612 |
| Bond the imaging chip to the logic chip such that the imaging bond structure meets the logic bond structure at a bonding interface | 2614 |
| Form a back-side isolation structure extending into a back side of the imaging substrate | 2616 |
| Form a grid structure, a plurality of light filters, and a plurality of micro-lenses on the back side of the imaging substrate | 2618 |

3700
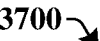
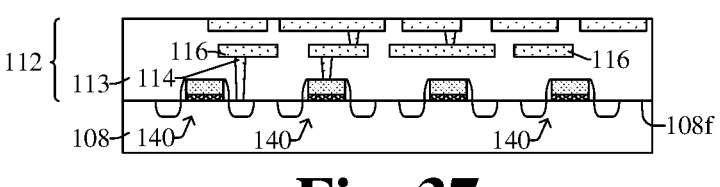
Fig. 37
3800
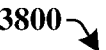
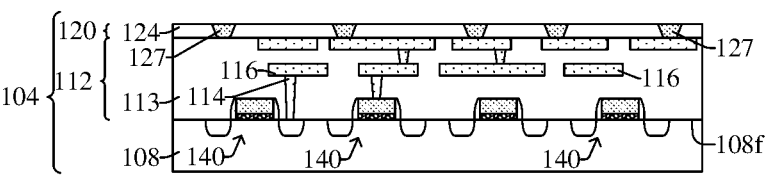
Fig. 38

4200

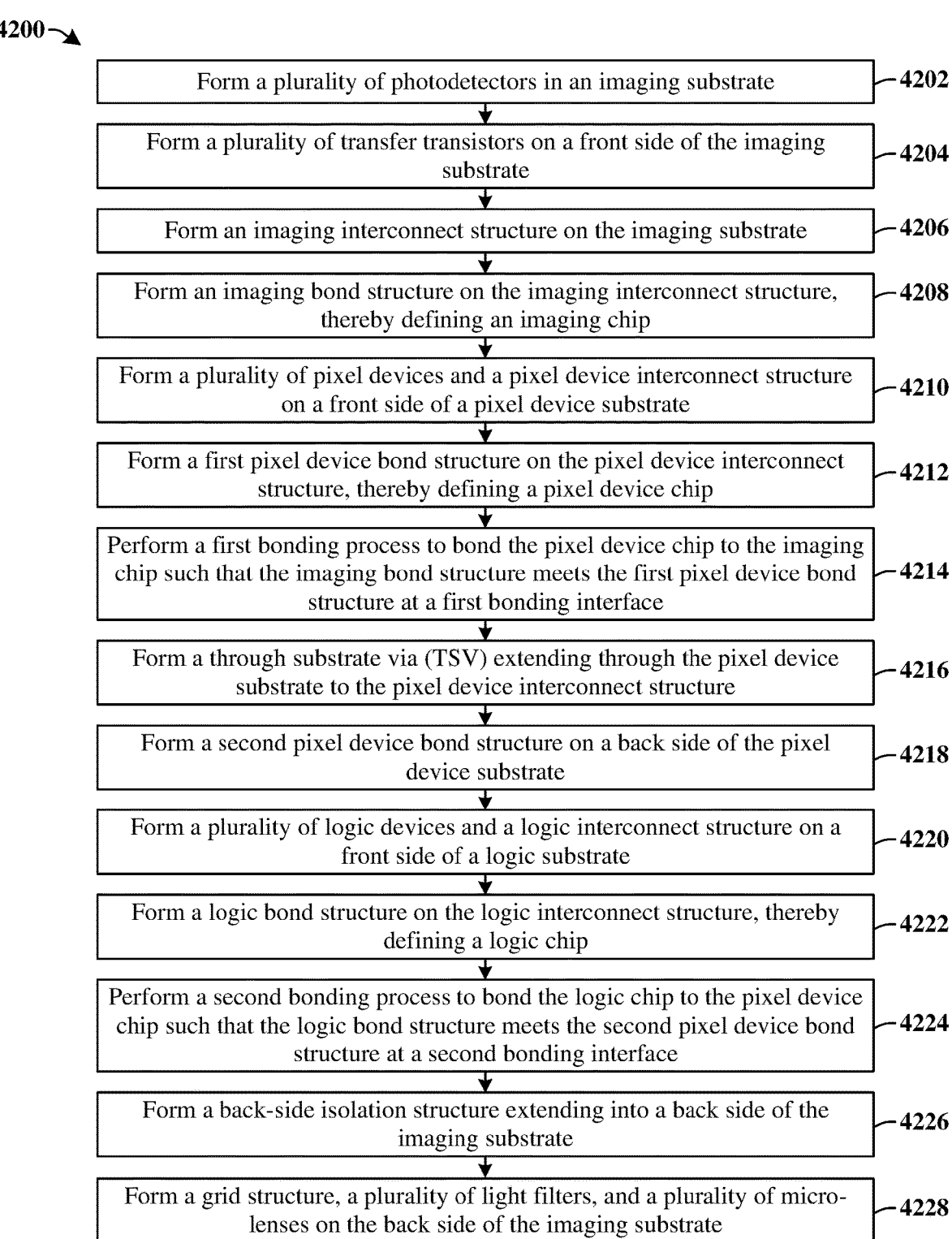

Form a plurality of photodetectors in an imaging substrate — 4202

Form a plurality of transfer transistors on a front side of the imaging substrate — 4204

Form an imaging interconnect structure on the imaging substrate — 4206

Form an imaging bond structure on the imaging interconnect structure, thereby defining an imaging chip — 4208

Form a plurality of pixel devices and a pixel device interconnect structure on a front side of a pixel device substrate — 4210

Form a first pixel device bond structure on the pixel device interconnect structure, thereby defining a pixel device chip — 4212

Perform a first bonding process to bond the pixel device chip to the imaging chip such that the imaging bond structure meets the first pixel device bond structure at a first bonding interface — 4214

Form a through substrate via (TSV) extending through the pixel device substrate to the pixel device interconnect structure — 4216

Form a second pixel device bond structure on a back side of the pixel device substrate — 4218

Form a plurality of logic devices and a logic interconnect structure on a front side of a logic substrate — 4220

Form a logic bond structure on the logic interconnect structure, thereby defining a logic chip — 4222

Perform a second bonding process to bond the logic chip to the pixel device chip such that the logic bond structure meets the second pixel device bond structure at a second bonding interface — 4224

Form a back-side isolation structure extending into a back side of the imaging substrate — 4226

Form a grid structure, a plurality of light filters, and a plurality of micro-lenses on the back side of the imaging substrate — 4228

Fig. 42

BONDING STRUCTURES FOR STACKED IMAGE SENSOR

REFERENCE TO RELATED APPLICATIONS

This application claims the benefit of U.S. Provisional Application No. 63/403,931, filed on Sep. 6, 2022 & U.S. Provisional Application No. 63/431,380, filed on Dec. 9, 2022. The contents of the above-referenced patent applications are hereby incorporated by reference in their entirety.

BACKGROUND

Many modern-day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5C and 5D illustrate various top views of some embodiments of the cross-sectional view of FIG. 5B taken along the line A-A' of FIG. 5B.

FIG. 6A illustrates a cross-sectional view of some embodiments of a stacked CMOS image sensor corresponding to some other embodiments of the stacked CMOS image sensor of FIG. 5A.

FIGS. 6B-6G illustrate various layout views of some embodiments of the stacked CMOS image sensor of FIG. 6A.

FIGS. 7C and 7D illustrate various top views of some embodiments of the cross-sectional view of FIG. 7B taken along the line A-A' of FIG. 7B.

FIG. 8A illustrates a cross-sectional view of some embodiments of a stacked CMOS image sensor corresponding to some other embodiments of the stacked CMOS image sensor of FIG. 7A.

FIG. 8B illustrates a cross-sectional view of some embodiments of a region of the stacked CMOS image sensor of FIG. 8A.

FIGS. 8C and 8D illustrate various top views of some embodiments of the cross-sectional view of FIG. 8B taken along the line A-A' of FIG. 8B.

FIGS. 9A-9H illustrate various cross-sectional views of some more detailed embodiments of one or more structures of the stacked CMOS image sensor of FIGS. 5A, 6A, 7A, and/or 8A.

FIG. 10A illustrates a cross-sectional view of some embodiments of a stacked CMOS image sensor corresponding to some other embodiments of the stacked CMOS image sensor of FIG. 5A.

FIGS. 10B and 10C illustrate various top views of some embodiments of the cross-sectional view of FIG. 10A.

FIG. 11A illustrates a cross-sectional view of some embodiments of a stacked CMOS image sensor corresponding to some other embodiments of the stacked CMOS image sensor of FIG. 5A.

FIGS. 11B and 11C illustrate various top views of some embodiments of the cross-sectional view of FIG. 11A.

FIGS. 14-25 illustrate various cross-sectional views of some embodiments of a method of forming a stacked CMOS image sensor comprising an imaging chip having an imaging bond structure stacked on a logic chip having a logic bond structure.

FIG. 26 illustrates a flowchart according to some embodiments of a method for forming a stacked CMOS image sensor comprising an imaging chip having an imaging bond structure stacked on a logic chip having a logic bond structure.

FIGS. 27-41 illustrate various cross-sectional views of some embodiments of a method of forming a stacked CMOS image sensor comprising an imaging chip, a pixel device chip, and a logic chip vertically stacked with one another.

FIG. 42 illustrates a flowchart according to some embodiments of a method for forming a stacked CMOS image sensor comprising an imaging chip, a pixel device chip, and a logic chip vertically stacked with one another.

DETAILED DESCRIPTION

Figures 1A, 1B:
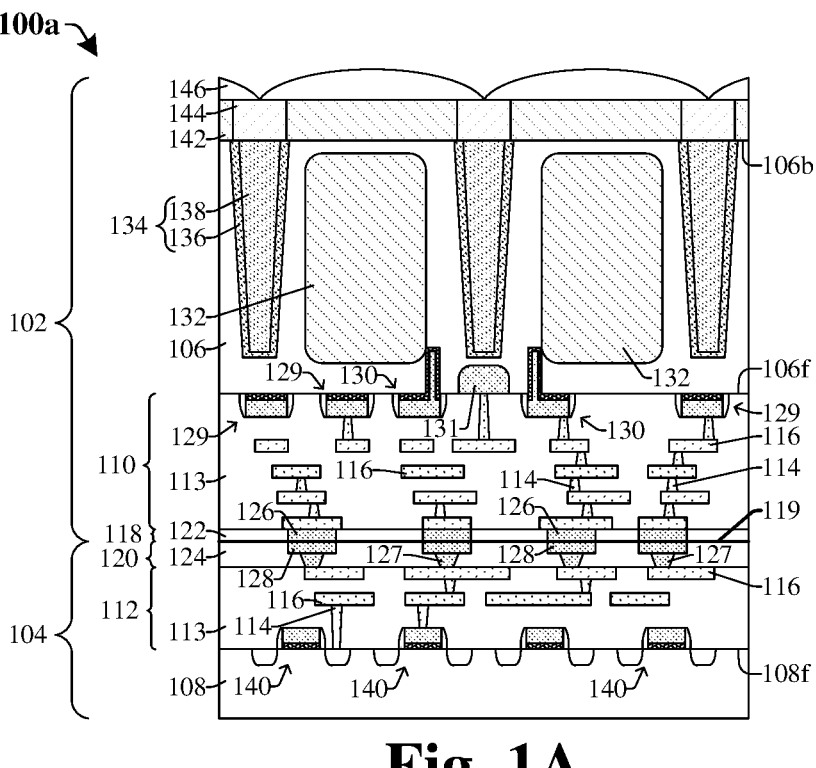
FIGS. 1A-1C illustrate various cross-sectional views of some embodiments of a stacked CMOS image sensor comprising an imaging chip having an imaging bond structure stacked on a logic chip having a logic bond structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked complementary metal-oxide semiconductor (CMOS) image sensor may comprise an imaging chip and a logic chip that are stacked. The imaging chip comprises a plurality of pixel sensors that each include a photodetector, and the logic chip comprises a plurality of logic devices that may be configured as an application-specific integrated circuit (ASIC). The photodetector is configured to accumulate charge in response to incident radiation. A plurality of pixel devices may be disposed on the imaging chip and are configured to facilitate readout of the accumulated charge. The imaging chip comprises an imaging bond structure and the logic chip comprises a logic bond structure, where the imaging bond structure and the logic bond structure meet at a bond interface. Further, the imaging chip and the logic chip each comprise an interconnect structure disposed on a corresponding substrate. The interconnect structures of the imaging chip and the logic chip are coupled to the imaging bond structure and the logic bond structure.

The plurality of logic devices of the logic chip and the plurality of pixel devices of the imaging chip are electrically coupled to one another by way of the imaging bond structure and the logic bond structure. The imaging bond structure and the logic bond structure respectively comprise conductive bonding layers that are configured to facilitate good electrical connections and good bonding adhesion between the logic chip and the imaging chip. However, typically the imaging bond structure and the logic bond structure each comprise two or more conductive bonding layers. For example, the imaging bond structure and the logic bond structure may respectively comprise a bonding wire disposed on a bonding via. Having the two or more conductive bonding layers in each of the bond structures may increase resistivity between the imaging chip and the logic chip and/or may increase fabrication costs of the stacked CMOS image sensor.

In an effort to increase a number of pixel sensor disposed on the imaging chip, the stacked CMOS image sensor may further comprise a pixel device chip disposed between the imaging chip and the logic chip. In such embodiments, the plurality of pixel devices is moved from the imaging chip to the pixel device chip, thereby increasing a number of photodetectors disposed on the imaging chip and/or increasing performance of the photodetectors (e.g., by decreasing dark current, electrical cross-talk, etc.). The pixel device chip may comprise an interconnect structure and a pixel device bond structure disposed on the interconnect structure and meeting the logic bond structure at a bond interface. Further, the interconnect structure of the pixel device chip may comprise one or more large conductive contacts that continuously extends from the interconnect structure of the pixel device chip to a doped region (e.g., a floating diffusion node) of the imaging chip. The one or more large conductive contacts facilitate direct electrical coupling between the pixel devices and the pixels sensors. For example, a large conductive contact may electrically couple a gate of a first pixel device (e.g., configured as a source follower transistor) of the pixel device chip to a corresponding first floating diffusion node of the imaging chip. While the one or more large conductive contacts may facilitate good electrical coupling between the pixel devices and the pixels sensors, the one or more large conductive contacts may be disposed in a device region of the stacked CMOS image sensor (e.g., aligned with a corresponding floating diffusion node). The one or more large conductive contacts occupy a relatively large area in the device region thereby increasing a distance between adjacent pixel sensors and reducing an ability to scale device features. As a result, a design complexity of the stacked CMOS image sensor is increased and an area for the plurality of pixel sensors is reduced, thereby increasing fabrication costs and decreasing device density.

Various embodiments of the present application are directed towards a stacked CMOS image sensor having bond structures disposed between stacked chips. The stacked CMOS image sensor comprises an imaging chip stacked with a logic chip. The imaging chip comprises a plurality of photodetectors disposed in an imaging substrate, an interconnect structure on the imaging substrate, and an imaging bond structure on the interconnect structure. The logic chip comprises a plurality of logic devices disposed on a logic substrate, an interconnect structure on the logic substrate, and a logic bond structure on the interconnect structure. A bond interface is disposed between the imaging bond structure and the logic bond structure. Further, at least one of the imaging bond structure and/or the logic bond structure has one or less conductive bonding layer. For example, the imaging bond structure may comprise a single layer of imaging bond pads and the logic bond structure comprises logic bond pads disposed on logic bond contacts. By virtue of at least one of the bond structures having one or less conductive bonding layer, a number of conductive structures between the stacked chips is reduced thereby decreasing resistivity between the stacked chips and decreasing fabrication costs of the stacked CMOS image sensor.

Further, the stacked CMOS image sensor may comprise a pixel device chip disposed between the imaging chip and the logic chip. The pixel device chip comprises a plurality of pixel devices disposed on a pixel device substrate, a first pixel device bond structure disposed on a front side of the pixel device substrate, and a second pixel device bond structure disposed on a back side of the pixel device substrate. The first pixel device bond structure may meet the imaging bond structure at a first bond interface and the second pixel device bond structure may meet the logic bond structure at a second bond interface. At least one of the first and/or second pixel device bond structures comprises one or less conductive bonding layer, thereby decreasing a number of conductive structures in the stacked CMOS image sensor. Further, the pixel device chip comprises a plurality of through substrate vias (TSVs) extending through the pixel device substrate and disposed in a peripheral region laterally offset from the pixel devices. The TSVs electrically couple the first pixel device bond structure to the second pixel device bond structure. By utilizing the first and second pixel device bond structures and TSVs, one or more large conductive vias may be omitted from a device region of the stacked CMOS image sensor. As a result, an area for the plurality of photodetectors is increased and a design complexity is decreased, thereby increasing device density and decreasing fabrication costs.

FIG. 1A illustrates a cross-sectional view 100a of some embodiments of a stacked CMOS image sensor comprising an imaging chip 102 having an imaging bond structure 118 stacked on a logic chip 104 having a logic bond structure 120.

The logic chip 104 comprises a logic substrate 108, a logic interconnect structure 112 disposed on the logic substrate 108, and the logic bond structure 120 disposed on the logic interconnect structure 112. Further, a plurality of logic devices 140 is disposed on a front side 108f of the logic substrate 108. In some embodiments, the logic devices 140 may be referred to as semiconductor devices and may be or comprise metal-oxide-semiconductor field-effect transistors (MOSFETs), logic gates, flip-flops, some other suitable logic device, or the like. The logic interconnect structure 112 comprises an interconnect dielectric structure 113, a plurality of conductive vias 114, and a plurality of conductive wires 116. The plurality of conductive vias 114 and the plurality of conductive wires 116 are disposed within the interconnect dielectric structure 113 and are configured to facilitate electrical connections between the logic devices 140 and other devices (e.g., in the imaging chip 102). The logic bond structure 120 is disposed on the logic interconnect structure 112.

The imaging chip 102 comprises an imaging substrate 106, an imaging interconnect structure 110 disposed on a front side 106f of the imaging substrate 106, and the imaging bond structure 118 disposed on the imaging interconnect structure 110. The imaging substrate 106 may comprise a semiconductor body (e.g., monocrystalline silicon, CMOS bulk, silicon-germanium, etc.) and has a first doping type (e.g., p-type). A plurality of photodetectors 132 is disposed within the imaging substrate 106, where the photodetectors 132 may have a second doping type (e.g., n-type) opposite the first doping type. A floating diffusion node 131 is disposed in the imaging substrate 106 and may comprise the second doping type (e.g., n-type). In some embodiments, the first doping type is p-type and the second doping type is n-type, or vice versa. A back-side isolation structure 134 extends into a back side 106b of the imaging substrate 106 and is disposed between adjacent photodetectors 132. The back-side isolation structure 134 comprises a trench fill layer 138 and a liner layer 136 disposed between the imaging substrate 106 and the trench fill layer 138. A grid structure 144 overlies the back side 106b of the imaging substrate 106 and a plurality of light filters 142 overlie the photodetectors 132. Further, a plurality of micro-lenses 146 are disposed on the plurality of light filters 142.

A plurality of pixel devices 129 and a plurality of transfer transistors 130 are disposed on the front side 106f of the imaging substrate 106. The pixel devices 129 and the transfer transistors 130 respectively comprise a gate electrode disposed on the imaging substrate 106 and a gate dielectric layer disposed between the gate electrode and the imaging substrate 106. In some embodiments, the transfer transistors 130 may be configured as vertical transistors that each comprise a protrusion extending from the front side 106f of the imaging substrate 106 towards a corresponding photodetector 132. The plurality of pixel devices 129 may, for example, comprise a reset transistor, a source-follower transistor, a select transistor, or the like. The photodetectors 132 are configured to absorb incident light (e.g., photons) and generate respective electrical signals corresponding to the incident light. For example, the photodetectors 132 may generate electron-hole pairs from the incident light. In some embodiments, the transfer transistors 130 are configured to control current flow between the floating diffusion node 131 and corresponding photodetectors 132. For example, the transfer transistors 130 may be configured to selectively form a conductive channel in the imaging substrate 106 between the floating diffusion node 131 and adjacent photodetectors 132 to transfer accumulated charge in the photodetectors 132 to the floating diffusion node 131. The pixel devices 129 are configured to conduct readout of the transfer accumulated charge from the floating diffusion node 131.

In some embodiments, the imaging bond structure 118 comprises an imaging bond dielectric 122 and a plurality of imaging bond pads 126. In various embodiments, the logic bond structure 120 comprises a logic bond dielectric 124, a plurality of logic bond pads 128, and a plurality of logic bond contacts 127. The imaging bond structure 118 meets the logic bond structure 120 at a bonding interface 119, where the bonding interface 119 comprises conductor-to-conductor bonds, dielectric-to-dielectric bonds, etc. The imaging bond structure 118 and the logic bond structure 120 are configured to facilitate electrical connections between the logic devices 140 and the pixel devices 129 and/or the transfer transistors 130. In various embodiments, at least one of the imaging bond structure 118 and/or the logic bond structure 120 has one or less conductive bonding layer. For example, the imaging bond structure 118 may comprise a single conductive bond layer (e.g., the imaging bond pads 126) and the logic bond structure 120 may comprise at least two conductive bond layers (e.g., the logic bond pads 128 and the logic bond contacts 127). By virtue of at least one of the imaging bond structure 118 and/or the logic bond structure 120 having one or less conductive bonding layer, a number of conductive structures between devices of the logic chip 104 and the imaging chip 102 is reduced, thereby reducing a resistivity and RC delay between the stacked chips. Further, having less conductive routing structures facilitates reducing sizes and/or spacing between conductive features in the stacked chips such that performance of the stacked CMOS image sensor may be increased while scaling device features.

FIG. 1B illustrates a cross-sectional view 100b of some embodiments of a stacked CMOS image sensor corresponding to some other embodiments of the stacked CMOS image sensor of FIG. 1A, where the logic bond structure 120 comprises a single conductive bonding layer (e.g., the plurality of logic bond contacts 127). Accordingly, in some embodiments, the logic bond structure 120 and the imaging bond structure 118 each comprise a single conductive bond layer, thereby further reducing the resistivity and RC delay between the stacked chips. In such embodiments, the plurality of imaging bond pads 126 meet the plurality of logic bond contacts 127 at the bonding interface 119 such that conductor-to-conductor bonds exist at the bonding interface 119 between the imaging bond pads 126 and the logic bond contacts 127. In various embodiments, widths of the imaging bond pads 126 are greater than a width of a corresponding logic bond contact 127 such that at least a portion of a lower surface of the imaging bond pads 126 directly contacts the logic bond dielectric 124.

Figure 1C:
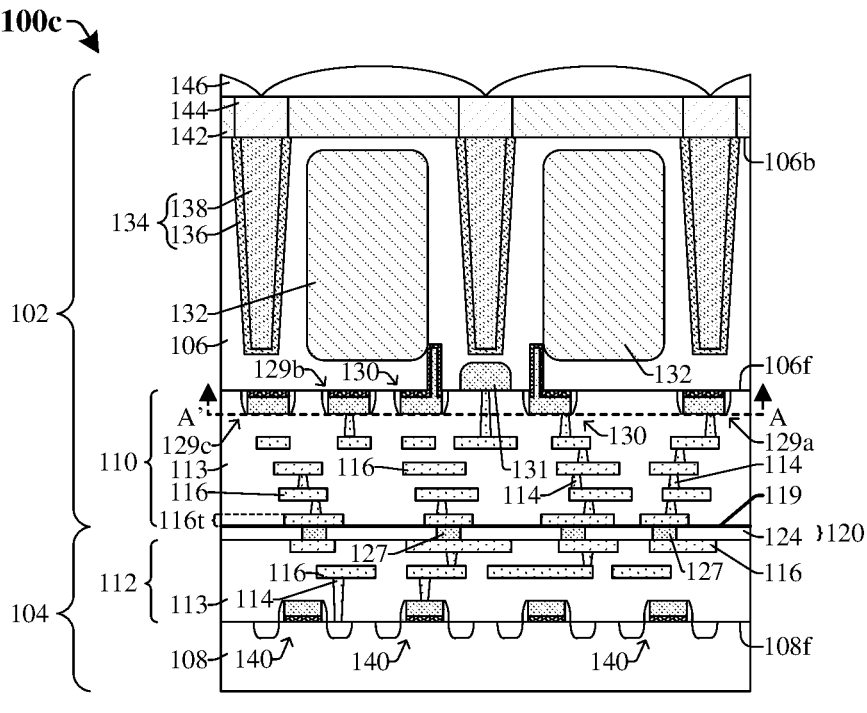

FIG. 1C illustrates a cross-sectional view 100c of some embodiments of a stacked CMOS image sensor corresponding to some other embodiments of the stacked CMOS image sensor of FIG. 1A, where the imaging bond structure (118 of FIG. 1A) is omitted. In various embodiments, the imaging interconnect structure 110 comprises a topmost layer of conductive wires 116t that is part of the plurality of conductive wires 116. The topmost layer of conductive wires 116t of the imaging interconnect structure 110 is defined as a layer of conductive wires in the imaging interconnect structure 110 with the greatest distance from the front side 106f of the imaging substrate 106. In various embodiments, the logic bond contacts 127 of the logic bond structure 120 directly contact the topmost layer of conductive wires 116t of the imaging interconnect structure 110, thereby further reducing the resistivity and RC delay between the stack chips. Accordingly, the logic bond contacts 127 meet the topmost layer of conductive wires 116t at the bonding interface 119. Further, the interconnect dielectric structure 113 of the imaging interconnect structure 110 directly contacts the logic bond dielectric 124. By virtue of the logic bond structure 120 directly contacting the topmost layer of conductive wires 116t of the imaging interconnect structure 110, a performance of the stacked CMOS image sensor is increased while increasing device scaling and decreasing design complexity.

In some embodiments, the imaging chip 102 comprises a first pixel device 129a, a second pixel device 129b, and a third pixel device 129c disposed on the front side 106f of the imaging substrate 106. The plurality of transfer transistors 130 may be disposed laterally between the floating diffusion node 131 and the first, second, and third pixel devices 129a-c.

Figure 2:
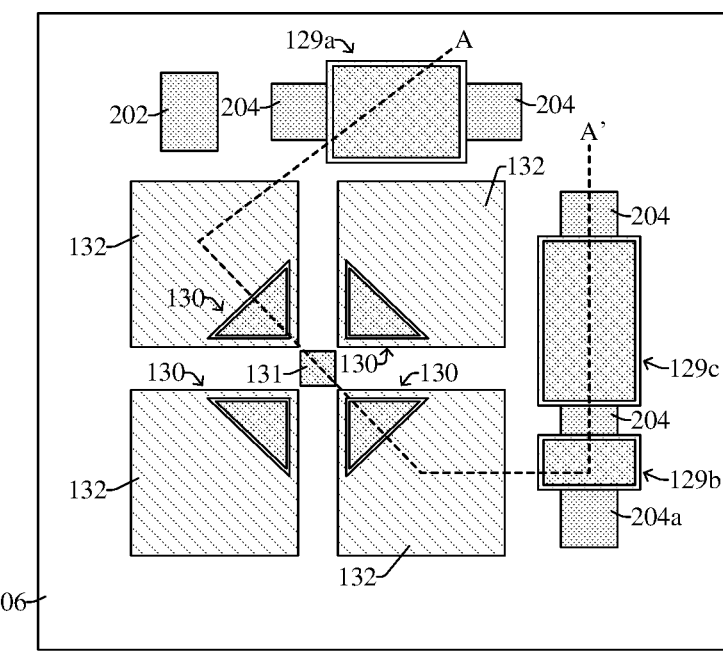
FIG. 2 illustrates a top view of some embodiments of the stacked CMOS image sensor of FIG. 1C taken along the line A-A' of FIG. 1C.

FIG. 2 illustrates a top view 200 of some embodiments of the stacked CMOS image sensor of FIG. 1C taken along the line A-A' of FIG. 1C. It will be appreciated that for ease of illustration the interconnect dielectric structure (113 of FIG. 1C) and the plurality of conductive vias (114 of FIG. 1C) of the imaging interconnect structure (110 of FIG. 1C) are omitted from the top view 200 of FIG. 2.

As shown in FIG. 2, the floating diffusion node 131 is disposed at a crossroad of adjacent photodetectors 132. The transfer transistors 130 directly overlie a corresponding photodetector 132. The first, second, and third pixel devices 129a-c are laterally offset from the photodetectors 132 and comprise a plurality of source/drain regions 204 disposed on opposite sides of respective gate electrodes. In some embodiments, the first pixel device 129a is configured as a reset transistor, the second pixel device 129b is configured as a select transistor and may comprises a first source/drain region 204a directly electrically coupled to a logic device (e.g., 140 of FIG. 1C) of the logic chip (104 of FIG. 1C), and the third pixel device 129c is configured as a source-follower transistor. In various embodiments, a well region 202 is laterally adjacent to the first pixel device 129a. The well region 202 may comprise the first doping type (e.g., p-type).

Figure 3:
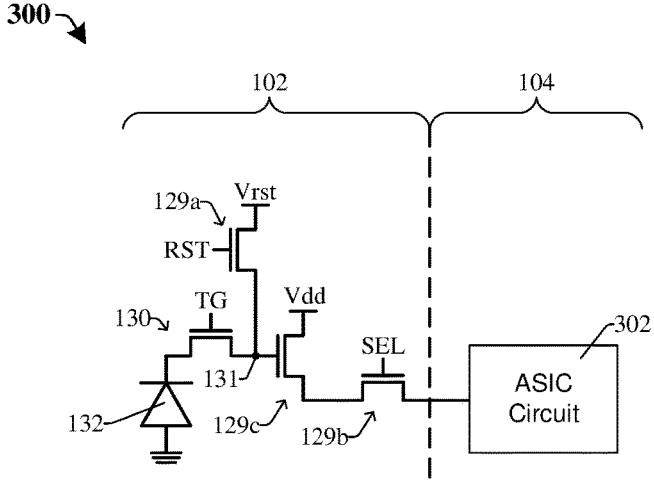
FIG. 3 illustrates a circuit diagram of some embodiments of a stacked CMOS image sensor comprising an imaging chip stacked on a logic chip.

FIG. 3 illustrates a circuit diagram 300 of some embodiments of a stacked CMOS image sensor. In various embodiments, the circuit diagram of 300 may correspond to some embodiments of the stacked CMOS image sensor of FIGS. 1A-1C.

The stacked CMOS image sensor comprises an imaging chip 102 electrically coupled to a logic chip 104. In various embodiments, the imaging chip 102 comprises a photodetector 132, a transfer transistor 130, a first pixel device 129a, a second pixel device 129b, and a third pixel device 129c. The logic chip 104 comprises an ASIC circuit 302. In some embodiments, the imaging chip 102 is configured to conduct readout of the photodetector 132 such that charge accumulated by the photodetector 132 from incident radiation may be readout as a corresponding electrical signal. The electrical signal may be provided to the ASIC circuit 302 for downstream signal processing. For example, the ASIC circuit 302 may be configured to perform analog-to-digital conversion (ADC), image processing, buffering, the like, or any combination of the foregoing.

In some embodiments, the photodetector 132 is coupled between ground and a first source/drain region of the transfer transistor 130. The transfer transistor 130 is gated by a transfer signal TX and is configured to selectively transfer accumulated charge at the photodetector 132 to a floating diffusion node 131. The first pixel device 129a may be configured as a reset transistor and is coupled between the floating diffusion node 131 and a reset voltage Vrst. The first pixel device 129a is gated by a reset signal RST and is configured to selectively electrically couple the floating diffusion node 131 to the reset voltage Vrst to reset the floating diffusion node 131 to the rest voltage Vrst. Further, the first pixel device 129a may be configured to selectively electrically couple the photodetector 132 to the reset voltage Vrst through coordination with the transfer transistor 130.

The third pixel device 129c may be configured as a source-follower transistor and is gated by a charge at the floating diffusion node 131. For instance, a gate of the source-follower transistor is electrically coupled to the floating diffusion node 131 and/or a source/drain region of the first pixel device 129a. The third pixel device 129c is coupled between a supply voltage Vdd and a source/drain region of the second pixel device 129b. The second pixel device 129b is configured as a select transistor. The third pixel device 129c is configured to buffer and/or amplifier a voltage at the floating diffusion node 131 for a reading of the voltage. The second pixel device 129b is configured to selectively pass the buffered and/or amplified voltage from the third pixel device 129c to an output of the imaging chip 102.

Figure 4:
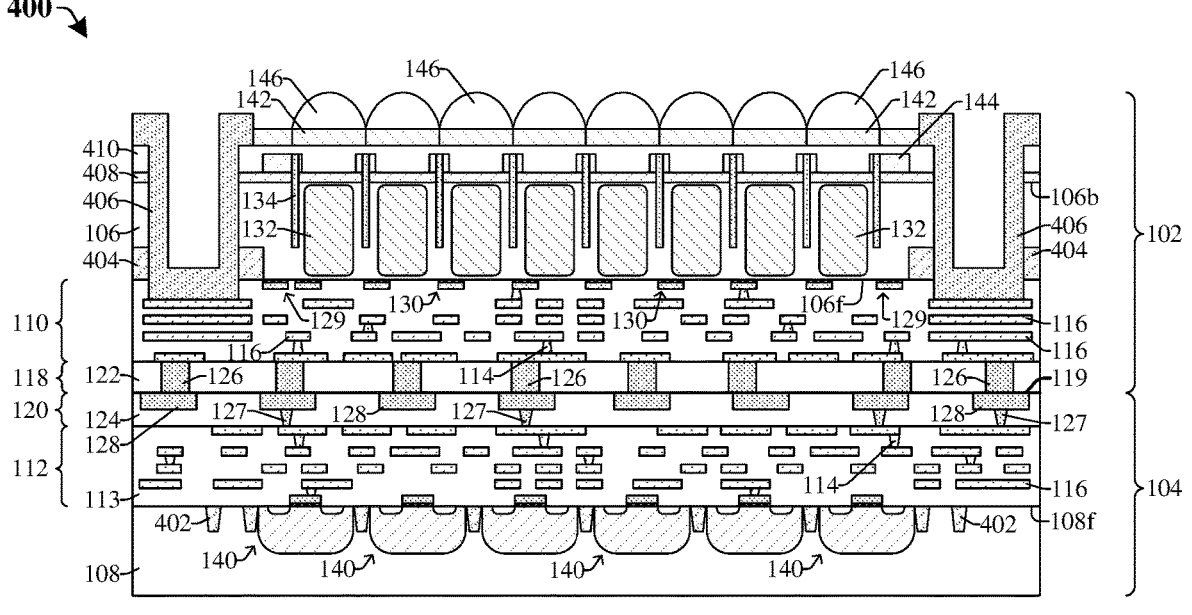
FIG. 4 illustrates a cross-sectional view of some embodiments of a stacked CMOS image sensor comprising an imaging chip having an imaging bond structure stacked on a logic chip having a logic bond structure.

FIG. 4 illustrates a cross-sectional view 400 of some embodiments of a stacked CMOS image sensor comprising an imaging chip 102 having an imaging bond structure 118 stacked on a logic chip 104 having a logic bond structure 120.

The logic chip 104 comprises a logic substrate 108, a logic interconnect structure 112, and the logic bond structure 120. A plurality of logic devices 140 is disposed on a front side 108f of the logic substrate 108. In various embodiments, the logic devices 140 each comprise a gate electrode over a gate dielectric, a plurality of source/drain regions disposed on opposing sides of the gate electrode, and a well region disposed in the logic substrate 108. Further, a first isolation structure 402 is disposed within the logic substrate 108 and is configured to electrically isolate the logic devices 140 from one another. The first isolation structure 402 is configured as a shallow trench isolation (STI) structure and may be or comprise silicon dioxide, silicon nitride, silicon carbide, another dielectric material, or any combination of the foregoing.

The imaging chip 102 comprises an imaging substrate 106, an imaging interconnect structure 110, and the imaging bond structure 118. The logic substrate 108 and the imaging substrate 106 may, for example, each be or comprise silicon, monocrystalline silicon, CMOS bulk, silicon-germanium, epitaxial silicon, a silicon-on-insulator (SOI) substrate, or some other type of semiconductor substrate. The imaging interconnect structure 110 and the logic interconnect structure 112 respectively comprise an interconnect dielectric structure 113, a plurality of conductive vias 114, and a plurality of conductive wires 116. The interconnect dielectric structures 113 may respectively comprise a plurality of dielectric layers that may, for example, be or comprise silicon dioxide, a low-k dielectric material, an extreme low-k dielectric material, some other dielectric material, or any combination of the foregoing. As used herein, a low-k dielectric material is a dielectric with a dielectric constant less than about 3.9. The conductive vias and wires 114, 116 may, for example, be or comprise copper, aluminum, titanium nitride, tantalum nitride, tungsten, ruthenium, some other conductive material, or any combination of the foregoing.

A plurality of photodetectors 132 is disposed within the imaging substrate 106. The photodetectors 132 may be arranged in an array comprising a plurality of rows and columns of photodetectors. A plurality of pixel devices 129 (e.g., reset transistor(s), select transistor(s), source-follower transistor(s), etc.) and a plurality of transfer transistors 130 are disposed on a front side 106f of the imaging substrate 106. Each transfer transistor in the plurality of transfer transistors 130 is aligned with a corresponding photodetector in the plurality of photodetectors 132. The pixel devices 129 and the transfer transistors 130 each comprise a gate electrode disposed on the front side 106f of the imaging substrate 106 and a gate dielectric disposed between the gate electrode and the imaging substrate 106.

A back-side isolation structure 134 extends into a back side 106b of the imaging substrate 106. The back-side isolation structure 134 may comprise a trench fill layer (e.g., 138 of FIG. 1A) and a liner layer (e.g., 136 of FIG. 1A) disposed between the imaging substrate 106 and the trench fill layer. In some embodiments, the trench fill layer may, for example, be or comprise a conductive material (e.g., copper, aluminum, tungsten, etc.), a dielectric material (e.g., aluminum oxide, silicon dioxide, silicon nitride, silicon carbide, etc.), or some other suitable material. In various embodiments, the liner layer may, for example, be or comprise a high-k dielectric material, aluminum oxide, titanium oxide, tantalum oxide, hafnium oxide, some other dielectric material, or any combination of the foregoing. As used herein, a high-k dielectric material is a dielectric with a dielectric constant greater than about 3.9. The back-side isolation structure 134 may have a grid pattern when viewed in top view and laterally surrounds each photodetector in the plurality of photodetectors 132. The back-side isolation structure 134 is configured to increase electrical and/or optical isolation between adjacent photodetectors 132.

Further, an upper dielectric layer 408 is disposed along the back side 106b of the imaging substrate 106. The upper dielectric layer 408 may be configured as a passivation layer. The upper dielectric layer 408 may, for example, be or comprise silicon dioxide, silicon nitride, silicon carbide, or the like. A grid structure 144 overlies the upper dielectric layer 408 and comprises sidewalls defining a plurality of openings overlying the photodetectors 132. In various embodiments, the grid structure 144 may comprise a metal material (e.g., copper, tungsten, aluminum, etc.) and/or a dielectric material (e.g., silicon nitride, silicon carbide, a metal oxide, etc.) and is configured to decrease cross-talk between adjacent photodetectors 132. An upper dielectric structure 410 overlies the grid structure 144 and fills the openings defined by sidewalls of the grid structure 144. A plurality of light filters 142 is disposed over the upper dielectric structure 410. In various embodiments, the light filters 142 each comprise a material configured to pass a first range of wavelengths while blocking a second range of wavelengths. A plurality of micro-lenses 146 are disposed on the light filters 142 and are configured to direct incident light towards the underlying photodetectors 132.

A plurality of upper bond pads 406 extend into the back side 106b of the imaging substrate 106 towards the imaging interconnect structure 110. The upper bond pads 406 may, for example, be or comprise aluminum, copper, tungsten, or the like. The upper bond pads 406 are disposed in a peripheral region of the imaging substrate 106. The photodetectors 132 are disposed in a device region of the imaging substrate 106, where the peripheral region of the imaging substrate 106 laterally encloses the device region. The upper bond pads 406 are configured to provide electrical connections to devices (e.g., the pixel devices 129, the transfer transistors 130, the logic devices 140, etc.) of the stacked CMOS image sensor and another integrated circuit (IC) device (not shown). A second isolation structure 404 is disposed within the imaging substrate 106. The second isolation structure 404 may be configured as a STI structure and may, for example, be or comprise silicon dioxide, silicon nitride, silicon carbide, or the like. The second isolation structure 404 may be disposed along sidewalls of the upper bond pads 406 and is configured to increase electrical isolation between the upper bond pads 406 and other devices (e.g., the pixel devices 129, the transfer transistors 130, the photodetectors 132) disposed on and/or within the imaging substrate 106.

In some embodiments, the imaging bond structure 118 comprises an imaging bond dielectric 122 and a plurality of imaging bond pads 126. In various embodiments, the logic bond structure 120 comprises a logic bond dielectric 124, a plurality of logic bond pads 128, and a plurality of logic bond contacts 127. The imaging bond structure 118 meets the logic bond structure 120 at a bonding interface 119, where the bonding interface 119 comprises conductor-to-conductor bonds, dielectric-to-dielectric bonds, etc. The imaging bond dielectric 122 and the logic bond dielectric 124 may respectively have one or more dielectric layers that may, for example, comprise an oxide (e.g., silicon dioxide), silicon nitride, silicon carbide, silicon oxynitride, or the like. The imaging bond pads 126, the logic bond contacts 127, and the logic bond pads 128 may, for example, each be or comprise copper, tungsten, titanium, tantalum, some other conductive material, or any combination of the foregoing. In various embodiments, the imaging bond structure 118 comprises a single layer of conductive bond structures (e.g., the imaging bond pads 126), thereby reducing a number of conductive structures between the logic chip 104 and the imaging chip 102. As a result, a resistivity and RC delay between the logic chip 104 and the imaging chip 102 are reduced, thereby increasing a performance of the stacked CMOS image sensor while reducing design costs and complexity.

Figure 5A:
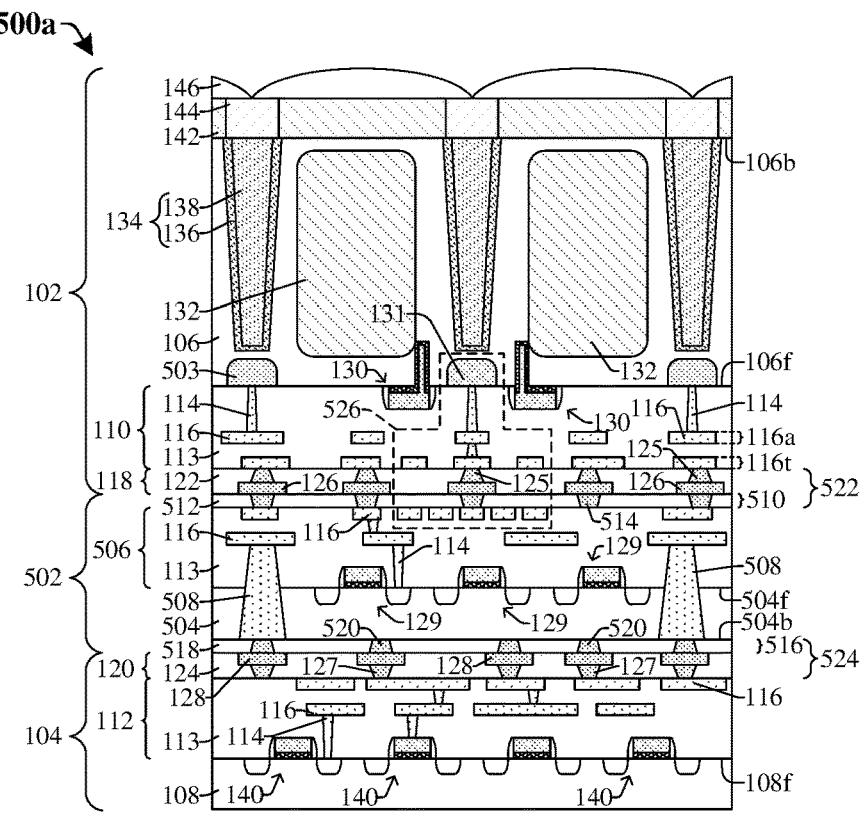
FIG. 5A illustrates a cross-sectional view of some embodiments of a stacked CMOS image sensor comprising an imaging chip, a pixel device chip, and a logic chip vertically stacked with one another.

FIG. 5A illustrates a cross-sectional view 500a of some embodiments of a stacked CMOS image sensor comprising an imaging chip 102, a pixel device chip 502, and a logic chip 104 vertically stacked with one another.

The logic chip 104 comprises a logic substrate 108, a logic interconnect structure 112, and a logic bond structure 120. A plurality of logic devices 140 is disposed on a front side 108f of the logic substrate 108. The logic bond structure 120 is disposed on and electrically coupled to the logic interconnect structure 112.

The imaging chip 102 comprises an imaging substrate 106, an imaging interconnect structure 110, and an imaging bond structure 118. The imaging bond structure 118 is disposed on and electrically coupled to the imaging interconnect structure. The imaging substrate 106 may have a first doping type (e.g., p-type). A plurality of photodetectors 132 is disposed in the imaging substrate 106, where the photodetectors 132 may have a second doping type (e.g., n-type) opposite the first doping type. A floating diffusion node 131 is disposed in the imaging substrate 106 and has the second doping type (e.g., n-type). A plurality of well regions 503 is disposed in the substrate on opposing sides of the floating diffusion node 131 and comprise the first doping type (p-type).

A back-side isolation structure 134 extends into a back side 106b of the imaging substrate 106. The back-side isolation structure 134 comprises a trench fill layer 138 and a liner layer disposed between the imaging substrate 106 and the trench fill layer 138. A grid structure 144 overlies the back side 106b of the imaging substrate 106 and a plurality of light filters 142 overlie the photodetectors 132. A plurality of micro-lenses 146 are disposed on the plurality of light filters 142. Further, a plurality of transfer transistors 130 is disposed on the front side 106f of the imaging substrate 106, where the transfer transistors 130 are configured to control current flow between the floating diffusion node 131 and corresponding photodetectors 132.

The pixel device chip 502 is disposed between the imaging chip 102 and the logic chip 104. In some embodiments, the pixel device chip 502 comprises a pixel device substrate 504, a pixel device interconnect structure 506, a first pixel device bond structure 510, and a second pixel device bond structure 516. A plurality of pixel devices 129 is disposed on a front side 504f of the pixel device substrate 504. In various embodiments, the plurality of pixel devices 129 may, for example, comprise a reset transistor, a source-follower transistor, a select transistor, or the like and are configured to conduct readout of accumulated charge from the photodetectors 132. By disposing the pixel devices 129 on the pixel device substrate 504 instead of, for example, on the imaging substrate 106 an area for photodetectors 132 is increased and electrical cross-talk across the imaging chip 102 is decreased. As a result, a number of photodetectors 132 disposed in the stacked CMOS image sensor may be increased and/or a performance of the photodetectors 132 is increased (e.g., by decreasing dark current, electrical cross-talk, etc.).

A plurality of through-substrate vias (TSVs) 508 is disposed in the pixel device chip 502. The TSVs 508 continuously extend through the pixel device substrate 504 from the second pixel device bond structure 516 to the pixel device interconnect structure 506. The TSVs 508 are configured to electrically couple the second pixel device bond structure 516 to the pixel device interconnect structure 506. In various embodiments, the pixel devices 129 are disposed within a device region (i.e., a middle region) of the pixel device substrate 504 and the TSVs 508 are disposed within a peripheral region of the pixel device substrate 504 that laterally encloses the device region. Disposing the TSVs 508 in the peripheral region of the pixel device substrate 504 and away from the device region increases an area for the pixel devices 129, thereby increasing a device density of the pixel device chip 502.

In various embodiments, the imaging interconnect structure 110, the logic interconnect structure 112, and the pixel device interconnect structure 506 respectively comprise an interconnect dielectric structure 113, a plurality of conductive vias 114, and a plurality of conductive wires 116. The imaging interconnect structure 110 includes a topmost layer of conductive wires 116t and a first layer of conductive wires 116a. The topmost layer of conductive wires 116t of the imaging interconnect structure 110 is defined as a layer of conductive wires in the imaging interconnect structure 110 with the greatest distance from the front side 106f of the imaging substrate 106. The first layer of conductive wires 116a of the imaging interconnect structure 110 is defined as a layer of conductive wires in the imaging interconnect structure 110 with the shortest distance from the front side 106f of the imaging substrate 106. It will be appreciated that while the interconnect structures 110, 112, 506 of FIG. 5A each comprise two layers of conductive wires 116 and two layers of conductive vias 114, this is merely a non-limiting example and the interconnect structures 110, 112, 506 may comprise any number of layers of conductive wires 116 and/or conductive vias 114.

The first pixel device bond structure 510 is disposed on the pixel device interconnect structure 506 and is configured to electrically couple the imaging chip 102 to the pixel device chip 502 and/or the logic chip 104. The second pixel device bond structure 516 is disposed on a back side 504b of the pixel device substrate 504 and is configured to electrically couple the pixel device chip 502 to the logic chip 104.

In some embodiments, the imaging bond structure 118 comprises an imaging bond dielectric 122, a plurality of imaging bond pads 126, and a plurality of imaging bond contacts 125. In various embodiments, the first pixel device bond structure 510 comprises a first pixel device bond dielectric 512 and a plurality of first pixel device bond contacts 514. The imaging bond structure 118 meets the first pixel device bond structure 510 at a first bonding interface thereby defining a first bonded structure 522, where the first bonding interface comprises conductor-to-conductor bonds and dielectric-to-dielectric bonds. The imaging bond structure 118 and the first pixel device bond structure 510 are configured to facilitate good electrical connections between the imaging chip 102 and the pixel device chip 502. In some embodiments, at least one of the imaging bond structure 118 and/or the first pixel device bond structure 510 has one or less conductive bonding layer. For example, the first pixel device bond structure 510 may comprise a single conductive bond layer (e.g., the first pixel device bond contacts 514). By virtue of at least one of the imaging bond structure 118 and/or the first pixel device bond structure 510 having one or less conductive bonding layer, a number of conductive structures between devices of the imaging chip 102 and the pixel device chip 502 is reduced, thereby reducing a resistivity and RC delay between the stacked chips. Further, having less conductive structures between the imaging chip 102 and the pixel device chip 502 facilitates reducing sizes and/or spacing between conductive features in the stacked chips, thereby increasing performance of the stacked CMOS image sensor while facilitating device scaling and reducing fabrication costs. In addition, a first pixel device bond contact 514 is directly electrically coupled to the floating diffusion node 131 of the imaging chip 102 in a region 526 of the stacked CMOS image sensor.

In further embodiments, the logic bond structure 120 comprises a logic bond dielectric 124, a plurality of logic bond pads 128, and a plurality of logic bond contacts 127. In yet further embodiments, the second pixel device bond structure 516 comprises a second pixel device bond dielectric 518 and a plurality of second pixel device bond contacts 520. The logic bond structure 120 meets the second pixel device bond structure 516 at a second bonding interface thereby defining a second bonded structure 524, where the second bonding interface comprises conductor-to-conductor bonds and dielectric-to-dielectric bonds. The logic bond structure 120 and the second pixel device bond structure 516 are configured to facilitate good electrical connections between the logic chip 104 and the pixel device chip 502. In some embodiments, at least one of the logic bond structure 120 and/or the second pixel device bond structure 516 has one or less conductive bonding layer. For example, the second pixel device bond structure 516 may comprise a single conductive bond layer (e.g., the second pixel device bond contacts 520). By virtue of at least one of the logic bond structure 120 and/or the second pixel device bond structure 516 having one or less conductive bonding layer, a number of conductive structures between devices of the logic chip 104 and the pixel device chip 502 is reduced, thereby reducing a resistivity and RC delay between the stacked chips. Further, having less conductive structures between the logic chip 104 and the pixel device chip 502 facilitates reducing sizes and/or spacing between conductive features in the stacked chips, thereby further increasing performance of the stacked CMOS image sensor while facilitating device scaling and further reducing fabrication costs.

Figure 5B:
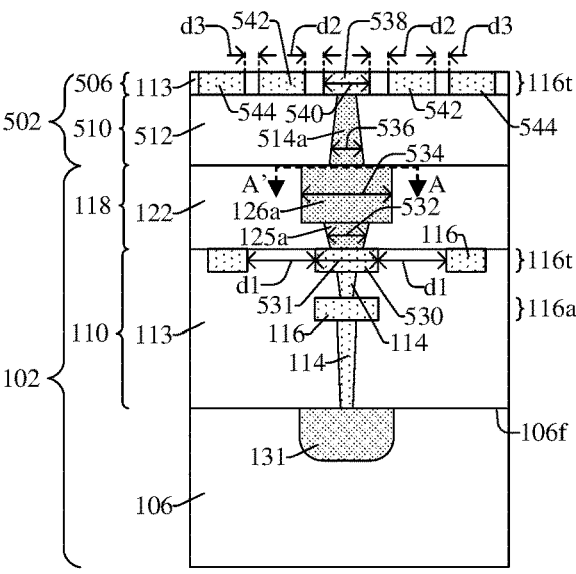
FIG. 5B illustrates a cross-sectional view of some embodiments of a region of the stacked CMOS image sensor of FIG. 5A.

FIG. 5B illustrates a cross-sectional view 500b of some embodiments of a region of the stacked CMOS image sensor of FIG. 5A. In some embodiments, the cross-sectional view 500b of FIG. 5B corresponds to the region (526 of FIG. 5A) of the stacked CMOS image senor, where the region (526 of FIG. 5A) is flipped for ease of illustration in FIG. 5B.

As shown in FIG. 5B, the imaging interconnect structure 110 comprises a first topmost wire 530 disposed between two adjacent topmost wires. The first topmost wire 530 has a width 531 that may, for example, be about 0.25 micrometers (um), within a range of about 0.2 um to about 0.3 um, or some other suitable value. The first topmost wire 530 is separated from the two adjacent topmost wires by a first distance d1. In some embodiments, the first distance d1 is about 0.27 um, within a range of about 0.25 um to about 0.29 um, or some other suitable value. In further embodiments, the width 531 of the first topmost wire 530 is less than the first distance d1.

The imaging bond structure 118 comprises a first imaging bond contact 125a and a first imaging bond pad 126a. The first imaging bond contact 125a has a width 532 and the first imaging bond pad 126a has a width 534. In further embodiments, the width 532 is about 0.2 um, within a range of about 0.15 um to about 0.25 um, or some other suitable value. In yet further embodiments, the width 534 is about 0.3 um, about 0.4 um, within a range of about 0.3 um to about 0.4 um, or some other suitable value. The first pixel device bond structure 510 comprises a first bond contact 514a that has a width 536. In various embodiments, the width 536 is about 0.1 um, within a range of about 0.075 um to about 1.25 um, or some other suitable value. In some embodiments, a height of the first bond contact 514a is greater than a height of the first imaging bond contact 125a. In further embodiments, the height of the first bond contact 514a may be equal to a height of the imaging bond structure 118. In various embodiments, the width 536 of the first bond contact 514a is less than the width 532 of the first imaging bond contact 125a.

The pixel device interconnect structure 506 comprises a first topmost wire 538 disposed between a first pair of topmost wires 542 and a second pair of topmost wires 544. A width 540 of the first topmost wire 538 may, for example, be about 0.15 um, within a range of about 0.1 um to 0.2 um, or some other suitable value. Thus, in some embodiments, the width 540 of the first topmost wire 538 of the pixel device interconnect structure 506 is less than the width 531 of the first topmost wire 530 of the imaging interconnect structure 110. The first topmost wire 538 is separated from the first pair of topmost wires 542 by a second distance d2 and the first pair of topmost wires 542 is separated from the second pair of topmost wires 544 by a third distance d3. In various embodiments, the second distance d2 is about 0.15 um, within a range of about 0.1 um to about 0.2 um, or some other suitable value. In further embodiments, the third distance d3 is about 0.1 um, within a range of about 0.075 um to about 1.25 um, or some other suitable value. By virtue of at least one of the imaging bond structure 118 and/or the first pixel device bond structure 510 having one or less conductive bonding layer, widths and/or distances between conductive routing features in the imaging chip 102 and the pixel device chip 502 may be relatively small and/or reduced. This increases performance (e.g., reduces an RC delay in imaging chip 102 and/or the pixel device chip 502) of the stacked CMOS image sensor while facilitating device scaling and reducing fabrication costs.

FIG. 5C illustrates a top view 500c of some embodiments of the cross-sectional view 500b of FIG. 5B taken along the line A-A', where the first imaging bond pad 126a and the first imaging bond contact 125a respectively have a circular shape when viewed in top view.

FIG. 5D illustrates a top view 500d of some embodiments of the cross-sectional view 500b of FIG. 5B taken along the line A-A', where the first imaging bond pad 126a and the first imaging bond contact 125a respectively have a rectangular shape when viewed in top view.

FIG. 6A illustrates a cross-sectional view 600a of some embodiments of a stacked CMOS image sensor corresponding to some other embodiments of the stacked CMOS image sensor of FIG. 5A, where the first and second pixel device bond structures 510, 516 respectively comprise two conductive bonding layers and the imaging and logic bond structures 118, 120 respectively comprise at least one conductive bonding layer. In various embodiments, the first pixel device bond structure 510 comprises the first pixel device bond dielectric 512, the plurality of first pixel device bond contacts 514, and a plurality of first pixel device bond pads 515. In some embodiments, the imaging bond structure 118 comprises the imaging bond dielectric 122 and the plurality of imaging bond contacts 125. In further embodiments, the second pixel device bond structure 516 comprises the second pixel device bond dielectric 518, the plurality of second pixel device bond contacts 520, and a plurality of second pixel device bond pads 521. In yet further embodiments, the logic bond structure 120 comprises a logic bond dielectric 124 and the plurality of logic bond contacts 127.

The pixel device interconnect structure 506 comprises a topmost layer of conductive wires 116t that is a layer of conductive wires in the pixel device interconnect structure 506 with the greatest distance from the front side 504*f* of the pixel device substrate 504. In various embodiments, the first pixel device bond contacts 514 directly contact the topmost layer of conductive wires 116*t* of the pixel device interconnect structure 506. Further, the pixel device interconnect structure 506 comprises a first layer of conductive wires 116*a* disposed between the topmost layer of conductive wires 116*t* of the pixel device interconnect structure 506 and the pixel device substrate 504. In various embodiments, the plurality of pixel devices 129 includes a first pixel device 129*a*, a second pixel device 129*b*, and a third pixel device 129*c*. In some embodiments, the first pixel device 129*a* is configured as a reset transistor, the second pixel device 129*b* is configured as a select transistor, and the third pixel device 129*c* is configured as a source-follower transistor.

FIG. 6B illustrates a layout view 600*b* of some embodiments of the cross-sectional view 600*a* of FIG. 6A taken along the line 602 of FIG. 6A. The layout view 600*b* of FIG. 6B illustrates some embodiments of a layout of a shared pixel structure 614 of the imaging chip (102 of FIG. 6A).

In some embodiments, the shared pixel structure 614 comprises the floating diffusion node 131 disposed at a center of four adjacent photodetectors 132 and well regions 503 disposed on opposite sides of the floating diffusion node 131. In various embodiments, a pitch Ps of the shared pixel structure 614 is about 0.86 um, within a range of about 0.8 um to 0.9 um, or some other suitable value. In further embodiments, a distance ds between laterally adjacent transfer transistors 130 in the shared pixel structure 614 is about 0.11 um, within a range of about 0.09 to about 0.13 um, or some other suitable value. In yet further embodiments, a distance dd between diagonally separated transfer transistors 130 in the shared pixel structure 614 is about 0.26 um, within a range of about 0.2 um to about 0.32 um, or some other suitable value. In some embodiments, a width 616 of each conductive via 114 is about 0.06 um, within a range of about 0.04 um to about 0.08 um, or some other suitable value.

FIG. 6C illustrates a layout view 600*c* of some embodiments of the cross-sectional view 600*a* of FIG. 6A taken along the line 604 of FIG. 6A. The layout view 600*c* of FIG. 6C illustrates some embodiments of a layout of the first layer of conductive wires 116*a* of the imaging interconnect structure (110 of FIG. 6A) over the shared pixel structure 614.

In some embodiments, a width 618 of each conductive wire in the first layer of conductive wires 116*a* is about 0.07 um, within a range of about 0.05 to about 0.09 um, or some other suitable value. In various embodiments, a distance 620 between adjacent conductive wires in the first layer of conductive wires 116*a* of the imaging interconnect structure (110 of FIG. 6A) is about 0.1 um, about 0.105 um, within a range of about 0.08 um to about 0.12 um, or some other suitable value.

FIG. 6D illustrates a layout view 600*d* of some embodiments of the cross-sectional view 600*a* of FIG. 6A taken along the line 606 of FIG. 6A. The layout view 600*d* of FIG. 6D illustrates some embodiments of a layout of the topmost layer of conductive wires 116*t* of the imaging interconnect structure (110 of FIG. 6A) over the shared pixel structure 614.

In some embodiments, a length Lt and a width Wt of a middle topmost conductive wire 116*tm* of the imaging interconnect structure (110 of FIG. 6A) are each about 0.45 um, within a range of about 0.4 um to about 0.5 um, or some other suitable value. The middle topmost conductive wire 116*tm* directly overlies the floating diffusion node 131. In various embodiments, a distance 622 between adjacent topmost conductive wires in the topmost layer of conductive wires 116*t* of the imaging interconnect structure (110 of FIG. 6A) is about 0.17 um, within a range of about 0.12 um to about 0.22 um, or some other suitable value.

FIG. 6E illustrates a layout view 600*e* of some embodiments of the cross-sectional view 600*a* of FIG. 6A taken along the line 608 of FIG. 6A. The layout view 600*e* of FIG. 6E illustrates some embodiments of a layout of the plurality of pixel devices 129 of the pixel device chip (502 of FIG. 6A).

The plurality of pixel devices 129 comprise a plurality of source/drain regions 624 disposed in the pixel device substrate 504. Further, a well region 626 is disposed in the pixel device substrate 504 and may be electrically coupled to a reference voltage (e.g., ground). In some embodiments, a distance 628 between the well region 626 and an adjacent source/drain region 624 of an adjacent pixel device in the plurality of pixel devices 129 is about 0.1 um, within a range of about 0.08 um to about 0.12 um, or some other suitable value. In further embodiments, a distance 630 between source/drain regions 624 of adjacent pixel devices in the plurality of pixel devices 129 is about 0.12 um, within a range of about 0.1 um to about 0.14 um, or some other suitable value. In yet further embodiments, a distance 632 between source/drain regions 624 of pixel devices in the plurality of pixel devices 129 and an adjacent gate electrode of the third pixel device 129*c* is about 0.09 um, within a range of about 0.08 um to about 0.1 um, or some other suitable value.

FIG. 6F illustrates a layout view 600*f* of some embodiments of the cross-sectional view 600*a* of FIG. 6A taken along the line 610 of FIG. 6A. The layout view 600*f* of FIG. 6F illustrates some embodiments of a layout of the first layer of conductive wires 116*a* of the pixel device interconnect structure (506 of FIG. 6A) over the plurality of pixel devices 129.

In various embodiments, a distance 634 between adjacent conductive wires in the first layer of conductive wires 116*a* of the pixel device interconnect structure (506 of FIG. 6A) is about 0.07 um, about 0.08 um, about 0.1 um, within a range of about 0.06 and 0.18, or some other suitable value.

FIG. 6G illustrates a layout view 600*g* of some embodiments of the cross-sectional view 600*a* of FIG. 6A taken along the line 612 of FIG. 6A. The layout view 600*g* of FIG. 6G illustrates some embodiments of a layout of the topmost layer of conductive wires 116*t* of the pixel device interconnect structure (506 of FIG. 6A) over the plurality of pixel devices 129.

In some embodiments, a length and a width of a middle topmost conductive wire 116*tm* of the pixel device interconnect structure (506 of FIG. 6A) are each about 0.25 um, within a range of about 0.2 um to about 0.3 um, or some other suitable value. A center of the middle topmost conductive wire 116*tm* of the pixel device interconnect structure (506 of FIG. 6A) may be laterally aligned with a center of the middle topmost conductive wire (116*tm* of FIG. 6D) of the imaging interconnect structure (110 of FIG. 6A). In various embodiments, a distance 636 between adjacent topmost conductive wires in the topmost layer of conductive wires 116*t* of the pixel device interconnect structure (506 of FIG. 6A) is about 0.1 um, within a range of about 0.08 um to about 0.12 um, or some other suitable value.

Figure 7A:
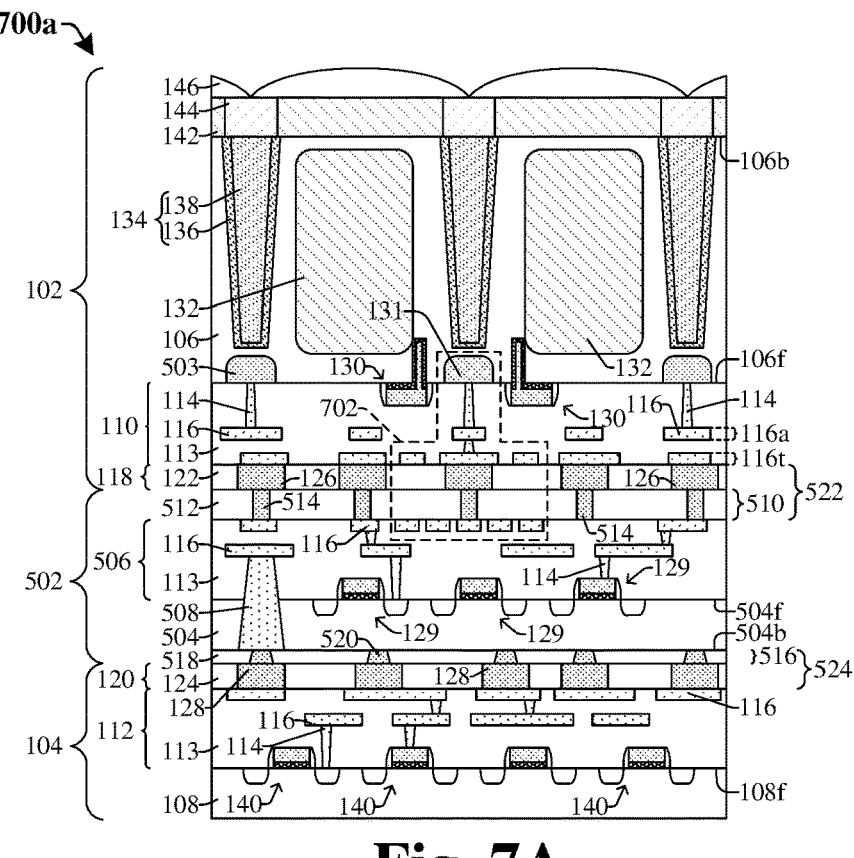
FIG. 7A illustrates a cross-sectional view of some embodiments of a stacked CMOS image sensor corresponding to some other embodiments of the stacked CMOS image sensor of FIG. 5A.

FIG. 7A illustrates a cross-sectional view 700*a* of some embodiments of a stacked CMOS image sensor corresponding to some other embodiments of the stacked CMOS image sensor of FIG. 5A, where the imaging and logic bond structures 118, 120 respectively comprise at least one conductive bonding layer (e.g., the imaging bond contacts 125 of FIG. 5A and the logic bond contacts 127 of FIG. 5A are omitted). In some embodiments, by virtue of the logic bond structure 120, the second pixel device bond structure 516, the first pixel device bond structure 510, and the imaging bond structure 118 having one or less conductive bonding layer, a number of conductive structures between devices of the logic chip 104, the imaging chip 102, and the pixel device chip 502 is reduced, thereby reducing a resistivity and RC delay between the stacked chips. Further, having less conductive routing structures facilitates reducing sizes and/or spacing between conductive features in the stacked chips such that performance of the stacked CMOS image sensor may be increased while scaling device features.

Figure 7B:
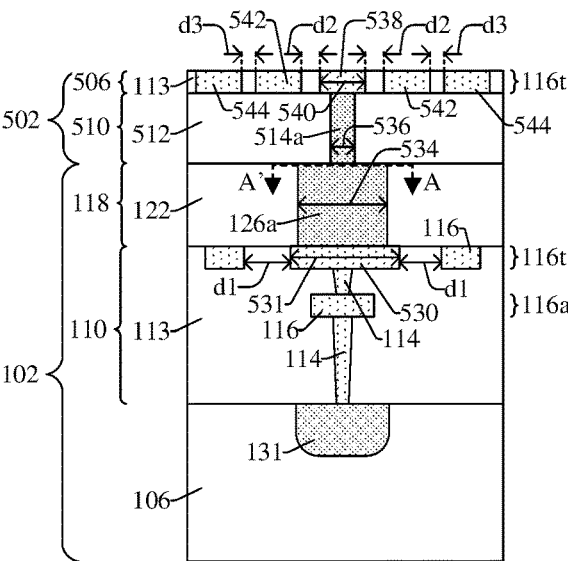
FIG. 7B illustrates a cross-sectional view of some embodiments of a region of the stacked CMOS image sensor of FIG. 7A.

FIG. 7B illustrates a cross-sectional view 700b of some embodiments of a region of the stacked CMOS image sensor of FIG. 7A. In some embodiments, the cross-sectional view 700b of FIG. 7B corresponds to a region (702 of FIG. 7A) of the stacked CMOS image sensor, where the region (702 of FIG. 7A) is flipped for ease of illustration in FIG. 7B.

As shown in FIG. 7B, the imaging interconnect structure 110 comprises a first topmost wire 530 disposed between two adjacent topmost wires. The first topmost wire 530 has a width 531 that may, for example, be about 0.35 um, within a range of about 0.3 um to about 0.4 um, or some other suitable value. The first topmost wire 530 is separated from the two adjacent topmost wires by a first distance d1. In some embodiments, the first distance d1 is about 0.22 um, within a range of about 0.2 um to about 0.24 um, or some other suitable value. In further embodiments, the width 531 of the first topmost wire 530 is greater than the first distance d1.

The imaging bond structure 118 comprises a first imaging bond pad 126a having a width 534. In some embodiments, the width 534 is about 0.3 um, within a range of about 0.25 um to about 0.35 um, or some other suitable value. The first pixel device bond structure 510 comprises a first bond contact 514a that has a width 536. In various embodiments, the width 536 is about 0.1 um, within a range of about 0.075 um to about 1.25 um, or some other suitable value. In some embodiments, a height of the first bond contact 514a is equal to a height of the first imaging bond pad 126a.

The pixel device interconnect structure 506 comprises a first topmost wire 538 disposed between a first pair of topmost wires 542 and a second pair of topmost wires 544. A width 540 of the first topmost wire 538 may, for example, be about 0.15 um, within a range of about 0.1 um to 0.2 um, or some other suitable value. Thus, in some embodiments, the width 540 of the first topmost wire 538 of the pixel device interconnect structure 506 is less than the width 531 of the first topmost wire 530 of the imaging interconnect structure 110. The first topmost wire 538 is separated from the first pair of topmost wires 542 by a second distance d2 and the first pair of topmost wires 542 is separated from the second pair of topmost wires 544 by a third distance d3. In various embodiments, the second distance d2 is about 0.15 um, within a range of about 0.1 um to about 0.2 um, or some other suitable value. In further embodiments, the third distance d3 is about 0.1 um, within a range of about 0.075 um to about 1.25 um, or some other suitable value.

FIG. 7C illustrates a top view 700c of some embodiments of the cross-sectional view 700b of FIG. 7B taken along the line A-A', where the first imaging bond pad 126a has a circular shape when viewed in top view.

FIG. 7D illustrates a top view 500d of some embodiments of the cross-sectional view 500b of FIG. 5B taken along the line A-A', where the first imaging bond pad 126a has a rectangular shape when viewed in top view.

FIG. 8A illustrates a cross-sectional view 800a of some embodiments of a stacked CMOS image sensor corresponding to some other embodiments of the stacked CMOS image sensor of FIG. 7A, where the imaging bond structure 118 comprises a plurality of imaging bond contacts 125 and the first pixel device bond structure 510 comprises a plurality of first pixel device bond pads 515.

FIG. 8B illustrates a cross-sectional view 800b of some embodiments of a region of the stacked CMOS image sensor of FIG. 8A. In some embodiments, the cross-sectional view 800b of FIG. 8B corresponds to a region (801 of FIG. 8A) of the stacked CMOS image sensor, where the region (801 of FIG. 7A) is flipped for ease of illustration in FIG. 7B.

The imaging bond structure 118 comprises a first imaging bond contact 125a having a width 532. In some embodiments, the width 532 is about 0.1 um, within a range of about 0.08 um to about 0.12 um, or some other suitable value. The first pixel device bond structure 510 comprises a first bond pad 515a having a width 802. In various embodiments, the width 802 is about 0.3 um, within a range of about 0.25 um to about 0.35 um, or some other suitable value. In some embodiments, a height of the first imaging bond contact 125a is equal to a height of the first bond pad 515a.

FIG. 8C illustrates a top view 800c of some embodiments of the cross-sectional view 800b of FIG. 8B taken along the line A-A', where the first imaging bond contact 125a has a circular shape when viewed in top view.

FIG. 8D illustrates a top view 800d of some embodiments of the cross-sectional view 800b of FIG. 8B taken along the line A-A', where the first imaging bond contact 125a has a rectangular shape when viewed in top view.

FIGS. 9A-9F illustrate various cross-sectional views 900a-900f corresponding to some embodiments of the imaging interconnect structure 110, the imaging bond structure 118, and/or the first pixel device bond structure 510 of FIGS. 5A, 6A, 7A, and/or 8A. In some embodiments, the imaging interconnect structure 110 has an interconnect dielectric structure (e.g., 113 of FIG. 5A) comprising a plurality of dielectric layers 906, 910, 914 and a plurality of etch stop layers 908, 912. In further embodiments, the imaging bond structure 118 has an imaging bond dielectric (e.g., 122 of FIG. 5A) comprising the etch stop layer 912, a passivation layer 916, the dielectric layer 914, and a dielectric blocking layer 918. In yet further embodiments, the first pixel device bond structure 510 has a first pixel device bond dielectric (e.g., 512 of FIG. 5A) comprising the etch stop layer 912, a passivation layer 916, the dielectric layer 914, and the dielectric blocking layer 918. The dielectric layers 906, 910, 914 may, for example, be or comprise an oxide such as silicon dioxide, a low-k dielectric material, or another suitable dielectric material. The etch stop layers 908, 912 may, for example, be or comprise silicon nitride, silicon carbide, or the like. The passivation layer 916 may, for example, be or comprise silicon nitride, or another dielectric material. The dielectric blocking layer 918 may, for example, be or comprise silicon oxynitride, silicon oxycarbide, or the like.

Further, the conductive vias 114 and the conductive wires 116 of the imaging interconnect structure 110 respectively comprise a conductive liner 902 and a conductive body 904. The conductive liner 902 may, for example, be or comprise titanium nitride, tantalum nitride, or the like. The conductive body 904 may, for example, be or comprise copper, aluminum, tungsten, ruthenium, another conductive material, or any combination of the foregoing.

With reference to FIG. 9A, the imaging bond structure comprises an imaging bond pad 126 having the conductive liner 902 and the conductive body 904. Further, the first pixel device bond structure 510 comprises a first bond contact 514 and a first bond pad 515 that respectively comprise the conductive liner 902 and the conductive body 904.

With reference to FIG. 9B, the imaging bond structure comprises an imaging bond contact 125 and an imaging bond pad 126 that respectively comprise the conductive liner 902 and the conductive body 904. In further embodiments, the first pixel device bond structure 510 comprises a first bond pad 515 comprising the conductive liner 902 and the conductive body 904 such that the first pixel device bond structure 510 comprises a single conductive layer.

With reference to FIG. 9C, the imaging bond structure 118 has an imaging bond contact 125 that comprises the conductive liner 902 and the conductive body 904. Further, the first pixel device bond structure 510 has the first bond pad 515 that comprises the conductive liner 902 and the conductive body 904. Thus, in some embodiments, the imaging bond structure 118 and the first pixel device bond structure 510 each comprise a single conductive layer.

With reference to FIG. 9D, the imaging bond structure comprises an imaging bond pad 126 having the conductive liner 902 and the conductive body 904. Further, the first pixel device bond structure 510 has a first bond contact 514 that comprises the conductive liner 902 and the conductive body 904. Thus, in some embodiments, the imaging bond structure 118 and the first pixel device bond structure 510 each comprise a single conductive layer.

With reference to FIG. 9E, the first pixel device bond structure 510 has the first bond pad 515 that comprises the conductive liner 902 and the conductive body 904, where the first bond pad 515 directly contacts the imaging interconnect structure 110.

With reference to FIG. 9F, the first pixel device bond structure 510 has a first bond contact 514 that comprises the conductive liner 902 and the conductive body 904, where the first bond contact 514 directly contacts the imaging interconnect structure 110.

FIGS. 9G and 9H illustrate various cross-sectional views 900a-900f corresponding to some embodiments of the logic interconnect structure 112, the logic bond structure 120, and/or the second pixel device bond structure 516 of FIGS. 5A, 6A, 7A, and/or 8A. In some embodiments, the logic interconnect structure 112 has an interconnect dielectric structure (e.g., 113 of FIG. 5A) comprising a plurality of dielectric layers 906, 910, 914 and a plurality of etch stop layers 908, 912. In further embodiments, the logic bond structure 120 has a logic bond dielectric (e.g., 124 of FIG. 5A) comprising the etch stop layer 912, a passivation layer 916, the dielectric layer 914, and a dielectric blocking layer 918. In yet further embodiments, the second pixel device bond structure 516 has a second pixel device bond dielectric (e.g., 518 of FIG. 5A) comprising the etch stop layer 912, a passivation layer 916, the dielectric layer 914, and the dielectric blocking layer 918. Further, the conductive vias 114 and the conductive wires 116 of the logic interconnect structure 112 respectively comprise a conductive liner 902 and a conductive body 904.

With reference to FIG. 9G, the logic bond structure 120 has a logic bond contact 127 comprising the conductive liner 902 and the conductive body 904. Further, the second pixel device bond structure 516 comprises a second bond pad 521 comprising the conductive liner 902 and the conductive body 904. Thus, in some embodiments, the logic bond structure 120 and the second pixel device bond structure 516 each comprise a single conductive layer.

With reference to FIG. 9H, the logic bond structure 120 has a logic bond pad 128 comprising the conductive liner 902 and the conductive body 904. Further, the second pixel device bond structure 516 comprises a second bond contact 520 comprising the conductive liner 902 and the conductive body 904.

FIG. 10A illustrates a cross-sectional view 1000a of some embodiments of a stacked CMOS image sensor according to some other embodiments of the stacked CMOS image sensor of FIG. 5A, where the imaging bond structure 118 comprises the plurality of imaging bond pads 126, the logic bond structure 120 comprises the plurality of logic bond contacts 127 and the plurality of logic bond pads 128, the first pixel device bond structure 510 comprises the plurality of first pixel device bond contacts 514 and the plurality of first pixel device bond pads 515, and the second pixel device bond structure 516 comprises the plurality of second pixel device bond contacts 520.

Further, a first isolation structure 402 is disposed within the logic substrate 108 and is configured to electrically isolate the logic devices 140 from one another. A plurality of upper bond pads 406 extends into the back side 106b of the imaging substrate 106 towards the imaging interconnect structure 110. The plurality of upper bond pads 406 are disposed in a peripheral region of the imaging substrate 106. The photodetectors 132 are disposed in a device region of the imaging substrate 106, where the peripheral region of the imaging substrate 106 laterally encloses the device region. The upper bond pads 406 are configured to provide electrical connections to devices (e.g., the pixel devices 129, the transfer transistors 130, the logic devices 140, etc.) of the stacked CMOS image sensor and another integrated circuit (IC) device (not shown). A second isolation structure 404 is disposed within the imaging substrate 106. The second isolation structure 404 may be disposed along sidewalls of the upper bond pads 406 and is configured to increase electrical isolation between the upper bond pads 406 and other devices (e.g., the pixel devices 129, the transfer transistors 130, the photodetectors 132) disposed on and/or within the imaging substrate 106. An upper dielectric layer 408 is disposed along the back side 106b of the imaging substrate 106. An upper dielectric structure 410 is disposed between the upper dielectric layer 408 and the plurality of light filters 142. In addition, a third isolation structure 1002 is disposed in the pixel device substrate 504, where the third isolation structure 1002 is configured to electrically isolate the pixel devices 129 from one another.

FIG. 10B illustrates a top view 1000b of some embodiments of the stacked CMOS image sensor of FIG. 10A taken along the line 1003 of FIG. 10A. It will be appreciated that for ease of illustration the interconnect dielectric structure (113 of FIG. 10A) of the imaging interconnect structure (110 of FIG. 10A) is omitted from the top view 1000b of FIG. 10B. In some embodiments, the floating diffusion node 131 is disposed at a crossroad of adjacent photodetectors 132 and the transfer transistors 130 directly overlie a corresponding photodetector 132.

FIG. 10C illustrates a top view 1000c of some embodiments of the stacked CMOS image sensor of FIG. 10A taken along the line 1004 of FIG. 10A. It will be appreciated that for ease of illustration the interconnect dielectric structure (113 of FIG. 10A) of the pixel device interconnect structure (506 of FIG. 10A) and the third isolation structure (1002 of FIG. 10A) are omitted from the top view 1000c of FIG. 10C. In some embodiments, the first pixel device 129a is disposed laterally between the well region 202 and the second and third pixel devices 129b, 129c.

FIG. 11A illustrates a cross-sectional view 1100a of some embodiments of a stacked CMOS image sensor according to some other embodiments of the stacked CMOS image sensor of FIG. 10A, where at least one logic device 140 is disposed on the pixel device substrate 504 laterally adjacent to the plurality of pixel devices 129.

FIG. 11B illustrates a top view 1100b of some embodiments of the stacked CMOS image sensor of FIG. 11A taken along the line 1102 of FIG. 11A. It will be appreciated that for ease of illustration the interconnect dielectric structure (113 of FIG. 11A) of the imaging interconnect structure (110 of FIG. 11A) is omitted from the top view 1100b of FIG. 11B. In some embodiments, the floating diffusion node 131 is disposed at a crossroad of adjacent photodetectors 132 and the transfer transistors 130 directly overlie a corresponding photodetector 132.

FIG. 11C illustrates a top view 1100c of some embodiments of the stacked CMOS image sensor of FIG. 11A taken along the line 1104 of FIG. 11A. It will be appreciated that for ease of illustration the interconnect dielectric structure (113 of FIG. 11A) of the pixel device interconnect structure (506 of FIG. 11A) and the third isolation structure (1002 of FIG. 11A) are omitted from the top view 1100c of FIG. 11C. In some embodiments, the first pixel device 129a is laterally adjacent to the at least one logic device 140 disposed on the pixel device substrate 504.

Figure 12A:
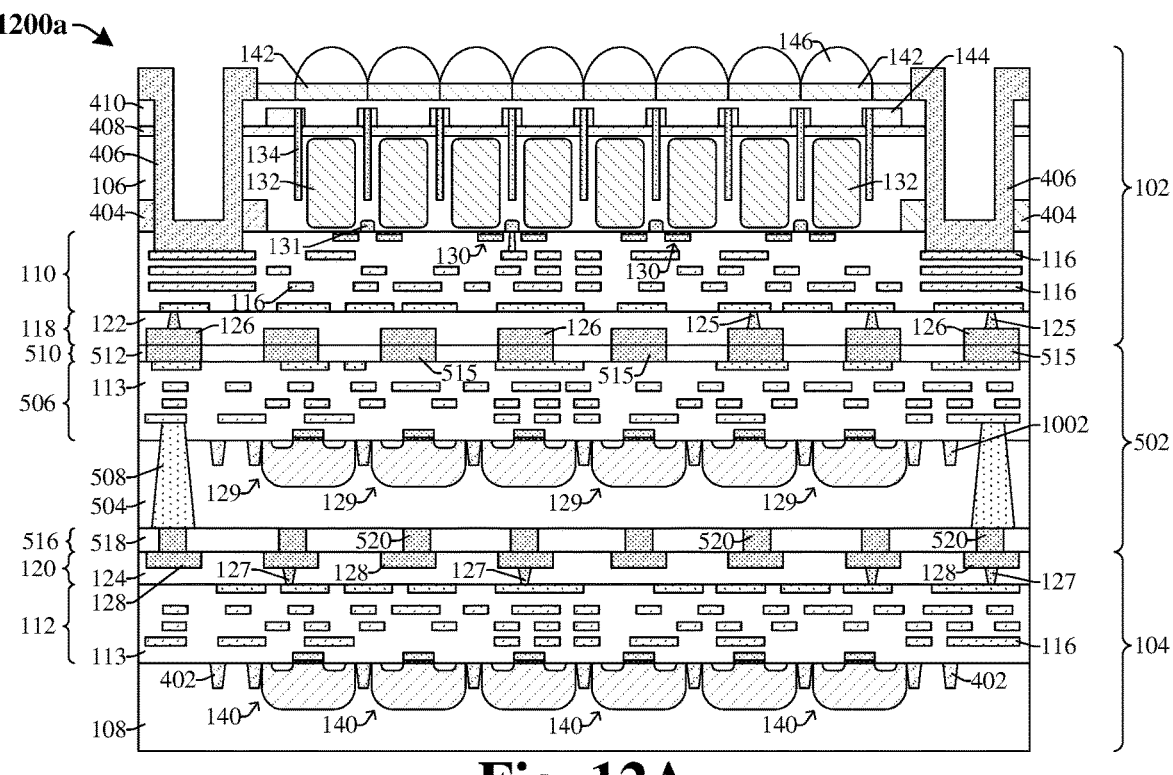
FIGS. 12A-12E illustrate various cross-sectional views of some embodiments of a stacked CMOS image sensor corresponding to some other embodiments of the stacked CMOS image sensor of FIG. 10A.

FIG. 12A illustrates a cross-sectional view 1200a of some embodiments of a stacked CMOS image sensor according to some other embodiments of the stacked CMOS image sensor of FIG. 10A, where the imaging bond structure 118 comprises the plurality of imaging bond contacts 125 and the plurality of imaging bond pads 126, the logic bond structure 120 comprises the plurality of logic bond contacts 127 and the plurality of logic bond pads 128, the first pixel device bond structure 510 comprises the plurality of first pixel device bond pads 515, and the second pixel device bond structure 516 comprises the plurality of second pixel device bond contacts 520.

Figure 12B:
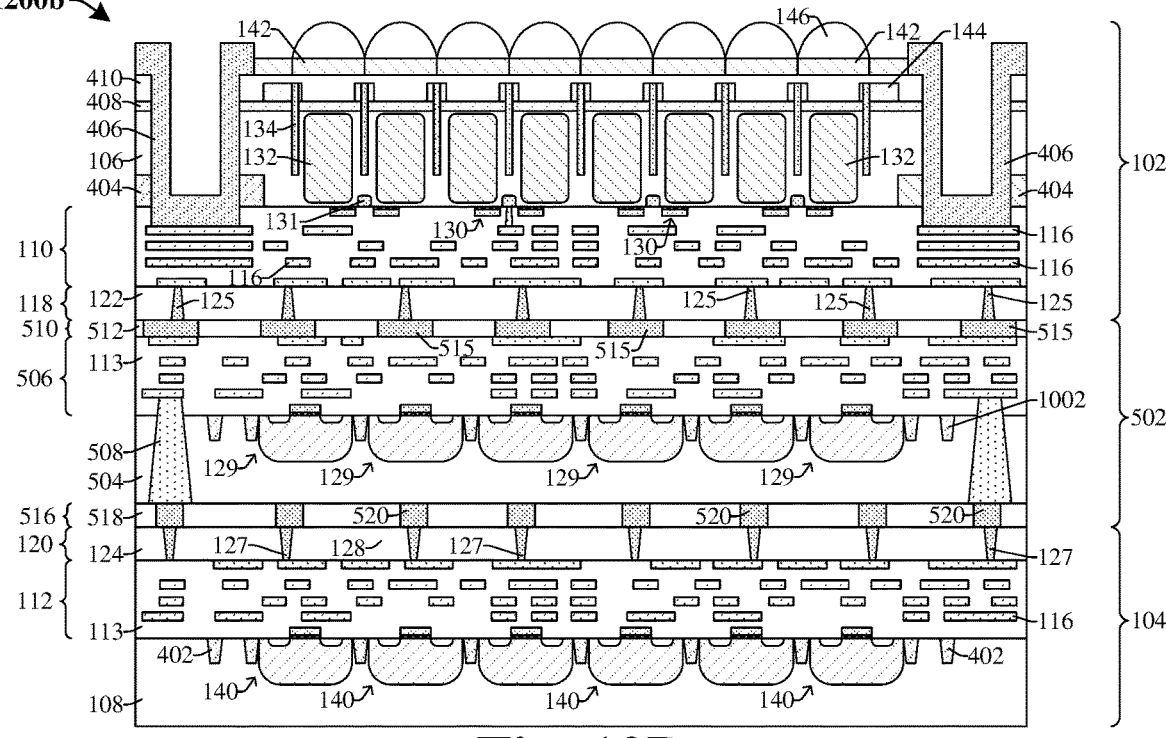

FIG. 12B illustrates a cross-sectional view 1200b of some embodiments of a stacked CMOS image sensor according to some other embodiments of the stacked CMOS image sensor of FIG. 12A, where the imaging bond structure 118 comprises the plurality of imaging bond contacts 125 and the logic bond structure 120 comprises the plurality of logic bond contacts 127.

Figure 12C:
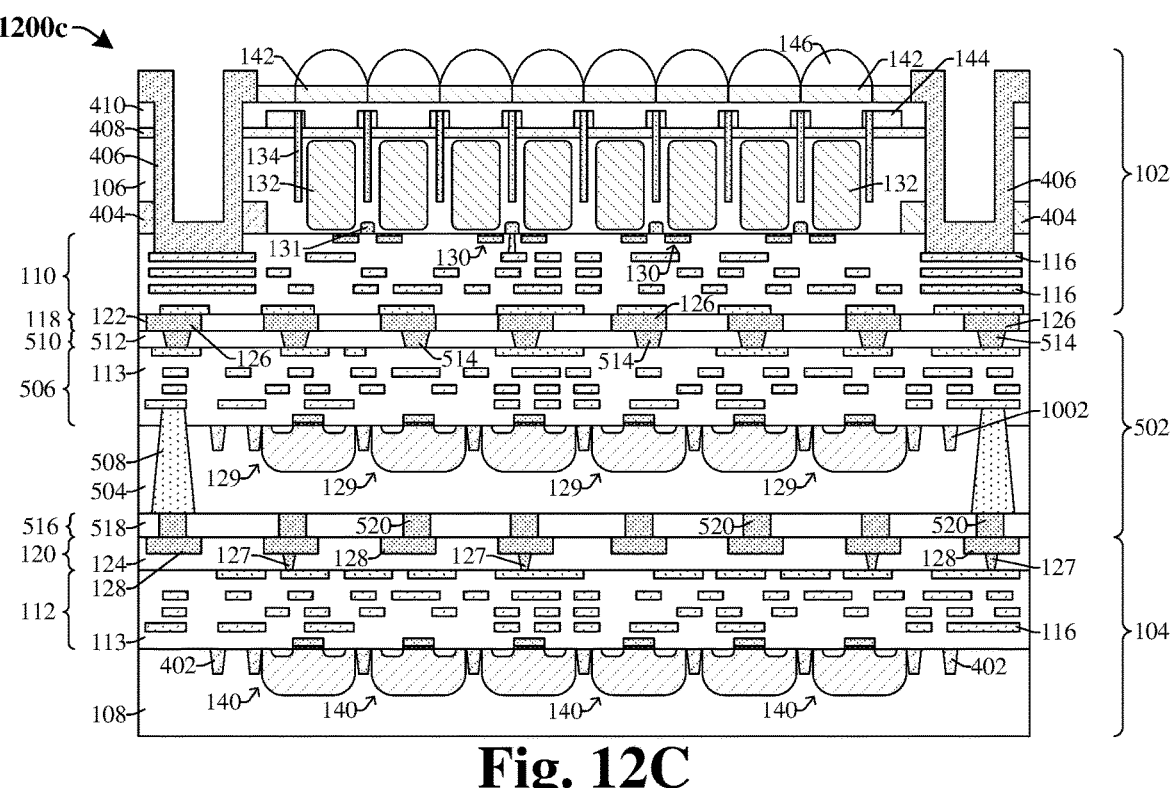

FIG. 12C illustrates a cross-sectional view 1200c of some embodiments of a stacked CMOS image sensor according to some other embodiments of the stacked CMOS image sensor of FIG. 12A, where the imaging bond structure 118 comprises the plurality of imaging bond pads 126 and the first pixel device bond structure 510 comprises the plurality of first pixel device bond contacts 514.

Figure 12D:
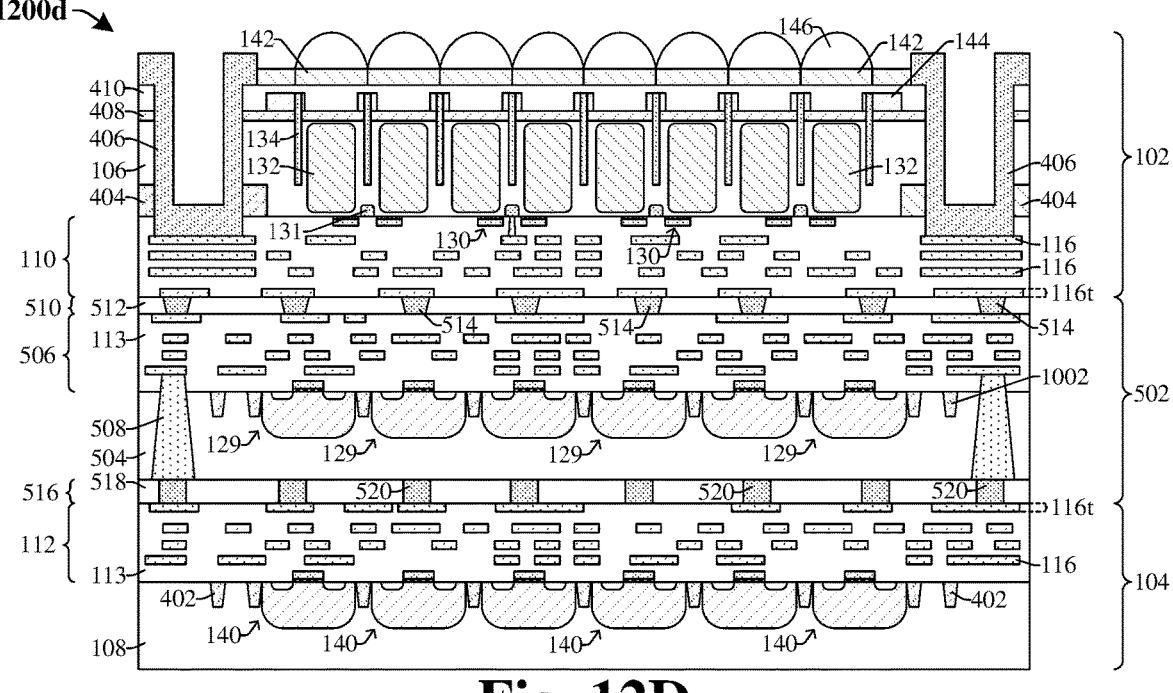

FIG. 12D illustrates a cross-sectional view 1200d of some embodiments of a stacked CMOS image sensor according to some other embodiments of the stacked CMOS image sensor of FIG. 12C, where the imaging bond structure (118 of FIG. 12C) and the logic bond structure (120 of FIG. 12C) are omitted such that the first pixel device bond structure 510 directly contacts the imaging interconnect structure 110 at a first bonding interface and the second pixel device bond structure 516 directly contacts the logic interconnect structure 112 at a second bonding interface.

Figure 12E:
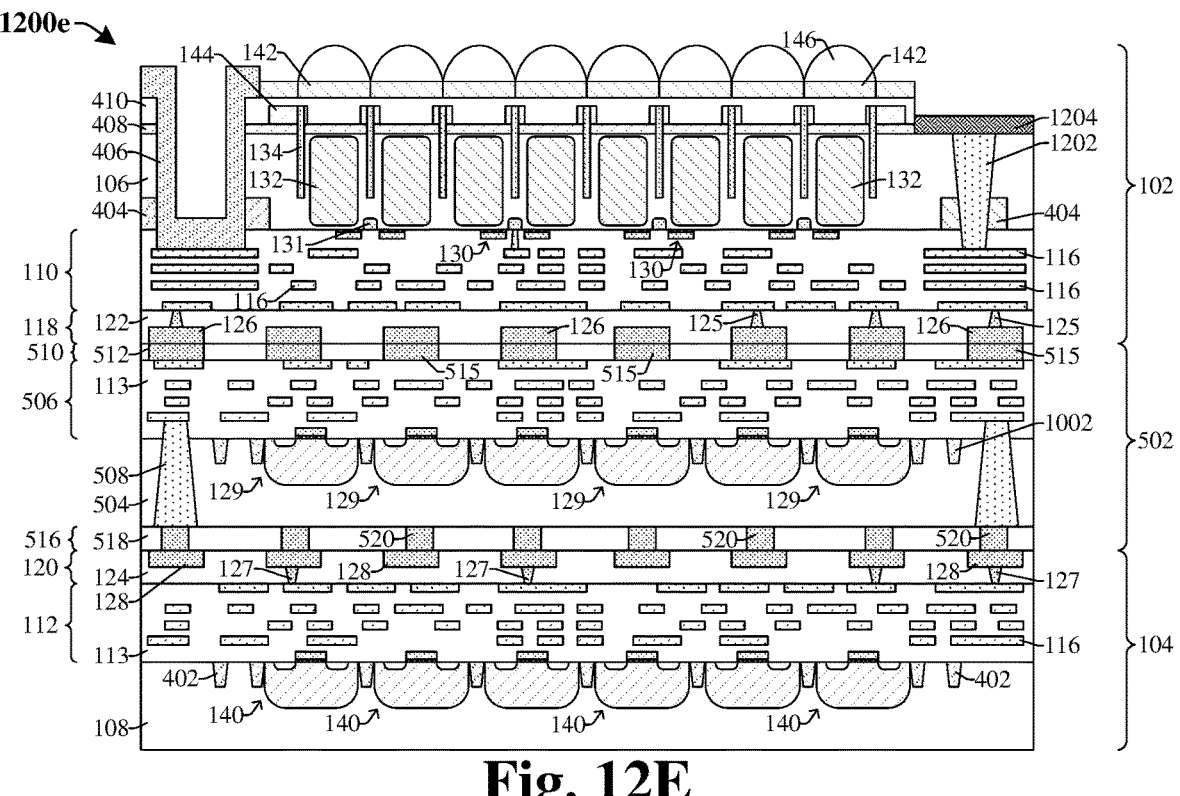

FIG. 12E illustrates a cross-sectional view 1200e of some embodiments of a stacked CMOS image sensor according to some other embodiments of the stacked CMOS image sensor of FIG. 12A, where an upper TSV 1202 extends through the imaging substrate 106 in the peripheral region. In addition, an upper bond pad 1204 directly overlies the upper TSV 1202 and is electrically coupled to the imaging interconnect structure 110.

Figure 13A:
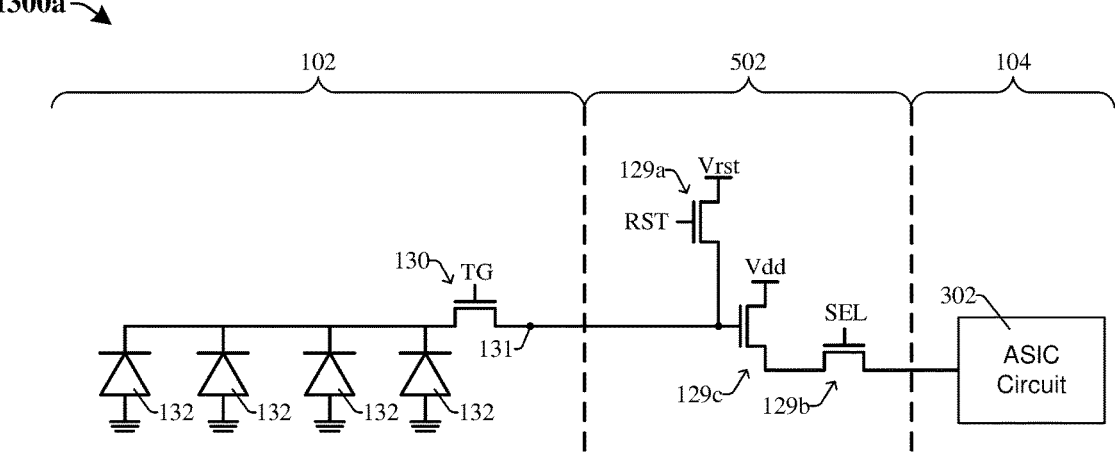
FIG. 13A illustrates a circuit diagram of some embodiments of a stacked CMOS image sensor corresponding to some embodiments of the stacked CMOS image sensor of FIGS. 5A, 6A, 7A, 8A, 10A, and/or 12A-12E.

FIG. 13A illustrates a circuit diagram 1300a of some embodiments of a stacked CMOS image sensor. In various embodiments, the circuit diagram 1300a may correspond to some embodiments of the stacked CMOS image sensor of FIGS. 5A, 6A, 7A, 8A, 10A, and/or 12A-12E.

The stacked CMOS image sensor comprises an imaging chip 102 electrically coupled to a pixel device chip 502 and a logic chip 104 coupled to the pixel device chip 502. In some embodiments, the imaging chip 102 comprises a plurality of photodetectors 132, at least one transfer transistor 130, and a floating diffusion node 131. In various embodiments, the pixel device chip 502 comprises a first pixel device 129a, a second pixel device 129b, and a third pixel device 129c. In further embodiments, the logic chip 104 comprises an ASIC circuit 302. In some embodiments, the plurality of photodetectors 132 are configured to accumulate charge in response to incident radiation and the at least one transfer transistor 130 is configured to provide the accumulated charge at the floating diffusion node 131. The first, second, and third pixel devices 129a-c are configured to conduct readout of the photodetectors 132 such that the charge accumulated by the photodetectors 132 may be readout as a corresponding electrical signal. The electrical signal may be provided to the ASIC circuit 302 for downstream signal processing. In various embodiments, the first, second, and third pixel devices 129a-c and the ASIC circuit 302 may be configured as illustrated and/or described in FIG. 3.

Figure 13B:
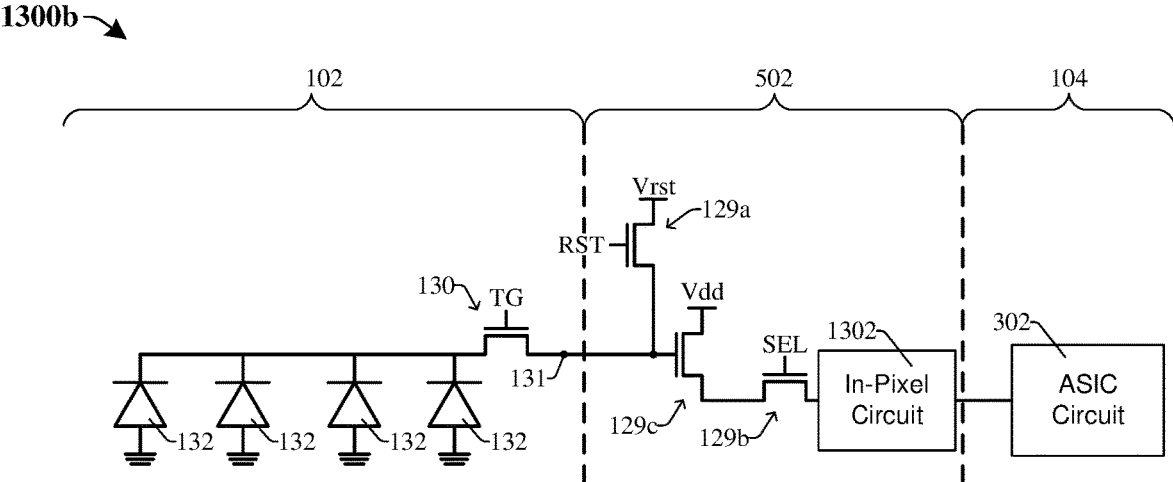
FIG. 13B illustrates a circuit diagram of some embodiments of a stacked CMOS image sensor corresponding to some embodiments of the stacked CMOS image sensor of FIG. 11A.

FIG. 13B illustrates a circuit diagram 1300b of some embodiments of a stacked CMOS image sensor corresponding to some other embodiments of the circuit diagram 1300a of FIG. 13A, where an in-pixel circuit 1302 is disposed on the pixel device chip 502 and is electrically coupled between the second pixel device 129b and the ASIC circuit 302. In some embodiments, the in-pixel circuit 1302 may comprise one or more additional transistors (e.g., logic transistors) and is configured to perform additional processing on the electrical signal from the second pixel device 129b before passing the electrical signal to the ASIC circuit 302. In various embodiments, the circuit diagram 1300b may correspond to some embodiments of the stacked CMOS image sensor of FIG. 11A.

FIGS. 14-25 illustrate various cross-sectional views 1400-2500 of some embodiments of a method of forming a stacked CMOS image sensor comprising an imaging chip having an imaging bond structure stacked on a logic chip having a logic bond structure. Although the cross-sectional views 1400-2500 shown in FIGS. 14-25 are described with reference to the method, it will be appreciated that the structures shown in FIGS. 14-25 are not limited to the method but rather may stand alone separate of the method. Furthermore, although FIGS. 14-25 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 14:
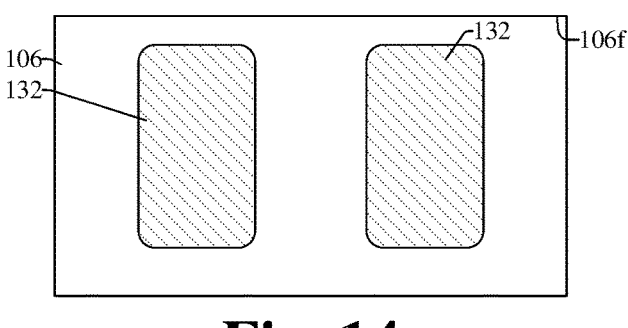

As shown in cross-sectional view 1400 of FIG. 14, a plurality of photodetectors 132 is formed within an imaging substrate 106. The imaging substrate 106 may, for example, be or comprise silicon, monocrystalline silicon, epitaxial silicon, germanium, silicon germanium, another semiconductor material, or the like and may have a first doping type (e.g., p-type). In some embodiments, a process for forming the photodetectors 132 may include: selectively forming a masking layer (not shown) over a front side 106*f* of the imaging substrate 106; performing a selective ion implantation process on the imaging substrate 106 with the masking layer in place, thereby implanting one or more dopants within the imaging substrate 106; and performing a remove process to remove the masking layer. In various embodiments, the photodetectors 132 comprise a second doping type (e.g., n-type) opposite the first doping type (e.g., p-type).

Figure 15:
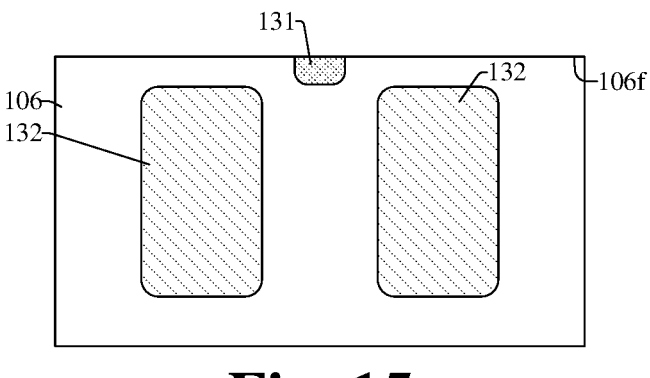

As shown in cross-sectional view 1500 of FIG. 15, a floating diffusion node 131 is formed within the imaging substrate 106. The floating diffusion node 131 may comprise the second doping type (e.g., n-type) and may have a higher doping concentration than the photodetectors 132. The floating diffusion node 131 may be formed by a selective ion implantation process.

Figure 16:
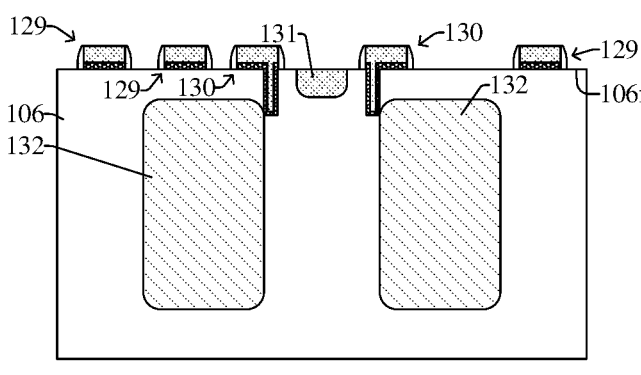

As shown in cross-sectional view 1600 of FIG. 16, a plurality of transfer transistors 130 and a plurality of pixel devices 129 are formed on the front side 106*f* of the imaging substrate 106. In some embodiments, a process for forming the plurality of pixel devices 129 includes: depositing (e.g., by physical vapor deposition (PVD), chemical vapor deposition (CVD), atomic layer deposition (ALD), etc.) a gate dielectric over the imaging substrate 106; depositing (e.g., by PVD, CVD, sputtering, electroplating, etc.) a gate electrode on the gate dielectric; performing a pattering process on the gate electrode and the gate dielectric; and performing a selective ion implantation process to form a plurality of source/drain regions in the imaging substrate 106 (not shown). In various embodiments, a process for forming the plurality of transfer transistors 130 includes: selectively etching the imaging substrate 106 to form trenches extending into the front side 106*f* of the imaging substrate 106; depositing (e.g., by PVD, CVD, ALD, etc.) a transfer gate dielectric over the imaging substrate 106 and lining the trenches; depositing (e.g., by PVD, CVD, sputtering, electroplating, etc.) a transfer gate electrode over the transfer gate dielectric and in the trenches; and performing a patterning process on the transfer gate electrode and the transfer gate dielectric.

As shown in cross-sectional view 1700 of FIG. 17, an imaging interconnect structure 110 is formed on the front side 106*f* of the imaging substrate 106. The imaging interconnect structure 110 comprises an interconnect dielectric structure 113, a plurality of conductive vias 114, and a plurality of conductive wires 116. The interconnect dielectric structure 113 may be formed by one or more deposition processes such as a PVD process, a CVD process, an ALD process, another suitable growth or deposition process, or any combination of the foregoing. In further embodiments, the plurality of conductive vias 114 and the plurality of conductive wires 116 may be formed by one or more deposition process(es), one or more patterning process(es), one or more planarization process(es), some other suitable fabrication process(es), or any combination of the foregoing. For example, the plurality of conductive vias 114 and the plurality of conductive wires 116 may be formed by a single damascene process, a dual damascene process, or the like.

As shown in cross-sectional view 1800 of FIG. 18, an imaging bond structure 118 is formed on the imaging interconnect structure 110, thereby defining an imaging chip 102. In some embodiments, the imaging bond structure 118 comprises an imaging bond dielectric 122, a plurality of imaging bond contacts 125, and a plurality of imaging bond pads 126. In various embodiments, the imaging bond structure 118 may be formed by: depositing (e.g., by PVD, CVD, ALD, etc.) one or more dielectric layers (e.g., comprising silicon dioxide, silicon nitride, silicon carbide, silicon oxynitride, etc.) on the imaging interconnect structure 110; etching the one or more dielectric layers to form one or more bond contact holes and/or one or more bond pad trenches in the one or more dielectric layers; filing (e.g., by PVD, CVD, ALD, electroplating, electro-less plating, etc.) the one or more bond contact holes and/or bond pad trenches with a conductive material (e.g., copper, aluminum, tungsten, etc.); and performing a planarization process (e.g., a chemical mechanical planarization (CMP) process) on the conductive material. In some embodiments, the one or more bond contact holes and/or bond pad trenches are filled with a conductive liner material subsequently followed by a conductive body material, such that the imaging bond contacts 125 and the imaging bond pads 126 are configured as illustrated and/or described in FIG. 9B. In various embodiments, after the planarization process, a top surface of the imaging bond dielectric 122 and top surfaces of the imaging bond pads 126 are co-planar and substantially flat, thereby mitigating non-bond areas in a subsequent bonding process and facilitating good bond adhesion.

Further, although the imaging bond structure 118 of FIG. 18 is formed comprising the imaging bond contacts 125 and the imaging bond pads 126, it will be appreciated that the imaging bond structure 118 may, for example, be formed with the conductive bond layers illustrated in FIGS. 1A-1C and/or FIG. 4. For example, the imaging bond structure 118 may be formed without the imaging bond contacts 125 as illustrated in FIGS. 1A and 1B.

Figure 19:
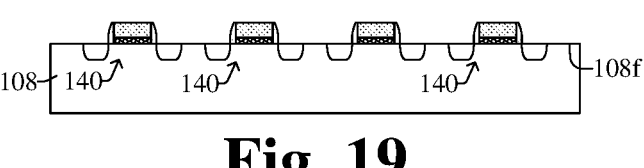

As shown in cross-sectional view 1900 of FIG. 19, a logic substrate 108 is provided and a plurality of logic devices 140 is formed on a front side 108*f* of the logic substrate 108. In some embodiments, a process for forming the plurality of logic devices 140 includes: depositing (e.g., by PVD, CVD, ALD, etc.) a logic gate dielectric over the logic substrate 108; depositing (e.g., by PVD, CVD, sputtering, electroplating, etc.) a logic gate electrode on the logic gate dielectric; performing a patterning process on the logic gate dielectric and the logic gate electrode; and performing a selective ion implantation process to form source/drain regions on opposing sides of each logic gate electrode.

Figure 20:
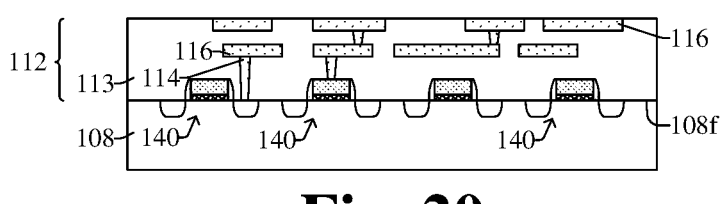

As shown in cross-sectional view 2000 of FIG. 20, a logic interconnect structure 112 is formed on the front side 108*f* of the logic substrate 108. The logic interconnect structure 112 comprises an interconnect dielectric structure 113, a plurality of conductive vias 114, and a plurality of conductive wires 116. The interconnect dielectric structure 113, the plurality of conductive vias 114, and the plurality of conductive wires 116 may be formed as illustrated and/or described in FIG. 17.

Figure 21:
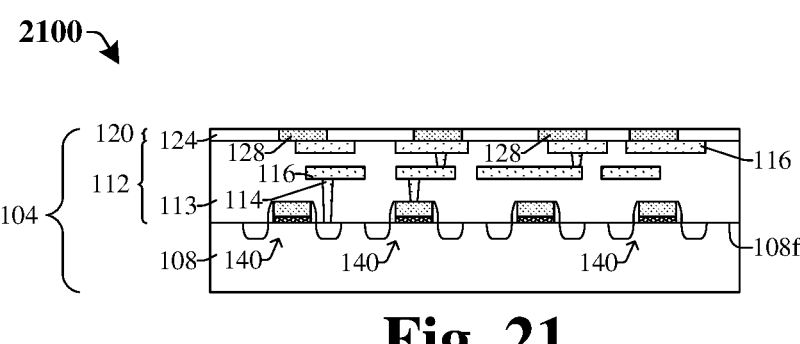

As shown in cross-sectional view 2100 of FIG. 21, a logic bond structure 120 is formed over the logic interconnect structure 112, thereby defining a logic chip 104. In some embodiments, the logic bond structure 120 comprises a logic bond dielectric 124 and a plurality of logic bond pads 128. In various embodiments, the logic bond structure 120 may be formed by: depositing (e.g., by PVD, CVD, ALD, etc.) one or more dielectric layers (e.g., comprising silicon dioxide, silicon nitride, silicon carbide, silicon oxynitride, etc.) on the logic interconnect structure 112; etching the one or more dielectric layers to form one or more bond pad trenches in the one or more dielectric layers; filling (e.g., by PVD, CVD, ALD, electroplating, electro-less plating, etc.) the one or more bond pad trenches with a conductive material (e.g., copper, aluminum, tungsten, etc.); and performing a planarization process (e.g., a CMP process) on the conductive material. In some embodiments, the one or more bond pad trenches are filled with a conductive liner material subsequently followed by a conductive body material, such that the logic bond pads 128 are configured as illustrated and/or described in FIG. 9H. In various embodiments, after the planarization process, a top surface of the logic bond dielectric 124 and top surfaces of the logic bond pads 128 are co-planar and substantially flat, thereby mitigating non-bond areas in a subsequent bonding process and facilitating good bond adhesion.

Further, although the logic bond structure 120 of FIG. 21 is formed comprising the plurality of logic bond pads 128, it will be appreciated that the logic bond structure 120 may, for example, be formed with the conductive bond layers illustrated in FIGS. 1A-1C and/or FIG. 4. For example, the logic bond structure 120 may be formed with the logic bond contacts 127 as illustrated in FIG. 1A.

Figure 22:
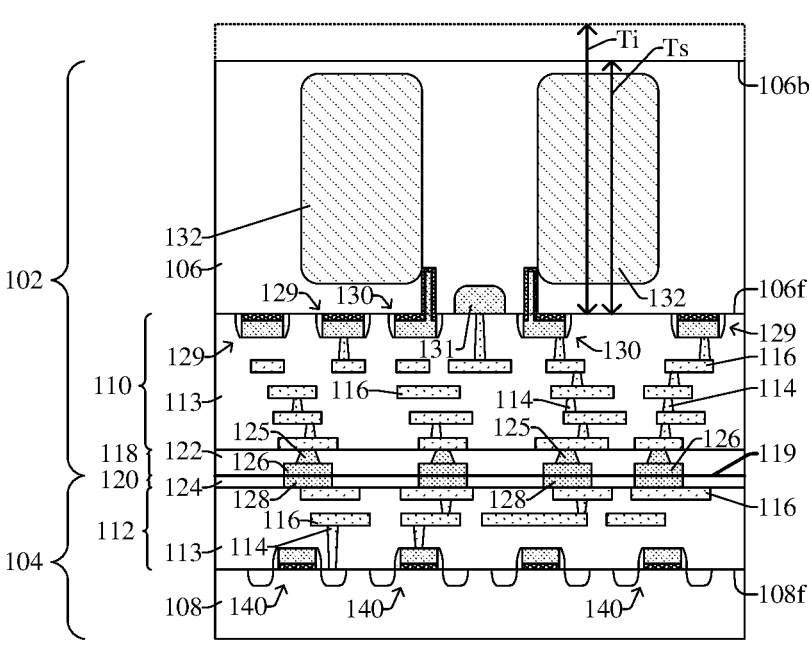

As shown in cross-sectional view 2200 of FIG. 22, the imaging chip 102 is flipped and bonded to the logic chip 104 such that the imaging bond structure 118 and the logic bond structure 120 meet at a bonding interface 119. In some embodiments, the logic chip 104 may be bonded to the imaging chip 102 by way of a eutectic bonding process, a fusion bonding process, a dielectric-to-dielectric bonding process, a metal-to-metal bonding process, some other suitable bonding process, or any combination of the foregoing. In various embodiments, the logic bond pads 128 are brought in contact with the imaging bond pads 126 and the imaging bond dielectric 122 is brought in contact with the logic bond dielectric 124. Temperatures of the imaging and logic bond structures 118, 120 may be increased to form the bonding interface 119.

At least one of the imaging bond structure 118 and/or the logic bond structure 120 has one or less conductive bonding layer. For example, the logic bond structure 120 may comprise a single conductive bond layer (e.g., the logic bond pads 128). As a result, a number of conductive structures between devices disposed between the logic substrate 108 and the imaging substrate 106 is reduced, thereby reducing a resistivity and RC delay between the stacked chips. Further, having less conductive routing structures facilitates reducing sizes and/or spacing between conductive features in the stacked chips such that an overall performance of the stacked CMOS image sensor may be increased while scaling device features.

Further, as shown in cross-sectional view 2200 of FIG. 22, after bonding the imaging chip 102 to the logic chip 104 a thinning process may be performed on the imaging substrate 106 to reduce an initial thickness Ti of the imaging substrate 106 to a thickness Ts. In some embodiments, the thinning process includes performing a mechanical grinding process, a CMP process, an etch process, some other thinning process, or any combination of the foregoing.

As shown in cross-sectional view 2300 of FIG. 23, a back-side isolation structure 134 is formed extending into a back side 106*b* of the imaging substrate 106. The back-side isolation structure 134 comprises a trench fill layer 138 and a liner layer 136 disposed between the imaging substrate 106 and the trench fill layer 138. In some embodiments, a process for forming the back-side isolation structure 134 comprises: selectively etching the back side 106*b* of the imaging substrate 106 to form a trench disposed between adjacent photodetectors 132; depositing (e.g., by CVD, PVD, ALD, etc.) a liner material within the trench and over the imaging substrate 106; depositing (e.g., by CVD, PVD, ALD, etc.) a trench fill material over the liner material and filling the trench; and performing a planarization process (e.g., a CMP process, an etching process, etc.) on the liner material and the trench fill material.

As shown in cross-sectional view 2400 of FIG. 24, a grid structure 144 and a plurality of light filters 142 are formed on the back side 106*b* of the imaging substrate 106. The grid structure 144 directly overlies the back-side isolation structure 134 and may be formed by depositing (e.g., by CVD, PVD, ALD, etc.) a grid material over the imaging substrate 106 and selectively patterning the grid material to form the grid structure 144. The light filters 142 may be formed by depositing and patterning respective color filter layers corresponding to the plurality of light filters 142.

Figure 25:
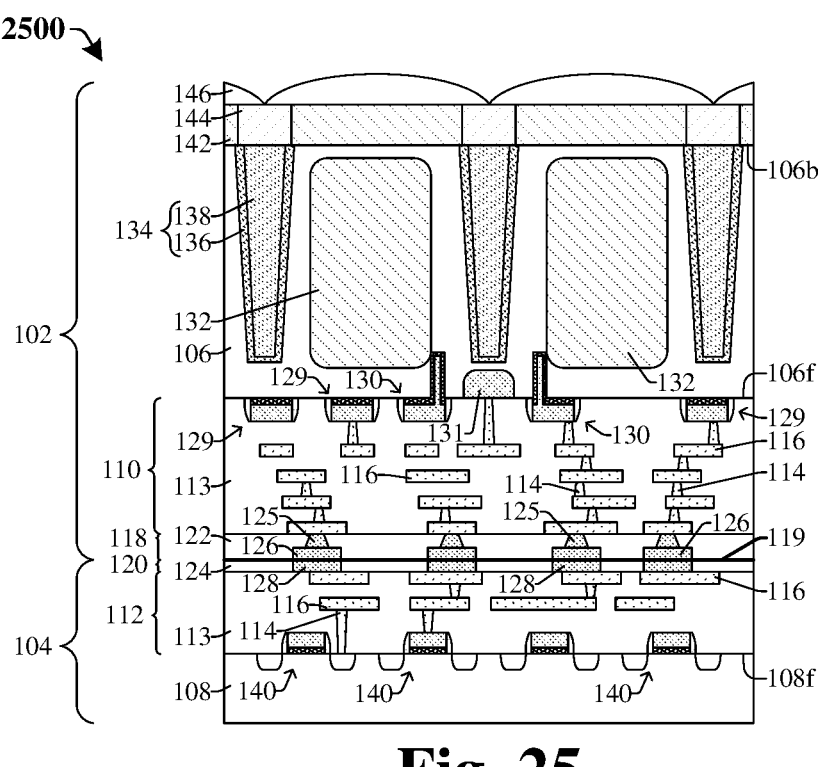

As shown in cross-sectional view 2500 of FIG. 25, a plurality of micro-lenses 146 is formed over the grid structure 144 and the light filters 142. The micro-lenses 146 may be formed by depositing a micro-lens material over the light filters 142 and patterning the micro-lens material to form the plurality of micro-lenses 146.

FIG. 26 illustrates some embodiments of a method 2600 for forming a stacked CMOS image sensor comprising an imaging chip having an imaging bond structure stacked on a logic chip having a logic bond structure. Although the method 2600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2602, a plurality of photodetectors is formed in an imaging substrate. FIG. 14 illustrates a cross-sectional view 1400 corresponding to some embodiments of act 2602.

At act 2604, a plurality of transfer transistors and a plurality of pixel devices are formed on a front side of the imaging substrate. FIG. 16 illustrates a cross-sectional view 1600 corresponding to some embodiments of act 2604.

At act 2606, an imaging interconnect structure is formed on the imaging substrate. FIG. 17 illustrates a cross-sectional view 1700 corresponding to some embodiments of act 2606.

At act 2608, an imaging bond structure is formed on the imaging interconnect structure, thereby defining an imaging chip. FIG. 18 illustrates a cross-sectional view 1800 corresponding to some embodiments of act 2608.

At act 2610, a plurality of logic devices and a logic interconnect structure are formed on a front side of a logic substrate. FIGS. 19 and 20 illustrate cross-sectional views 1900 and 2000 corresponding to some embodiments of act 2610.

At act 2612, a logic bond structure is formed on the logic interconnect structure, thereby defining a logic chip. FIG. 21 illustrates a cross-sectional view 2100 corresponding to some embodiments of act 2612.

At act 2614, the imaging chip is bonded to the logic chip such that the imaging bond structure meets the logic bond structure at a bonding interface. FIG. 22 illustrates a cross-sectional view 2200 corresponding to some embodiments of act 2614.

At act 2616, a back-side isolation structure is formed in a back side of the imaging substrate. FIG. 23 illustrates a cross-sectional view 2300 corresponding to some embodiments of act 2616.

At act 2618, a grid structure, a plurality of light filters, and a plurality of micro-lenses are formed on the back side of the imaging substrate. FIGS. 24 and 25 illustrate cross-sectional views 2400 and 2500 corresponding to some embodiments of act 2618.

FIGS. 27-41 illustrate various cross-sectional views 2700-4100 of some embodiments of a method of forming a stacked CMOS image sensor comprising an imaging chip, a pixel device chip, and a logic chip vertically stacked with one another. Although the cross-sectional views 2700-4100 shown in FIGS. 27-41 are described with reference to the method, it will be appreciated that the structures shown in FIGS. 27-41 are not limited to the method but rather may stand alone separate of the method. Furthermore, although FIGS. 27-41 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 27:
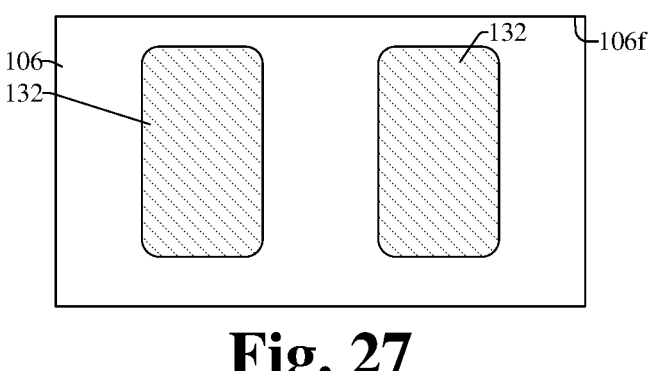

As shown in cross-sectional view 2700 of FIG. 27, a plurality of photodetectors 132 is formed within an imaging substrate 106. The imaging substrate 106 may have a first doping type (e.g., p-type). In some embodiments, a process for forming the photodetectors 132 may include: selectively forming a masking layer (not shown) over a front side 106f of the imaging substrate 106; performing a selective ion implantation process on the imaging substrate 106 with the masking layer in place, thereby implanting one or more dopants within the imaging substrate 106; and performing a remove process to remove the masking layer. In various embodiments, the photodetectors 132 comprise a second doping type (e.g., n-type) opposite the first doping type (e.g., p-type).

Figure 28:
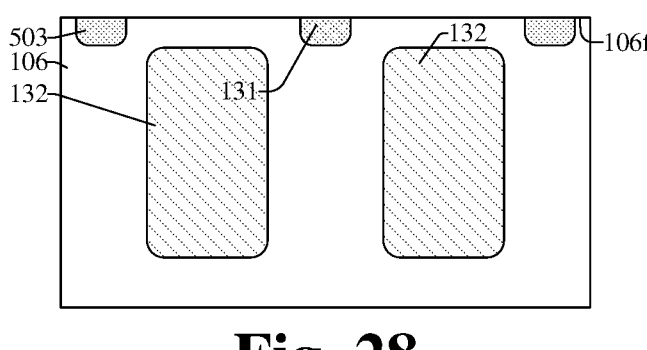

As shown in cross-sectional view 2800 of FIG. 28, a floating diffusion node 131 and a plurality of well regions 503 are formed within the imaging substrate 106. The floating diffusion node 131 may comprise the second doping type (e.g., n-type) and may have a higher doping concentration than the photodetectors 132. The well regions 503 may comprise the first doping type (e.g., p-type) and may have a higher doping concentration than the photodetectors 132. The floating diffusion nodes 131 and the plurality of well regions 503 may each be formed by an individual ion implantation process.

Figure 29:
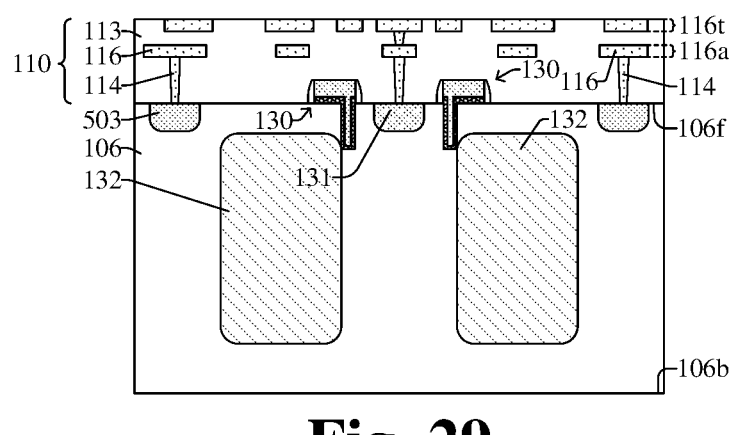

As shown in cross-sectional view 2900 of FIG. 29, a plurality of transfer transistors 130 and an imaging interconnect structure 110 are formed on a front side 106f of the imaging substrate 106. In various embodiments, a process for forming the plurality of transfer transistors 130 includes: selectively etching the imaging substrate 106 to form trenches extending into the front side 106f of the imaging substrate 106; depositing (e.g., by PVD, CVD, ALD, etc.) a transfer gate dielectric over the imaging substrate 106 and lining the trenches; depositing (e.g., by PVD, CVD, sputtering, electroplating, etc.) a transfer gate electrode over the transfer gate dielectric and in the trenches; and performing a patterning process on the transfer gate electrode and the transfer gate dielectric. The imaging interconnect structure 110 comprises an interconnect dielectric structure 113, a plurality of conductive vias 114, and a plurality of conductive wires 116. The interconnect dielectric structure 113 may be formed by one or more deposition processes such as a PVD process, a CVD process, an ALD process, another suitable growth or deposition process, or any combination of the foregoing. In further embodiments, the plurality of conductive vias 114 and the plurality of conductive wires 116 may be formed by one or more deposition process(es), one or more patterning process(es), one or more planarization process(es), some other suitable fabrication process(es), or any combination of the foregoing. For example, the plurality of conductive vias 114 and the plurality of conductive wires 116 may be formed by a single damascene process, a dual damascene process, or the like.

Figure 30:
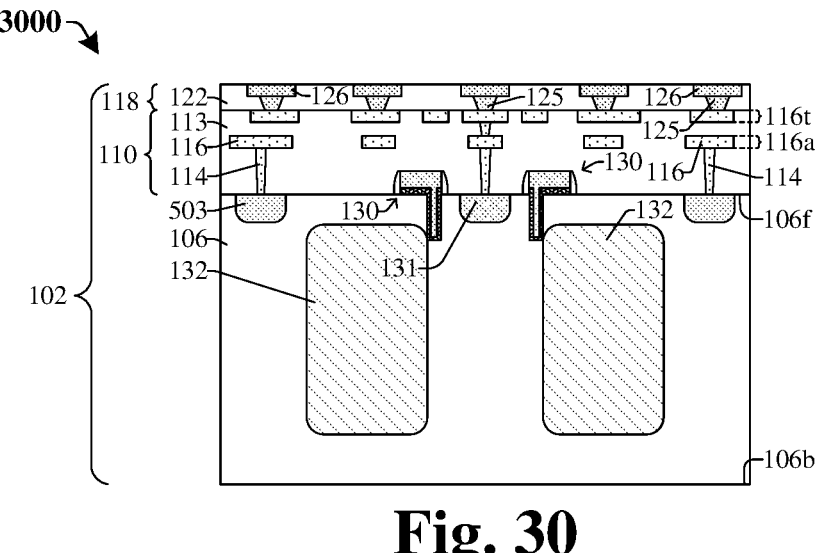

As shown in cross-sectional view 3000 of FIG. 30, an imaging bond structure 118 is formed on the imaging interconnect structure 110, thereby defining an imaging chip 102. In some embodiments, the imaging bond structure 118 comprises an imaging bond dielectric 122, a plurality of imaging bond contacts 125, and a plurality of imaging bond pads 126. In various embodiments, the imaging bond structure 118 may be formed as illustrated and/or described in FIG. 18. Further, although the imaging bond structure 118 of FIG. 30 is formed comprising the imaging bond contacts 125 and the imaging bond pads 126, it will be appreciated that the imaging bond structure 118 may, for example, be formed with the conductive bond layers illustrated in FIGS. 5A-5D, 6A, 7A-7D, 8A-8D, 9A-9F, 10A, 11A, and/or 12A-12E. For example, the imaging bond structure 118 may be formed without the imaging bond pads 126 as illustrated in FIG. 6A.

Figure 31:
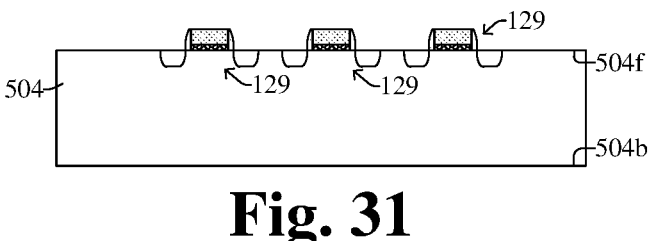

As shown in cross-sectional view 3100 of FIG. 31, a pixel device substrate 504 is provided and a plurality of pixel devices 129 is formed on a front side 504f of the pixel device substrate 504. In some embodiments, a process for forming the plurality of pixel devices 129 includes: depositing (e.g., by PVD, CVD, ALD, etc.) a gate dielectric over the pixel device substrate 504; depositing (e.g., by PVD, CVD, sputtering, electroplating, etc.) a gate electrode on the gate dielectric; performing a pattering process on the gate electrode and the gate dielectric; and performing a selective ion implantation process to form a plurality of source/drain regions in the pixel device substrate 504.

Figure 32:
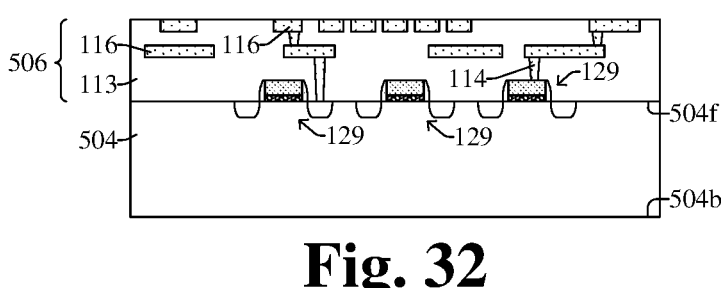

As shown in cross-sectional view 3200 of FIG. 32, a pixel device interconnect structure 506 is formed on the front side 504f of the pixel device substrate 504. The pixel device interconnect structure 506 comprises an interconnect dielectric structure 113, a plurality of conductive vias 114, and a plurality of conductive wires 116. The interconnect dielectric structure 113, the plurality of conductive vias 114, and the plurality of conductive wires 116 may be formed as illustrated and/or described in FIG. 29.

Figure 33:
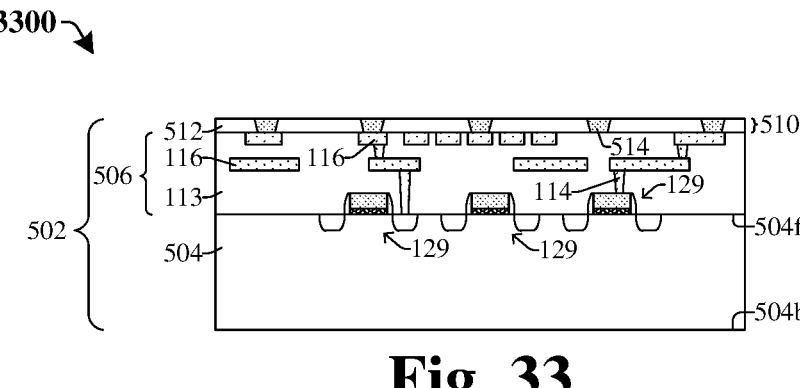

As shown in cross-sectional view 3300 of FIG. 33, a first pixel device bond structure 510 is formed over the pixel device interconnect structure 506, thereby defining a pixel device chip 502. In some embodiments, the first pixel device bond structure 510 comprises a first pixel device bond dielectric 512 and a plurality of first pixel device bond contacts 514. In various embodiments, the first pixel device bond structure 510 may be formed by: depositing (e.g., by PVD, CVD, ALD, etc.) one or more dielectric layers (e.g., comprising silicon dioxide, silicon nitride, silicon carbide, silicon oxynitride, etc.) on the pixel device interconnect structure 506; etching the one or more dielectric layers to form one or more bond contact holes in the one or more dielectric layers; filling (e.g., by PVD, CVD, ALD, electroplating, electro-less plating, etc.) the one or more bon via holes with a conductive material (e.g., copper, aluminum, tungsten, etc.); and performing a planarization process (e.g., a CMP process) on the conductive material. In some embodiments, the one or more bond contact holes are filed with a conductive liner material subsequently followed by a conductive body material, such that the first pixel device bond contacts 514 respectively comprise a conductive liner and a conductive body. In various embodiments, after the planarization process, a top surface of the first pixel device bond dielectric 512 and top surfaces of the first pixel device bond contacts 514 are co-planar and substantially flat, thereby mitigating non-bond areas in a subsequent bonding process and facilitating good bond adhesion.

Further, although the first pixel device bond structure 510 of FIG. 33 is formed comprising the plurality of first pixel device bond contacts 514, it will be appreciated that the first pixel device bond structure 510 may, for example, be formed with the conductive bond layers illustrated in FIGS. 5A-5D, 6A, 7A-7D, 8A-8D, 9A-9F, 10A, 11A, and/or 12A-12E. For example, the first pixel device bond structure 510 may be formed with the plurality of first pixel device bond contacts 514 and the plurality of first pixel device bond pads 515 as illustrated in FIG. 6A.

Figure 34:
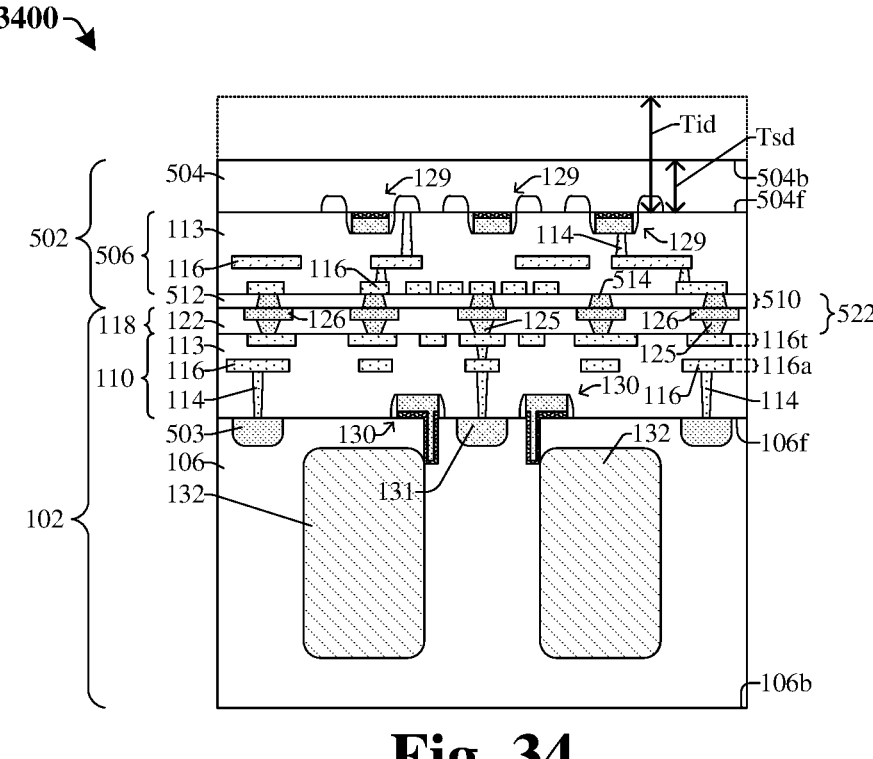

As shown in cross-sectional view 3400 of FIG. 34, a first bonding process is performed to bond the imaging chip 102 to the pixel device chip 502, thereby defining a first bonded structure 522 between the imaging chip 102 and the pixel device chip 502. Further, after the first bonding process, the imaging bond structure 118 meets the first pixel device bond structure 510 at a first bonding interface. In some embodiments, the first bonding process includes a eutectic bonding process, a fusion bonding process, a dielectric-to-dielectric bonding process, a metal-to-metal bonding process, some other suitable bonding process, or any combination of the foregoing. In various embodiments, the imaging bond pads 126 are brought in contact with the first pixel device bond contacts 514 and the imaging bond dielectric 122 is brought in contact with the first pixel device bond dielectric 512. Temperatures of the imaging bond structure 118 and the first pixel device bond structure 510 may be increased to form the first bonded structure 522.

At least one of the imaging bond structure 118 and/or the first pixel device bond structure 510 has one or less conductive bonding layer. For example, the first pixel device bond structure 510 may comprise a single conductive bond layer (e.g., the first pixel device bond contacts 514). As a result, a number of conductive structures between devices disposed between the pixel device substrate 504 and the imaging substrate 106 is reduced, thereby reducing a resistivity and RC delay between the stacked chips. Further, having less conductive routing structures facilitates reducing sizes and/or spacing between conductive features in the stacked chips such that an overall performance of the stacked CMOS image sensor may be increased while scaling device features.

Further, as shown in cross-sectional view 3400 of FIG. 34, after performing the first bonding process a thinning process may be performed on the pixel device substrate 504 to reduce an initial thickness Tis of the pixel device substrate 504 to a thickness Tsd. In some embodiments, the thinning process includes performing a mechanical grinding process, a CMP process, an etch process, some other thinning process, or any combination of the foregoing.

Figure 35:
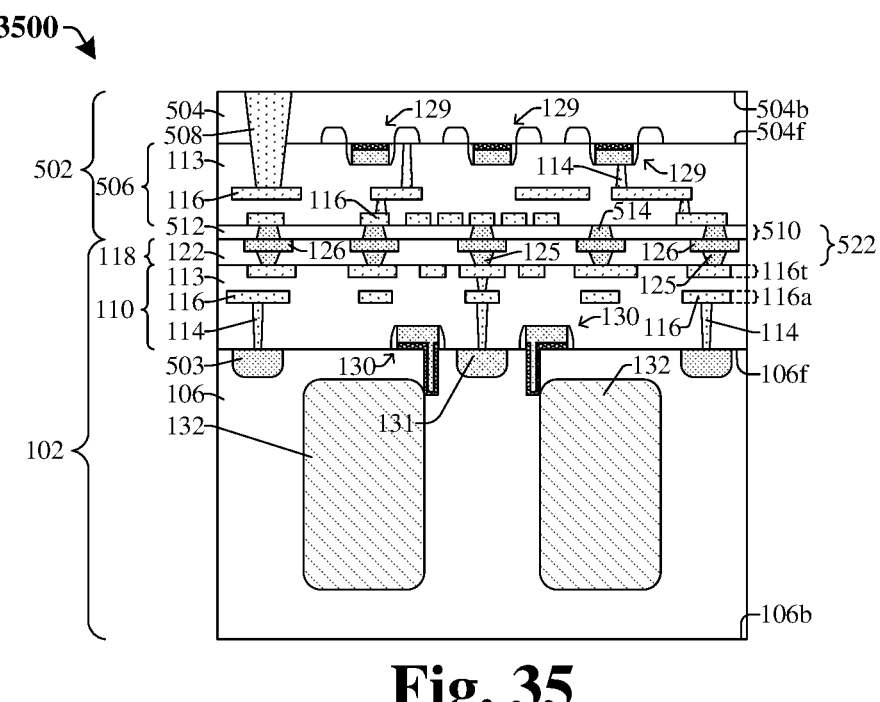

As shown in cross-sectional view 3500 of FIG. 35, a through substrate via (TSV) 508 is formed in the pixel device substrate 504. In some embodiments, a process for forming the TSV 508 includes: selectively patterning the pixel device substrate 504 to form a TSV opening extending from the pixel device substrate 504 to the pixel device interconnect structure 506; filling (e.g., by CVD, PVD, ALD, sputtering, electro plating, etc.) the TSV opening with a conductive material; and performing a planarization process (e.g., a CMP process, an etching process, etc.) on the conductive material.

Figure 36:
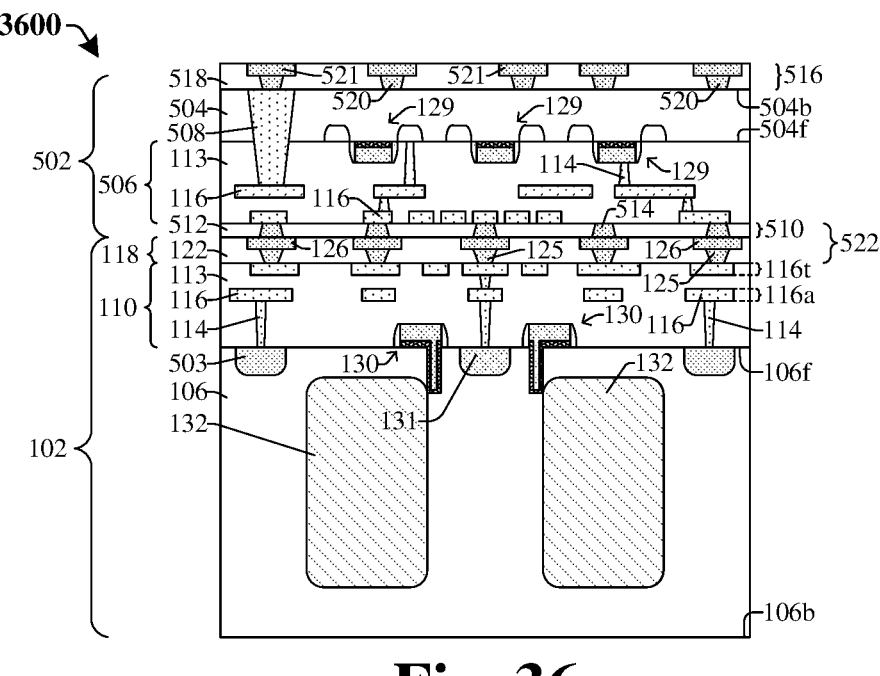

As shown in cross-sectional view 3600 of FIG. 36, a second pixel device bond structure 516 is formed on a back side 504b of the pixel device substrate 504. In some embodiments, the second pixel device bond structure 516 comprises a second pixel device bond dielectric 518, a plurality of second pixel device bond contacts 520, and a plurality of second pixel device bond pads 521. In various embodiments, the second pixel device bond structure 516 may be formed by: depositing (e.g., by PVD, CVD, ALD, etc.) one or more dielectric layers (e.g., comprising silicon dioxide, silicon nitride, silicon carbide, silicon oxynitride, etc.) on the back side 504b of the pixel device substrate 504; etching the one or more dielectric layers to form one or more bond contact holes and/or one or more bond pad trenches in the one or more dielectric layers; filing (e.g., by PVD, CVD, ALD, electroplating, electro-less plating, etc.) the one or more bond contact holes and/or bond pad trenches with a conductive material (e.g., copper, aluminum, tungsten, etc.); and performing a planarization process (e.g., a CMP process) on the conductive material. In some embodiments, the one or more bond contact holes and/or bond pad trenches are filled with a conductive liner material subsequently followed by a conductive body material, such that the second pixel device bond contacts and pads 520, 521 respectively comprise a conductive liner and a conductive body. In various embodiments, after the planarization process, a top surface of the second pixel device bond dielectric 518 and top surfaces of the second pixel device bond pads 521 are co-planar and substantially flat, thereby mitigating non-bond areas in a subsequent bonding process and facilitating good bond adhesion.

Further, although the second pixel device bond structure 516 of FIG. 36 is formed comprising the plurality of second pixel device bond contacts 520 and the plurality of second pixel device bond pads 521, it will be appreciated that the second pixel device bond structure 516 may, for example, be formed with the conductive bond layers illustrated in FIGS. 5A, 6A, 7A, 8A, 9G-9H, 10A, 11A, and/or 12A-12E. For example, the second pixel device bond structure 516 may be formed with just the second pixel device bond contacts 520, where the second pixel device bond pads 521 are omitted as illustrated in FIG. 7A.

As shown in cross-sectional view 3700 of FIG. 37, a plurality of logic devices 140 and a logic interconnect structure 112 are formed on a front side 108f of a logic substrate 108. In various embodiments, the plurality of logic devices 140 may be formed by a same or similar process(es) for forming the plurality of pixel devices 129 as illustrated and/or described in FIG. 31. The logic interconnect structure 112 comprises an interconnect dielectric structure 113, a plurality of conductive vias 114, and a plurality of conductive wires 116. The interconnect dielectric structure 113, the plurality of conductive vias 114, and the plurality of conductive wires 116 may be formed as illustrated and/or described in FIG. 29.

As shown in cross-sectional view 3800 of FIG. 38, a logic bond structure 120 is formed on the logic interconnect structure 112, thereby defining a logic chip 104. In some embodiments, the logic bond structure 120 comprises a logic bond dielectric 124 and a plurality of logic bond contacts 127. In various embodiments, the logic bond structure 120 may be formed by: depositing (e.g., by PVD, CVD, ALD, etc.) one or more dielectric layers (e.g., comprising silicon dioxide, silicon nitride, silicon carbide, silicon oxynitride, etc.) on the logic interconnect structure 112; etching the one or more dielectric layers to form one or more bond contact holes in the one or more dielectric layers; filling (e.g., by PVD, CVD, ALD, electroplating, electro-less plating, etc.) the one or more bond contact holes with a conductive material (e.g., copper, aluminum, tungsten, etc.); and performing a planarization process (e.g., a CMP process) on the conductive material.

Further, although the logic bond structure 120 of FIG. 38 is formed comprising the logic bond contacts 127, it will be appreciated that the logic bond structure 120 may, for example, be formed with the conductive bond layers illustrated in FIGS. 5A, 6A, 7A, 8A, 9G-9H, 10A, 11A, and/or 12A-12E. For example, the logic bond structure 120 may be formed with the plurality of logic bond pads 128 as illustrated in FIG. 5A.

Figure 39:
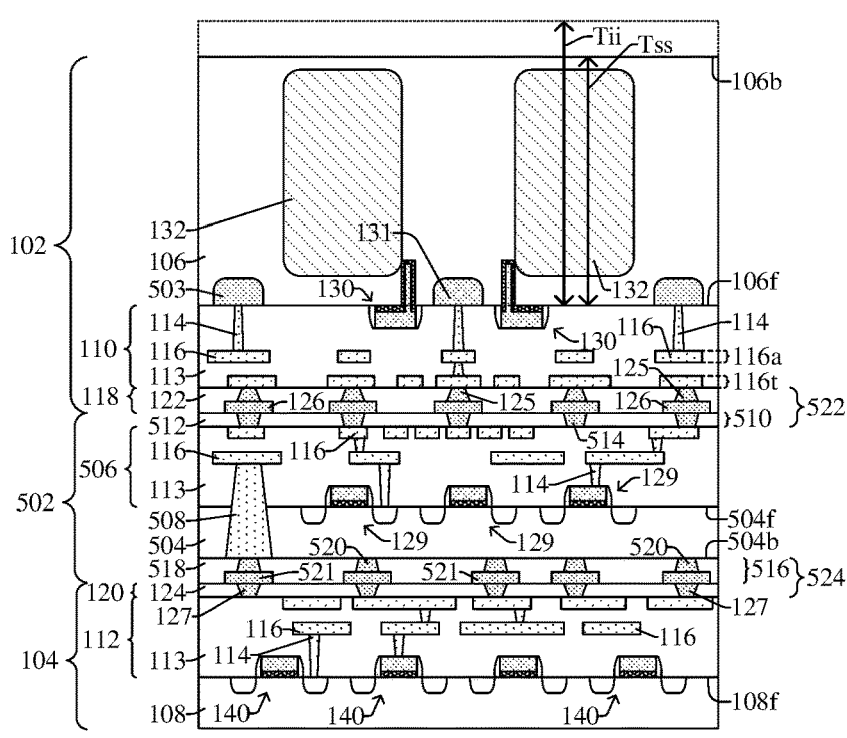

As shown in cross-sectional view 3900 of FIG. 39, a second bonding process is performed to bond the pixel device chip 502 to the logic chip 104, thereby defining a second bonded structure 524 between the pixel device chip 502 and the logic chip 104. After the second bonding process, the logic bond structure 120 meets the second pixel device bond structure 516 at a second bonding interface. In some embodiments, the second bonding process includes a eutectic bonding process, a fusion bonding process, a dielectric-to-dielectric bonding process, a metal-to-metal bonding process, some other suitable bonding process, or any combination of the foregoing. In various embodiments, the logic bond contacts 127 are brought in contact with the second pixel device bond pads 521 and the logic bond dielectric 124 is brought in contact with the second pixel device bond dielectric 518. Temperatures of the logic bond structure 120 and the second pixel device bond structure 516 may be increased to form the second bonded structure 524.

At least one of the logic bond structure 120 and/or the second pixel device bond structure 516 has one or less conductive bonding layer. For example, the logic bond contacts 127 may comprise a single conductive bond layer (e.g., the logic bond contacts 127). As a result, a number of conductive structures between devices disposed between the pixel device substrate 504 and the logic substrate 108 is reduced, thereby reducing a resistivity and RC delay between the stacked chips. Further, having less conductive routing structures facilitates reducing sizes and/or spacing between conductive features in the stacked chips such that an overall performance of the stacked CMOS image sensor may be increased while scaling device features.

Further, as shown in cross-sectional view 3900 of FIG. 39, after performing the second bonding process a thinning process may be performed on the imaging substrate 106 to reduce an initial thickness Tii of the imaging substrate 106 to a thickness Tss. In some embodiments, the thinning process includes performing a mechanical grinding process, a CMP process, an etch process, some other thinning process, or any combination of the foregoing.

Figure 40:
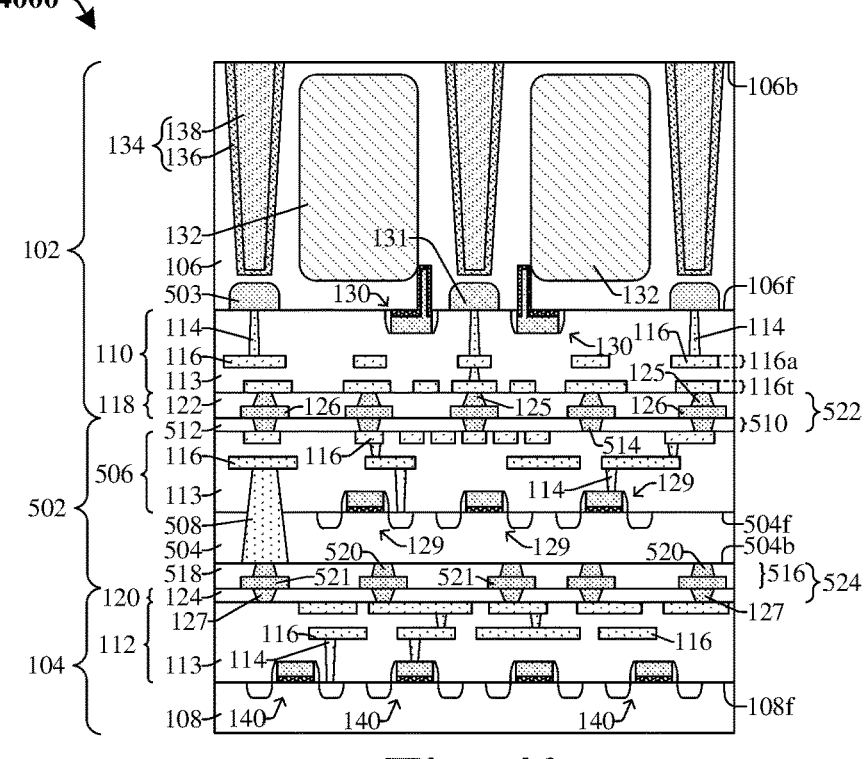

As shown in cross-sectional view 4000 of FIG. 40, a back-side isolation structure 134 is formed extending into a back side 106b of the imaging substrate 106. The back-side isolation structure 134 comprises a trench fill layer 138 and a liner layer 136. The back-side isolation structure 134 may be formed as illustrated and/or described in FIG. 23.

Figure 41:
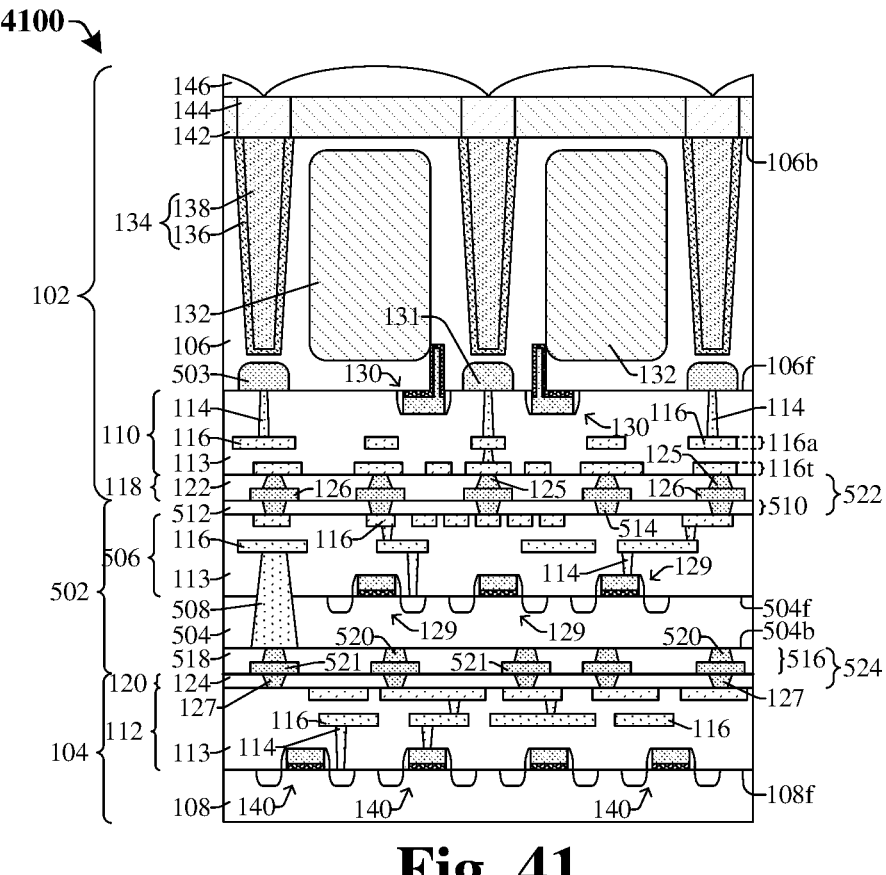

As shown in cross-sectional view 4100 of FIG. 41, a grid structure 144, a plurality of light filters 142, and a plurality of micro-lenses 146 are formed on the back side 106b of the imaging substrate 106. The grid structure 144 and the plurality of light filters 142 may be formed as illustrated and/or described in FIG. 24. The plurality of micro-lenses 146 may be formed as illustrated and/or described in FIG. 25.

FIG. 42 illustrates some embodiments of a method 4200 for forming a stacked CMOS image sensor comprising an imaging chip, a pixel device chip, and a logic chip vertically stacked with one another. Although the method 4200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 4202, a plurality of photodetectors is formed in an imaging substrate. FIG. 27 illustrates a cross-sectional view 2700 corresponding to some embodiments of act 4202.

At act 4204, a plurality of transfer transistors is formed on a front side of the imaging substrate. FIG. 29 illustrates a cross-sectional view 2900 corresponding to some embodiments of act 4204.

At act 4206, an imaging interconnect structure is formed on the front side of the imaging substrate. FIG. 29 illustrates a cross-sectional view 2900 corresponding to some embodiments of act 4206.

At act 4208, an imaging bond structure is formed on the imaging interconnect structure, thereby defining an imaging chip. FIG. 30 illustrates a cross-sectional view 3000 corresponding to some embodiments of act 4208.

At act 4210, a plurality of pixel devices and a pixel device interconnect structure are formed on a front side of a pixel device substrate. FIGS. 31 and 32 illustrate cross-sectional views 3100 and 3200 corresponding to some embodiments of act 4210.

At act 4212, a first pixel device bond structure is formed on the pixel device interconnect structure, thereby defining a pixel device chip. FIG. 33 illustrates cross-sectional view 3300 corresponding to some embodiments of act 4212.

At act 4214, a first bonding process is performed to bond the pixel device chip to the imaging chip such that the imaging bond structure meets the first pixel device bond structure at a first bonding interface. FIG. 34 illustrates cross-sectional view 3400 corresponding to some embodiments of act 4214.

At act 4216, a TSV is formed extending through the pixel device substrate to the pixel device interconnect structure. FIG. 35 illustrates cross-sectional view 3500 corresponding to some embodiments of act 4216.

At act 4218, a second pixel device bond structure is formed on a back side of the pixel device substrate. FIG. 36 illustrates cross-sectional view 3600 corresponding to some embodiments of act 4218.

At act 4220, a plurality of logic devices and a logic interconnect structure is formed on a front side of a logic substrate. FIG. 37 illustrates cross-sectional view 3700 corresponding to some embodiments of act 4220.

At act 4222, a logic bond structure is formed on the logic interconnect structure, thereby defining a logic chip. FIG. 38 illustrates cross-sectional view 3800 corresponding to some embodiments of act 4222.

At act 4224, a second bonding process is performed to bond the logic chip to the pixel device chip such that the logic bond structure meets the second pixel device bond structure at a second bonding interface. FIG. 39 illustrates cross-sectional view 3900 corresponding to some embodiments of act 4224.

At act 4226, a back-side isolation structure is formed extending into a back side of the imaging substrate. FIG. 40 illustrates cross-sectional view 4000 corresponding to some embodiments of act 4226.

At act 4228, a grid structure, a plurality of light filters, and a plurality of micro-lenses are formed on the back side of the imaging substrate. FIG. 41 illustrates cross-sectional view 4100 corresponding to some embodiments of act 4228.

Accordingly, in some embodiments, the present disclosure relates to an image sensor comprising an imaging chip having an imaging bond structure overlying a logic chip having a logic bond structure. At least one of the imaging bond structure and the logic bond structure comprises a single conductive bonding layer.

In some embodiments, the present application provides an image sensor including: a first chip comprising a first substrate, a plurality of photodetectors disposed in the first substrate, a first interconnect structure disposed on a front side of the first substrate, and a first bond structure disposed on the first interconnect structure; a second chip underlying the first chip, wherein the second chip comprises a second substrate, a plurality of semiconductor devices disposed on the second substrate, a second interconnect structure disposed on a front side of the second substrate, and a second bond structure disposed on the second interconnect structure; and wherein a first bonding interface is disposed between the second bond structure and the first bond structure, wherein the second interconnect structure is electrically coupled to the first interconnect structure by way of the first and second bond structures, wherein at least one of the first bond structure and the second bond structure comprises one or less conductive bonding layer. In an embodiment, the first bond structure comprises a single conductive bond layer and the second bond structure comprises a plurality of second bond pads overlying a plurality of second bond contacts. In an embodiment, the single conductive bond layer comprises a plurality of first bond pads or a plurality of first bond contacts. In an embodiment, the first bond structure directly contacts a topmost layer of conductive wires in the first interconnect structure and the second bond structure directly contacts a topmost layer of conductive wires in the second interconnect structure. In an embodiment, a plurality of transfer transistors and a plurality of pixel devices are disposed on the front side of the first substrate, wherein the plurality of pixel devices comprise a reset transistor, a source-follower transistor, and a select transistor. In an embodiment, the image sensor further includes: a third chip disposed between the first chip and the second chip, wherein the third chip comprises a third substrate, a plurality of pixel devices disposed on a front side of the third substrate, a third interconnect structure on the front side of the third substrate, a third bond structure disposed on the third interconnect structure, and a fourth bond structure disposed on a back side of the third substrate; and wherein the third bond structure meets the first bond structure at the first bonding interface and the fourth bond structure meets the second bond structure at a second bonding interface. In an embodiment, the image sensor further includes: a plurality of through substrate vias (TSVs) disposed in the third substrate, wherein the TSVs electrically couple the fourth bond structure to the third interconnect structure. In an embodiment, at least one of the third bond structure and the fourth bond structure comprise one or less conductive bonding layer. In an embodiment, the fourth bond structure comprises a single conductive bond layer.

In some embodiments, the present application provides an image sensor including: a first chip comprising a first interconnect structure disposed on a first substrate, a plurality of photodetectors disposed in the first substrate, and a first bond structure on the first interconnect structure; a second chip bonded to the first chip, wherein the second chip comprises a second interconnect structure disposed on a front side of a second substrate, a plurality of pixel devices disposed on the front side of the second substrate, a second bond structure disposed on the second interconnect structure, and a third bond structure disposed on a back side of the second substrate; a third chip bonded to the second chip, wherein the third chip comprises a third interconnect structure disposed on a third substrate, a plurality of semiconductor devices on the third substrate, and a fourth bond structure disposed on the third interconnect structure; and wherein at least one of the second bond structure, the third bond structure, and the fourth bond structure comprises a single conductive bonding layer. In an embodiment, the first bond structure comprises a plurality of first bond pads in physical contact with the second bond structure. In an embodiment, the second bond structure comprises a plurality of second bond pads disposed on a plurality of second bond contacts, wherein the first bond pads directly contact the second bond pads. In an embodiment, the second bond structure comprises the single conductive bonding layer in direct contact with the first bond pads. In an embodiment, the first interconnect structure comprises a topmost layer of conductive wires in direct contact with first conductive bond features of the second bond structure. In an embodiment the image sensor further includes: a plurality of through substrate vias (TSVs) disposed in the second substrate and continuously extending from the third bond structure to the second interconnect structure; and a plurality of upper bond pads disposed in the first substrate, wherein the upper bond pads are electrically coupled to the first interconnect structure and are laterally aligned with the TSVs. In an embodiment, the third bond structure comprises a plurality of bond pads directly electrically coupled to the TSVs.

In various embodiments, the present application provides a method for forming an image sensor, the method includes: forming a plurality of photodetectors within a first substrate; forming a first interconnect structure on the first substrate; forming a first bond structure on the first interconnect structure; forming a plurality of semiconductor devices on a second substrate; forming a second interconnect structure on the second substrate; forming a second bond structure on the second interconnect structure, wherein at least one of the first bond structure and the second bond structure comprises a single conductive bonding layer; and performing a first bonding process to bond the first substrate to the second substrate such that a bonding interface is disposed between the first bond structure and the second bond structure. In an embodiment, the method further includes: forming a third chip comprising a third interconnect structure on a third substrate and a third bond structure on the third interconnect structure; and bonding the third chip to the first substrate before performing the first bonding process, wherein the third bond structure directly contacts the first bond structure. In an embodiment, the method further includes: performing a first thinning process on a back side of the third substrate; forming a through substrate via (TSV) in the third substrate; forming a fourth bond structure on the back side of the third substrate; and wherein the first bonding process is performed after the fourth bond structure is formed, wherein the second bond structure directly contacts the fourth bond structure. In an embodiment, the method further includes: performing a second thinning process on a back side of the first substrate after the first bonding process; forming a back-side isolation structure in the first substrate, wherein the back-side isolation structure is disposed between adjacent photodetectors; forming a plurality of light filters over the back side of the first substrate; and forming a plurality of micro-lenses on the plurality of light filters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
  forming a plurality of photodetectors within a first substrate;
  forming a first interconnect structure on the first substrate;
  forming a first bond structure on the first interconnect structure;
  forming a plurality of semiconductor devices on a second substrate;
  forming a second interconnect structure on the second substrate;
  forming a second bond structure on the second interconnect structure, wherein at least one of the first bond structure and the second bond structure comprises a single conductive bonding layer;
  forming an integrated circuit (IC) chip comprising a third interconnect structure on a third substrate and a third bond structure on the third interconnect structure;
  performing a first bonding process to bond the IC chip to the first substrate, wherein the third bond structure directly contacts the first bond structure; and
  performing a second bonding process to bond the first substrate to the second substrate such that a bonding interface is disposed between the first bond structure and the second bond structure, wherein the first bonding process is performed before the second bonding process.

2. The method of claim 1, further comprising:
  performing a first thinning process on a back side of the third substrate;
  forming a through substrate via (TSV) in the third substrate;
  forming a fourth bond structure on the back side of the third substrate; and
  wherein the second bonding process is performed after the fourth bond structure is formed, wherein the second bond structure directly contacts the fourth bond structure.

3. The method of claim 1, further comprising:
  performing a second thinning process on a back side of the first substrate after the second bonding process;
  forming a back-side isolation structure in the first substrate, wherein the back-side isolation structure is disposed between adjacent photodetectors;
  forming a plurality of light filters over the back side of the first substrate; and
  forming a plurality of micro-lenses on the plurality of light filters.

4. The method of claim 1, wherein forming the first bond structure comprises:
  depositing a first bond dielectric on the first interconnect structure;
  etching the first bond dielectric to form a plurality of first openings in the first bond dielectric; and
  forming a plurality of first bond contacts and a plurality of first bond pads in the plurality of first openings.

5. The method of claim 4, wherein forming the second bond structure comprises:
  depositing a second bond dielectric on the second interconnect structure;
  etching the second bond dielectric to form a plurality of second openings in the second bond dielectric; and
  forming a plurality of second bond pads in the plurality of second openings, wherein the single conductive bonding layer comprises the plurality of second bond pads, wherein a first height of the first bond structure is greater than a second height of the second bond structure.

6. The method of claim 4, further comprising:
  forming a floating diffusion node in the first substrate and adjacent to one or more of the plurality of photodetectors;
  forming a plurality of transfer gate structures on the first substrate and adjacent to a corresponding photodetector in the plurality of photodetectors; and
  forming a plurality of pixel transistors on the third substrate, wherein the floating diffusion node is electrically coupled to a gate electrode of a first transistor in the plurality of pixel transistors by way of one or more conductive structures in one or both of the first bond structure and the second bond structure.

7. The method of claim 1, wherein the single conductive bonding layer comprises a plurality of bond pads or a plurality of bond contacts.

8. A method for forming an image sensor, the method comprising:
  forming a first integrated circuit (IC) chip, comprising:
    performing a doping process to form a photodetector in a first substrate;
    forming a first interconnect structure on the first substrate;
    forming a first bond structure on the first interconnect structure, wherein the first bond structure comprises one or more first conductive bonding levels;
  forming a second IC chip, comprising:
    forming a plurality of first transistors on a second substrate;
    forming a second interconnect structure on a first surface of the second substrate;
    forming a second bond structure on the second interconnect structure, wherein the second bond structure comprises a bond dielectric structure and a single conductive bonding level in the bond dielectric structure, wherein a top surface of the single conductive bonding level is aligned with a top surface of the bond dielectric structure and a bottom surface of the single conductive bonding level is aligned with a bottom surface of the bond dielectric structure; and
    performing a first bonding process to bond the first IC chip and to the second IC chip such that the first and second IC chips are electrically coupled together, wherein a first bonding interface is between the first and second bond structures, wherein the first bonding interface comprises conductor-to-conductor bonds and dielectric-to-dielectric bonds.

9. The method of claim 8, wherein the one or more first conductive bonding levels comprise a plurality of first bond pads and a plurality of first bond contacts between the first bond pads and the first interconnect structure, wherein the single conductive bonding level contacts the plurality of first bond pads.

10. The method of claim 9, wherein the single conductive bonding level comprises a plurality of second bond contacts, wherein widths of the second bond contacts are less than widths of the first bond pads.

11. The method of claim 8, further comprising:

performing a thinning process on a second surface of the second substrate;

forming a plurality of through substrate vias (TSVs) in the second substrate; and forming a third bond structure on the second surface of the second substrate, wherein the third bond structure comprises one or more second conductive bonding levels.

12. The method of claim 11, wherein a first subset of the one or more second conductive bonding levels contacts and is electrically coupled to the plurality of TSVs, and wherein a second subset of the one or more second conductive bonding levels contacts the second surface of the second substrate.

13. The method of claim 11, further comprising:

forming a third IC chip comprising:

forming a plurality of second transistors on a third substrate;

forming a third interconnect structure on the third substrate;

forming a fourth bond structure on the third interconnect structure; and performing a second bonding process to bond the third IC chip to the second IC chip such that the second and third IC chips are electrically coupled together, wherein a second bonding interface is between the third bond structure and the fourth bond structure.

14. The method of claim 13, wherein a number of conductive bonding levels in the one or more second conductive bonding levels is greater than a number of conductive bonding levels in the fourth bond structure.

15. The method of claim 13, wherein the fourth bond structure comprises a plurality of conductive bonding structures directly contacting a topmost layer of conductive wires in the third interconnect structure and a bottom conductive bonding level in the one or more second conductive bonding levels.

16. The method of claim 8, wherein the one or more first conductive bonding levels comprise a plurality of first bond pads directly contacting the single conductive bonding level, wherein the single conductive bonding level directly contacts a topmost layer of conductive wires in the second interconnect structure.

17. A method for forming an image sensor, the method comprising:

forming a first integrated circuit (IC) chip, comprising:

forming a plurality of photodetectors in a first substrate;

forming a first interconnect structure on a first surface of the first substrate;

forming a first bond structure on the first interconnect structure;

forming a second IC chip, comprising:

forming a plurality of first transistors on a first surface of a second substrate;

forming a second interconnect structure on the first surface of the second substrate;

forming a second bond structure on the second interconnect structure;

bonding the first IC chip and the second IC chip together such that a first bonding interface is disposed between the first bond structure and the second bond structure;

forming a plurality of through-substrate vias (TSVs) into a second surface of the second substrate, wherein the plurality of TSVs are electrically coupled to the second interconnect structure;

forming a third bond structure on the second surface of the second substrate;

forming a third IC chip, comprising:

forming a plurality of second transistors on a third substrate;

forming a third interconnect structure on the third substrate;

forming a fourth bond structure on the third interconnect structure; and bonding the second IC chip and the third IC chip together such that a second bonding interface is disposed between the third bond structure and the fourth bond structure;

wherein at least one of the first bond structure, the second bond structure, the third bond structure, and the fourth bond structure comprises a single conductive bonding level, wherein the single conductive bonding level comprises a plurality of first bond pads or a plurality of first bond contacts.

18. The method of claim 17, wherein the forming of the first IC chip further comprises forming a floating diffusion node in the first substrate and adjacent to one or more of the plurality of photodetectors, wherein the plurality of first transistors comprises a source-follower transistor electrically coupled to the floating diffusion node by way of the first and second bond structures.

19. The method of claim 17, wherein the first and second bond structures are spaced vertically between a first topmost level of conductive wires in the first interconnect structure and a second topmost level of conductive wires in the second interconnect structure.

20. The method of claim 17, wherein the third bond structure comprises a plurality of second bond pads directly contacting a plurality of second bond contacts of the fourth bond structure, wherein the plurality of second bond contacts directly contact a topmost level of conductive wires in the third interconnect structure.

* * * * *